(12) United States Patent
Ando et al.

(10) Patent No.: US 7,794,914 B2
(45) Date of Patent: Sep. 14, 2010

(54) CHEMICALLY AMPLIFIED POSITIVE RESIST COMPOSITION

(75) Inventors: Nobuo Ando, Toyonaka (JP); Yusuke Fuji, Ibaraki (JP); Ichiki Takemoto, Kawanishi (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 58 days.

(21) Appl. No.: 11/705,138

(22) Filed: Feb. 12, 2007

(65) Prior Publication Data

US 2007/0218401 A1 Sep. 20, 2007

(30) Foreign Application Priority Data

Feb. 15, 2006 (JP) .............................. 2006-037624

(51) Int. Cl.
*G03F 7/039* (2006.01)
(52) U.S. Cl. ..................... 430/270.1; 430/326; 430/907; 430/910; 430/921; 430/925
(58) Field of Classification Search ....................... None
See application file for complete search history.

(56) References Cited

U.S. PATENT DOCUMENTS

| 6,593,058 | B1 | 7/2003 | Feiring et al. | |
|---|---|---|---|---|
| 6,790,587 | B1 | 9/2004 | Feiring et al. | |
| 2005/0100815 | A1* | 5/2005 | Watanabe et al. | 430/270.1 |
| 2005/0100819 | A1* | 5/2005 | Fuji et al. | 430/270.1 |
| 2005/0175935 | A1* | 8/2005 | Harada et al. | 430/270.1 |
| 2006/0008736 | A1* | 1/2006 | Kanda et al. | 430/270.1 |
| 2006/0246373 | A1* | 11/2006 | Wang | 430/270.1 |
| 2006/0292490 | A1* | 12/2006 | Kodama et al. | 430/270.1 |
| 2007/0099113 | A1* | 5/2007 | Kobayashi et al. | 430/270.1 |
| 2007/0148595 | A1* | 6/2007 | Kanda | 430/270.1 |
| 2007/0149702 | A1* | 6/2007 | Ando et al. | 524/556 |
| 2007/0178405 | A1* | 8/2007 | Kanda et al. | 430/270.1 |

FOREIGN PATENT DOCUMENTS

| EP | 1 517 179 A1 * | 3/2005 |
|---|---|---|
| JP | 2005-266767 A | 9/2005 |
| JP | 2005-284238 A | 10/2005 |

OTHER PUBLICATIONS

C. V. Peski, et al., "Film pulling and meniscus instability as a cause of residual fluid droplets", Presentation at the 2nd International Symposium on Immersion Lithography, Sep. 2005.
D. Gil et al., "The Role of Evaporation in Defect Formation in Immersion Lithography", Presentation at the 2nd International Symposium on Immersion Lithography, Sep. 2005.

\* cited by examiner

*Primary Examiner*—Sin J. Lee
(74) *Attorney, Agent, or Firm*—Birch, Stewart, Kolasch & Birch, LLP.

(57) ABSTRACT

The present invention provides a chemically amplified resist composition comprising:
  a resin (A) which contains no fluorine atom and a structural unit (a1) having an acid-labile group,
  a resin (B) which contains a structural unit (b2) having a fluorine-containing group and at least one structural unit selected from a structural unit (b1) having an acid-labile group, a structural unit (b3) having a hydroxyl group and a structural unit (b4) having a lactone structure, and
  an acid generator.

4 Claims, No Drawings

CHEMICALLY AMPLIFIED POSITIVE RESIST COMPOSITION

This nonprovisional application claims priority under 35 U.S.C. §119(a) on Patent Application No. 2006-037624 filed in JAPAN on Feb. 15, 2006, the entire contents of which are hereby incorporated by reference.

FIELD OF THE INVENTION

The present invention relates to a chemically amplified positive resist composition.

BACKGROUND OF THE INVENTION

A chemically amplified positive resist composition is used for semiconductor microfabrication.

In semiconductor microfabrication, especially, in liquid immersion lithography process, it is desirable to suppress the formation of defect.

It has been known that one of big problems in liquid immersion lithography process is defect caused by residual fluid droplets on the resist film (e.g. C. V. Peski et al., "Film pulling and meniscus instability as a cause of residual fluid droplets", Presentation at the 2nd International Symposium on Immersion Lithography, September, 2005, and D. Gil et al., "The Role of Evaporation in Defect Formation in Immersion Lithography", Presentation at the 2nd International Symposium on Immersion Lithography, September, 2005). The said defect is the specific one in liquid immersion lithography and the defect is formed by conducting post-exposure baking of the resist film on which fluid droplets was remained.

It has been known that number of the defect caused by residual fluid droplets on the resist film is associated with the receding contact angle of the resist film and it is possible to suppress the formation of the defect caused by residual fluid droplets on the resist film by using the resist composition forming the resist film having higher receding contact angle.

JP 2005-266767 A discloses a positive resist composition for immersion exposure containing an acid generator and a resin comprising a structural unit represented by the formula:

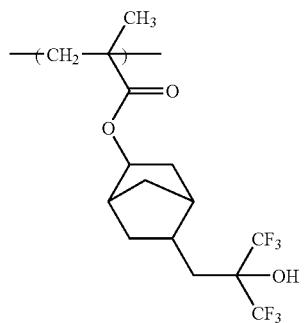

and a structural unit derived from a methacrylate monomer having no fluorine atom, and the resist film derived from the resist composition has 50 to 700° of the contact angle. However, the resist film having higher receding contact angle is not disclosed in JP 2005-266767A and it is desirable to develop a resist composition forming the resist film having higher receding contact angle.

SUMMARY OF THE INVENTION

An object of the present invention is to provide a novel chemically amplified positive resist composition suitable for liquid immersion lithography process, showing excellent various resist abilities, and giving good pattern profile and forming the resist film having higher receding contact angle.

These and other objects of the present invention will be apparent from the following description.

The present invention relates to the followings:

<1> A chemically amplified positive resist composition comprising:
a resin (A) which contains no fluorine atom and a structural unit (a1) having an acid-labile group,
a resin (B) which contains a structural unit (b2) having a fluorine-containing group and at least one structural unit selected from a structural unit (b1) having an acid-labile group, a structural unit (b3) having a hydroxyl group and a structural unit (b4) having a lactone structure, and
an acid generator.

<2> The chemically amplified positive resist composition according to <1>, wherein the resin (A) contains at least one structural unit selected from a structural unit (a3) having a hydroxyl group and a structural unit (a4) having a lactone structure in addition to the structural unit (a1).

<3> The chemically amplified positive resist composition according to <1> or <2>, wherein the resin (A) contains the structural unit (a3) and the structural unit (a4) in addition to the structural unit (a1).

<4> The chemically amplified positive resist composition according to any one of <1> to <3>, wherein the resin (B) contains the structural unit (b1) and the structural unit (b2).

<5> The chemically amplified positive resist composition according to any one of <1> to <4>, wherein the resin (B) contains at least one structural unit selected from the structural unit (b3) and the structural unit (b4) in addition to the structural unit (b1) and the structural unit (b2).

<6> The chemically amplified positive resist composition according to any one of <1> to <5>, wherein the resin (B) contains the structural unit (b3) and the structural unit (b4) in addition to the structural unit (b1) and the structural unit (b2).

<7> The chemically amplified positive resist composition according to any one of <1> to <6>, wherein the resin (B) contains 5 to 70% by mole of the structural unit (b2) based on total of structural units in the resin (B).

<8> The chemically amplified positive resist composition according to <1> or <2>, wherein the resin (B) contains 10% or more by mole of the structural unit (b2) based on total of structural units in the resin (B).

<9> The chemically amplified positive resist composition according to any one of <1> to <8>, wherein the structural unit (a1) and (b1) are the same or different and each independently represents a structural unit represented by the formula (Ia):

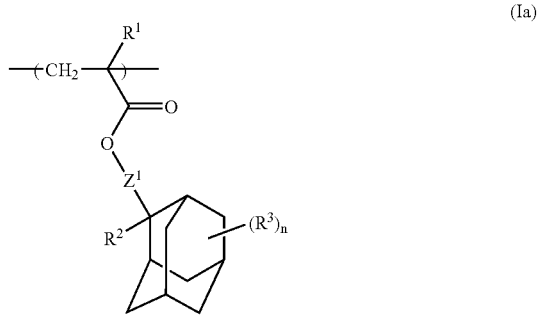

wherein $R^1$ represents a hydrogen atom or a methyl group, $R^2$ represents a C1-C8 alkyl group, $R^3$ represents a methyl group, n represents an integer of 0 to 14, $Z^1$ represents a single bond or a —$(CH_2)_k$—COO— group, and k represents an integer of 1 to 4, or a structural unit represented by the formula (Ib):

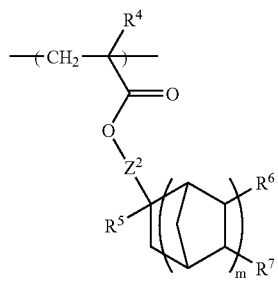

(Ib)

wherein $R^4$ represents a hydrogen atom or a methyl group, $R^5$ represents a C1-C8 alkyl group, $R^6$ and $R^7$ are the same or different and each independently represents a hydrogen atom or a monovalent C1-C8 hydrocarbon group which may contain at least one heteroatom, $R^6$ and $R^7$ may be bonded each other to form a ring together with the carbon atom to which $R^6$ is bonded and the carbon atom to which $R^7$ is bonded, or $R^6$ and $R^7$ may be bonded each other to form a double bond between the carbon atom to which $R^6$ is bonded and the carbon atom to which $R^7$ is bonded, m represents an integer of 1 to 3, $Z^2$ represents a single bond or a —$(CH_2)_{k'}$—COO— group, and k' represents an integer of 1 to 4.

<10> The chemically amplified positive resist composition according to any one of <1> to <9>, wherein the structural unit (b3) represents a structural unit represented by the formula (IIb):

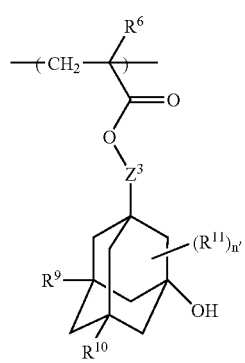

(IIb)

wherein $R^8$ represents a hydrogen atom or a methyl group, $R^9$ and $R^{10}$ are the same or different and each independently represents a hydrogen atom, a methyl group or a hydroxyl group, $R^{11}$ represents a methyl group, n' represents an integer of 0 to 12, $Z^3$ represents a single bond or a —$(CH_2)_q$—COO— group, and q represents an integer of 1 to 4.

<11> The chemically amplified positive resist composition according to any one of <2> to <10>, wherein the structural unit (a3) represents a structural unit represented by the formula (IIa):

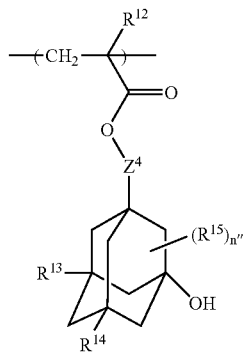

(IIa)

wherein $R^{12}$ represents a hydrogen atom or a methyl group, $R^{13}$ and $R^{14}$ are the same or different and each independently represents a hydrogen atom, a methyl group or a hydroxyl group, $R^{15}$ represents a methyl group, n" represents an integer of 0 to 12, $Z^4$ represents a single bond or a —$(CH_2)_{q'}$—COO— group, and q' represents an integer of 1 to 4.

<12> The chemically amplified positive resist composition according to any one of <1> to <11>, wherein the structural unit (b4) represents a structural unit represented by the formula (IIIa), (IIIb), (IIIc), (IIId), (IIIe) or (IIIf):

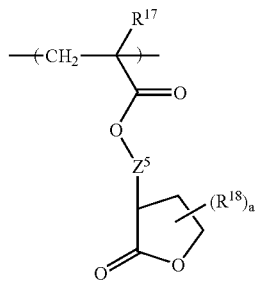

(IIIa)

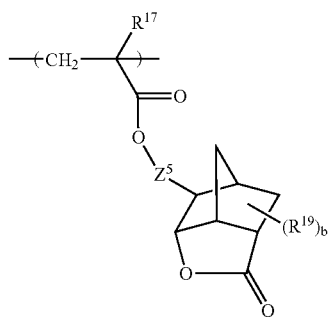

(IIIb)

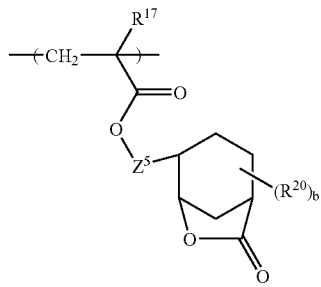

(IIIc)

-continued

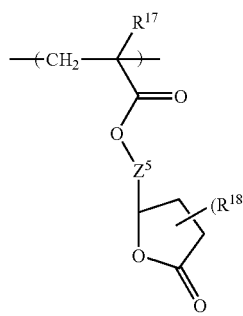
(IIId)

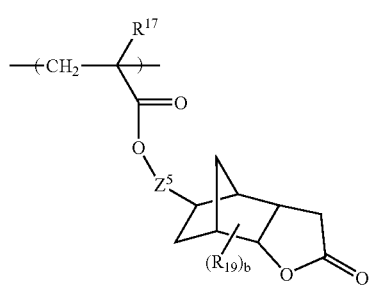
(IIIe)

(IIIf)

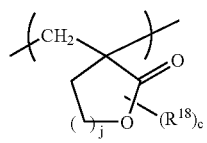

wherein $R^{17}$ represents a hydrogen atom or a methyl group, $R^{18}$ represents a methyl group, $R^{19}$ represents a carboxyl, cyano or C1-C4 hydrocarbon group, $R^{20}$ represents a carboxyl, cyano or C1-C4 hydrocarbon group, j represents an integer of 0 to 3, a represents an integer of 0 to 5, b represents an integer of 0 to 3, and when b represents 2 or 3, $R^{19}$s or $R^{20}$s may be same or different, c represents an integer of 0 to (2j+2), $Z^5$ represents a single bond or a —$(CH_2)_{q''}$—COO— group, and q" represents an integer of 1 to 4.

<13> The chemically amplified positive resist composition according to any one of <2> to <12>, wherein the structural unit (a4) represents a structural unit represented by the formula (IIIg), (IIIh), (IIIi), (IIIj), (IIIk) or (IIIl):

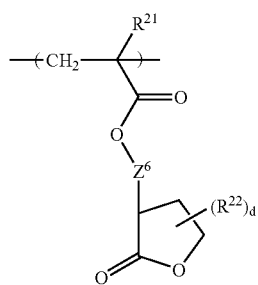
(IIIg)

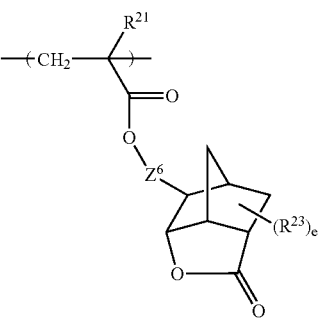
(IIIh)

(IIIi)

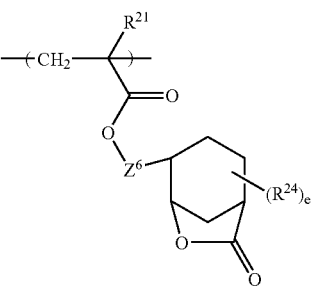
(IIIj)

(IIIk)

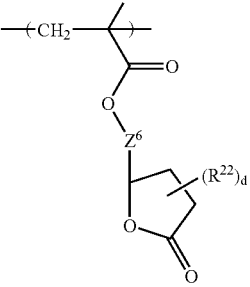
(IIIl)

wherein $R^{21}$ represents a hydrogen atom or a methyl group, $R^{22}$ represents a methyl group, $R^{23}$ represents a carboxyl, cyano or C1-C4 hydrocarbon group, $R^{24}$ represents a carboxyl, cyano or C1-C4 hydrocarbon group, i represents an integer of 0 to 3, d represents an integer of 0 to 5, e represents an integer of 0 to 3, and when e represents 2 or 3, $R^{23}$s or $R^{24}$s may be same or different, f represents an integer of 0 to (2i+2), $Z^6$ represents a single bond or a —$(CH_2)_{q'''}$—COO— group, and q''' represents an integer of 1 to 4.

<14> The chemically amplified positive resist composition according to any one of <1> to <13>, wherein the structural unit (b2) represents a structural unit represented by the formula (IV):

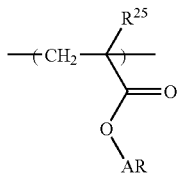

(IV)

wherein $R^{25}$ represents a hydrogen atom or a methyl group, and AR represents a C1-C30 fluorine-containing alkyl group which may contain 1 to 5 hydroxyl groups and at least one heteroatom selected from a oxygen, nitrogen and sulfur atom.

<15> The chemically amplified positive resist composition according to any one of <1> to <14>, wherein the weight ratio of the resin (A) and the resin (B) is 98/2 to 20/80.

<16> The chemically amplified positive resist composition according to any one of <1> to <15>, wherein the acid generator is a salt represented by the formula (V):

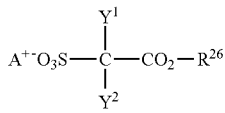

(V)

wherein $R^{26}$ represents a C1-C6 linear or branched chain hydrocarbon group or a C3-C30 monocyclic or bicyclic hydrocarbon group, and at least one hydrogen atom in the monocyclic or bicyclic hydrocarbon group may be replaced with a C1-C6 alkoxy, C1-C4 perfluoroalkyl, C1-C6 hydroxyalkyl, hydroxyl, cyano, carbonyl or ester group, or at least one —$CH_2$— in the monocyclic or bicyclic hydrocarbon group may be replaced with —CO— or —O—; $A^+$ represents an organic counter ion; $Y^1$ and $Y^2$ are the same or different and each independently represents a fluorine atom or a C1-C6 perfluoroalkyl group.

<17> The chemically amplified positive resist composition according to <16>, wherein the salt represented by the formula (V) is a salt represented by the formula (VI):

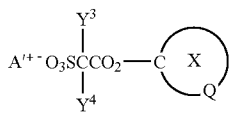

(VI)

wherein Q represents —CO— group or —C(OH)— group; ring X represents a C3-C30 monocyclic or polycyclic hydrocarbon group in which a hydrogen atom is replaced with a hydroxyl group at Q position when Q is —C(OH)— group or in which two hydrogen atoms are replaced with =O group at Q position when Q is —CO— group, and at least one hydrogen atom in the monocyclic or polycyclic hydrocarbon group may be replaced with a C1-C6 alkyl, a C1-C6 alkoxy, a C1-C4 perfluoroalkyl, a C1-C6 hydroxyalkyl, a hydroxyl or a cyano group; $Y^3$ and $Y^4$ each independently represent a fluorine atom or a C1-C6 perfluoroalkyl group, and $A'^+$ represents an organic counter ion.

<18> The chemically amplified positive resist composition according to any one of <1> to <15>, wherein the acid generator is a salt represented by the formula (VII):

(VII)

wherein $R^{27}$ represents a C1-C6 linear or branched chain perfluoroalkyl group and $A''^+$ represents an organic counter ion.

<19> The chemically amplified positive resist composition according to any one of <16> to <18>, the organic counter ion is a cation represented by the formula (IXz):

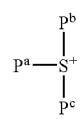

(IXz)

wherein $P^a$, $P^b$ and $P^c$ each independently represent a C1-C30 alkyl group which may be substituted with at least one selected from a hydroxyl group and a C1-C12 alkoxy group, or a C3-C30 cyclic hydrocarbon group which may be substituted with at least one selected from a hydroxyl group and a C1-C12 alkoxy group, a cation represented by the formula (IXb):

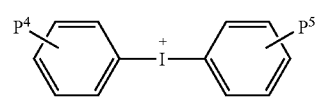

(IXb)

wherein $P^4$ and $P^5$ each independently represents a hydrogen atom, a hydroxyl group, a C1-C12 alkyl group or a C1-C12 alkoxy group, a cation represented by the formula (IXc):

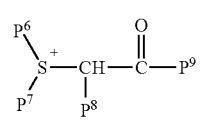

(IXc)

wherein $P^6$ and $P^7$ each independently represents a C1-C12 alkyl group or a C3-C12 cycloalkyl group, or $P^6$ and $P^7$ bond to form a C3-C12 divalent hydrocarbon group which forms a ring together with the adjacent $S^+$, and at least one —$CH_2$— in the divalent hydrocarbon group may be replaced with —CO—, —O— or —S—, $P^8$ represents a hydrogen atom, $P^9$ represents a C1-C12 alkyl group, a C3-C12 cycloalkyl group or an aromatic group optionally substituted, or $P^8$ and $P^9$ bond to form a divalent hydrocarbon group which forms a 2-oxocycloalkyl group together with the adjacent —CHCO—, and at least one —$CH_2$— in the divalent hydrocarbon group may be replaced with —CO—, —O— or —S—, or a cation represented by the formula (IXd):

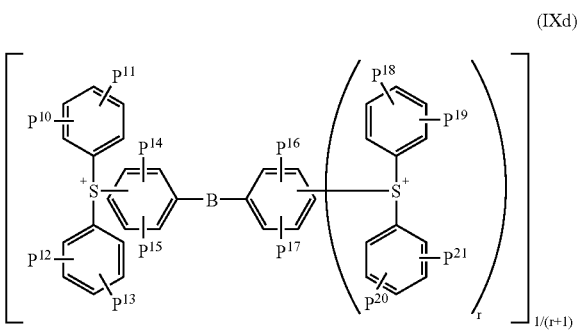

(IXd)

wherein $P^{10}$ $P^{11}$ $P^{12}$ $P^{13}$ $P^{14}$ $P^{15}$ $P^{16}$ $P^{17}$ $P^{18}$ $P^{19}$ $P^{20}$ and $P^{21}$ each independently represent a hydrogen atom, a hydroxyl group, a C1-C12 alkyl group or a C1-C12 alkoxy group, B represents a sulfur or oxygen atom and r represents 0 or 1.

<20> The chemically amplified positive resist composition according to <19>, the cation represented by the formula (IXz) is a cation represented by the formula (IXa):

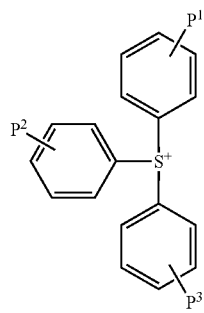

(IXa)

wherein $P^1$, $P^2$ and $P^3$ each independently represents a hydrogen atom, a hydroxyl group, a C1-C12 alkyl group or a C1-C12 alkoxy group.

<21> The chemically amplified positive resist composition according to any one of <16> to <18>, wherein the organic counter ion is a cation of the formula (IXe):

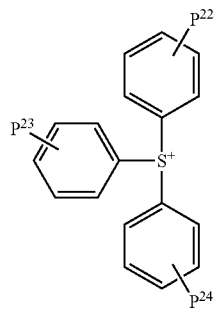

(IXe)

wherein $P^{22}$, $P^{23}$ and $P^{24}$ each independently represents a hydrogen atom or a C1-C4 alkyl group.

<21> The chemically amplified positive resist composition according to <17>, wherein the ring X is a C4-C8 cycloalkyl group, adamantyl group or norbornyl group, provided that, in each of the group, a hydrogen atom is replaced with —OH group at Q position when Q is —C(OH)— group and two hydrogen atoms are substituted with =O at Q position when Q is —CO— group, and provided that at least one hydrogen atom in each of the group may be replaced with a C1-C6 alkyl, C1-C6 alkoxy group, C1-C4 perfluoroalkyl, C1-C6 hydroxyalkyl, hydroxyl or cyano group.

<23> The chemically amplified positive resist composition according to <17>, wherein the salt represented by the formula (VI) is a salt represented by the formula (Xa), (Xb) or (Xc):

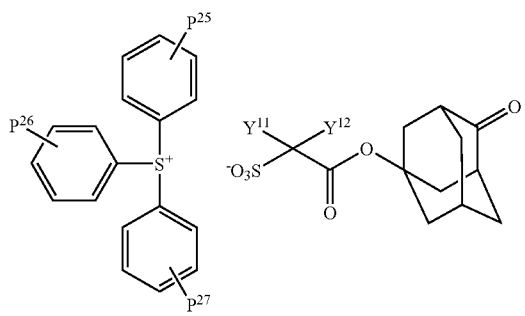

(Xa)

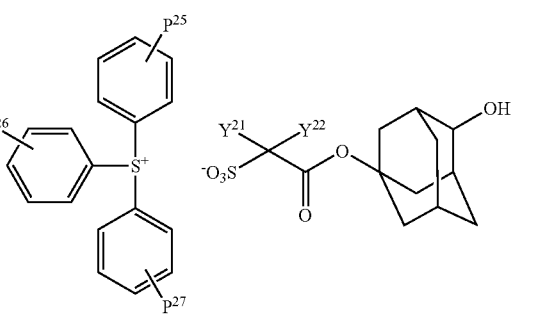

(Xb)

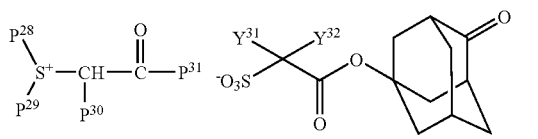

(Xc)

wherein $P^{25}$, $P^{26}$ and $P^{27}$ each independently represents a hydrogen atom or a C1-C4 alkyl group, $P^{28}$ and $P^{29}$ each independently represents a C1-C12 alkyl or C3-C12 cycloalkyl group, or $P^{28}$ and $P^{29}$ bond to form a C3-C12 divalent hydrocarbon group which forms a ring together with the adjacent $S^+$, and at least one —$CH_2$— in the C3-C12 divalent hydrocarbon group may be replaced with -CO—, —O— or —S—, $P^{30}$ represents a hydrogen atom, $P^{31}$ represents a C1-C12 alkyl group, a C3-C12 cycloalkyl group or an aromatic group optionally substituted, or $P^{30}$ and $P^{31}$ bond to form a C3-C12 divalent hydrocarbon group which forms a 2-oxocycloalkyl group together with the adjacent —CHCO—, and at least one —$CH_2$— in the C3-C12 divalent hydrocarbon group may be replaced with —CO—, —O— or —S—, and $Y^{11}$, $Y^{12}$, $Y^{21}$, $Y^{22}$, $Y^{31}$ and $Y^{32}$ each independently represents a fluorine atom or a C1-C6 perfluoroalkyl group.

<24> The chemically amplified positive resist composition according to any one of <1> to <23>, wherein Log P value of the resin (B), which is calculated by the following equation:

Log $P$ value of the resin=$\Sigma$(each calculated Log $P$ value of the monomer used to give the corresponding structural unit in the resin×each content ratio of the corresponding structural unit in the resin), wherein Log P value of the monomer is calculated by using software for estimating Log P value form structural formulae, is 2.10 or more.

DESCRIPTION OF PREFERRED EMBODIMENTS

The present chemically amplified positive resist composition is a composition comprising:
a resin (A) which contains no fluorine atom and a structural unit (a1) having an acid-labile group,
a resin (B) which contains a structural unit (b2) having a fluorine-containing group and at least one structural unit selected from a structural unit (b1) having an acid-labile group, a structural unit (b3) having a hydroxyl group and a structural unit (b4) having a lactone structure, and
an acid generator.

The resin (A) contains no fluorine atom. The resin (A) contains a structural unit (a1) having an acid-labile group. The resin (A) may consist of the structural unit (a1) and may contain the other structural unit or units in addition to the structural unit (a1). The resin (A) preferably contains the other structural unit or units in addition to the structural unit (a1). As the resin (A), a resin containing at least one structural unit selected from a structural unit (a3) having a hydroxyl group and a structural unit (a4) having a lactone structure in addition to the structural unit (a1) is preferable, and a resin containing the structural unit (a3) and the structural unit (a4) in addition to the structural unit (a1) is more preferable.

The resin (A) may contain two or more kinds of the structural unit (a1).

As the resin (B), a resin containing the structural unit (b1) and the structural unit (b2) is preferable, a resin containing at least one structural unit selected from the structural unit (b3) and the structural unit (b4) in addition to the structural unit (b1) and the structural unit (b2) is more preferable, and a resin containing the structural unit (b3) and the structural unit (b4) in addition to the structural unit (b1) and the structural unit (b2) is much more preferable.

The resin (B) may contain two or more kinds of the structural unit (b2).

In the present chemically amplified positive resist composition, weight ratio of the resin (A) and the resin (B) is usually 98/2 to 20/80, preferably 95/5 to 50/50, more preferably 85/15 to 50/50 and most preferably 75/25 to 60/40.

The content of the structural unit (b2) in the resin (B) is preferably 5 to 70% by mole, more preferably 10 to 60% by mole based on total of structural units in the resin (B).

The acid-labile group in the structural unit (a1) and (b1) cleaves by an acid. The acid-labile group in the structural unit (a1) may be same as that in the structural unit (b1), and the acid-labile group in the structural unit (a1) may be different from that in the structural unit (b1).

In the present specification, "ester group" means "a structure having ester of carboxylic acid". Specifically, "tert-butyl ester group" is "a structure having tert-butyl ester of carboxylic acid", and may be described as "—COOC(CH$_3$)$_3$".

Examples of the acid-labile group include a structure having ester of carboxylic acid such as an alkyl ester group in which a carbon atom adjacent to the oxygen atom is quaternary carbon atom, an alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom".

Examples of the acid-labile group include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethyl ester, 1-isopropoxyethyl ester, 1-ethoxypropoxy ester, 1-(2-methoxyethoxy)ethyl ester, 1-(2-acetoxyethoxy) ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom such as an isobornyl ester, 1-alkylcycloalkyl ester, 2-alkyl-2-adamantyl ester, and 1-(1-adamantyl)-1-alkylalkyl ester group.

The structural units (a1) and (b1) may be the same or different.

As the structural units (a1) and (b1), a structural unit derived from an optionally substituted acrylic compound is preferable.

In the present specification, "an optionally substituted acrylic compound" means an acrylate, an acrylate of which a-carbon is substituted with a substituent. Examples of the substituent include a C1-C4 alkyl group.

Examples of the optionally substituted acrylic compound include an acrylayte, a methacylate, a 2-ethylpropenoate, a 2-n-propylpropenoate, and a 2-n-butylpropenoate.

Examples of the structural unit (a1) and (b1) include a structural unit derived from tert-butyl acrylate, tert-butyl methacrylate, methoxymethyl acrylate, methoxymethyl methacrylate, ethoxymethyl acrylate, ethoxymethyl methacrylate, 1-ethoxyethyl acrylate, 1-ethoxyethyl methacrylate, 1-isobutoxyethyl acrylate, 1-isobutoxyethyl methacrylate, 1-isopropoxyethyl acrylate, 1-isopropoxyethyl methacrylate, 1-ethoxypropoxy acrylate, 1-ethoxypropoxy methacrylate, 1-(2-methoxyethoxy)ethyl acrylate, 1-(2-methoxyethoxy) ethyl methacrylate, 1-(2-acetoxyethoxy)ethyl acrylate, 1-(2-acetoxyethoxy)ethyl methacrylate, 1-[2-(1-adamantyloxy) ethoxy]ethyl acrylate, 1-[2-(1-adamantyloxy) ethoxy]ethyl methacrylate, 1-[2-(1-adamantanecarbonyloxy) ethoxy] ethyl acrylate, 1-[2-(1-adamantanecarbonyloxy) ethoxy] ethyl methacrylate, tetrahydro-2-furyl acrylate, tetrahydro-2-furyl methacrylate, tetrahydro-2-pyranyl acrylate, tetrahydro-2-pyranyl methacrylate, isobornyl acrylate, isobornyl methacrylate, 1-alkylcycloalkyl acrylate, 1-alkylcycloalkyl methacrylate, 2-alkyl-2-adamantyl acrylate, 2-alkyl-2-adamantyl methacrylate, 1-(1-adamantyl)-1-alkylalkyl acrylate and 1-(1-adamantyl)-1-alkylalkyl methacrylate.

Preferable examples of the structural unit (a1) and (b1) include a structural unit represented by the formula (Ia) (hereinafter, simply referred to as the structural unit (Ia)) and a structural unit represented by the formula (Ib) (hereinafter, simply referred to as the structural unit (Ib)).

In the structural unit (Ia), $R^1$ represents a hydrogen atom or a methyl group, $R^2$ represents a C1-C8 alkyl group, $R^3$ represents a methyl group, n represents an integer of 0 to 14, $Z^1$ represents a single bond or a —(CH$_2$)$_k$—COO— group, and k represents an integer of 1 to 4. In the structural unit (Ib), $R^4$ represents a hydrogen atom or a methyl group, $R^5$ represents a C1-C8 alkyl group, $R^6$ and $R^7$ are the same or different and each independently represents a hydrogen atom or a monovalent C1-C8 hydrocarbon group which may contain at least one heteroatom, $R^6$ and $R^7$ may be bonded each other to form a ring together with the carbon atom to which $R^6$ is bonded and the carbon atom to which $R^7$ is bonded, or $R^6$ and $R^7$ may be bonded each other to form a double bond between the carbon atom to which $R^6$ is bonded and the carbon atom to which $R^7$ is bonded, m represents an integer of 1 to 3, $Z^2$ represents a single bond or a —$(CH_2)_{k'}$—COO— group, and k' represents an integer of 1 to 4.

Examples of the C1-C8 alkyl group include a methyl, ethyl, 1-propyl, 1-methylethyl, 1-butyl, 2-butyl, 2-methyl-1-propyl, 1-pentyl, 2-pentyl, 2-methyl-1-butyl, 3-pentyl, 2,2-dimethyl-1-propyl, 3-methyl-1-butyl, 1-hexyl, 2-hexyl, 1-heptyl, 4-heptyl, 1-octyl, 2-octyl, 5-methyl-2-heptyl, cyclopentyl, 2-methylcyclopentyl, cyclohexyl, 3-methylcyclohexyl, 4-methylcyclohexyl, 2,3-dimethylcyclohexyl, 4,4-dimethylcyclohexyl, and 5-methyl-bicycle[2.2.1]hept-2-yl group, and a C1-C3 alkyl group such as a methyl, ethyl, 1-propyl and 1-methylethyl group is preferable.

Examples of the monovalent C1-C8 hydrocarbon group include a methyl, ethyl, 1-propyl, 1-methylethyl, 1-butyl, 2-butyl, 2-methyl-1-propyl, 1-pentyl, 2-pentyl, 2-methyl-1-butyl, 3-pentyl, 2,2-dimethyl-1-propyl, 3-methyl-1-butyl, 1-hexyl, 2-hexyl, 1-heptyl, 4-heptyl, 1-octyl, 2-octyl, 5-methyl-2-heptyl, cyclopentyl, 2-methylcyclopentyl, cyclohexyl, 3-methylcyclohexyl, 4-methylcyclohexyl, 2,3-dimethylcyclohexyl and 4,4-dimethylcyclohexyl group.

Examples of the heteroatom include an oxygen, nitrogen and sulfur atom.

Examples of the ring formed by bonding $R^6$ and $R^7$ each other together with the carbon atom to which $R^6$ is bonded and the carbon atom to which $R^7$ is bonded include a cyclobutane, cyclopentane and cyclohexane ring.

As the structural unit (a1) and (b1), the structural unit (Ia) is preferable.

The structural unit (Ia) is derived from a monomer represented by the following formula:

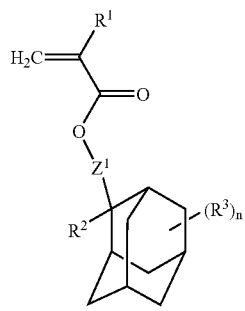

wherein $R^1$, $R^2$, $R^3$, n, and $Z^1$ are the same as defined above, and the structural unit (Ib) is derived from a monomer represented by the following formula:

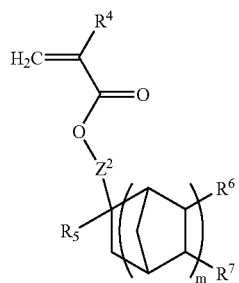

wherein $R^4$, $R^5$, $R^6$, $R^7$, m, and $Z^2$ are the same as defined above.

Examples of the monomer represented by the above-mentioned formulae include the followings:

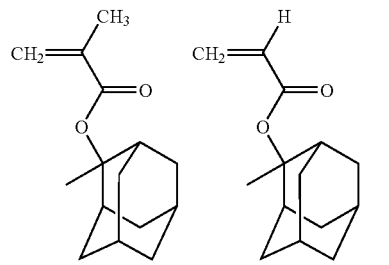

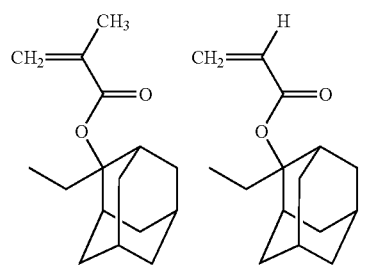

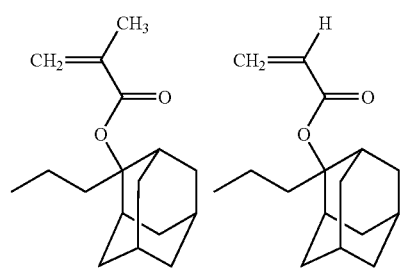

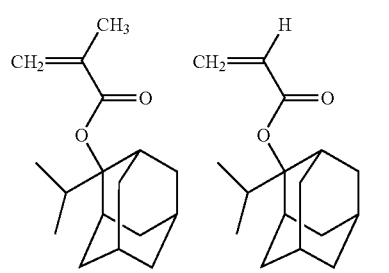

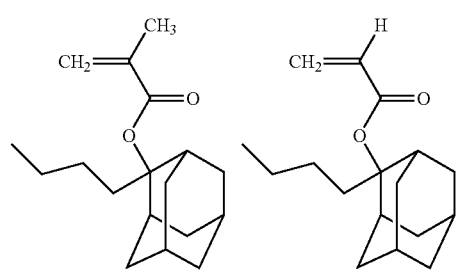

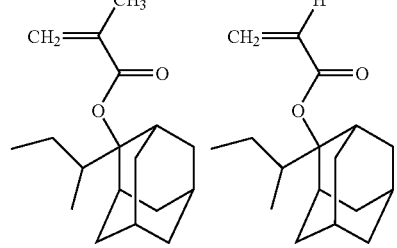

-continued
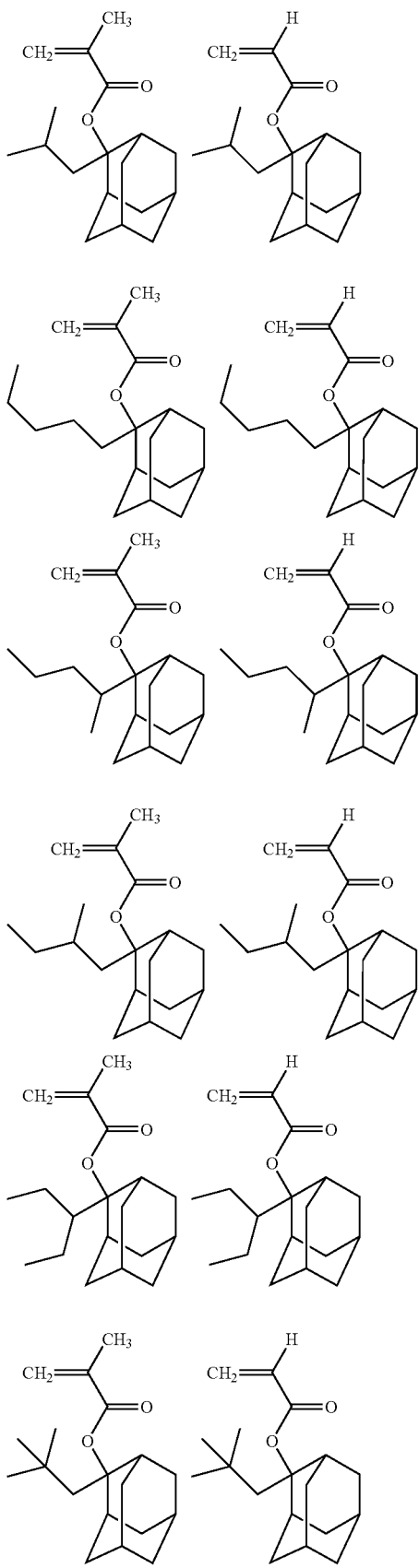
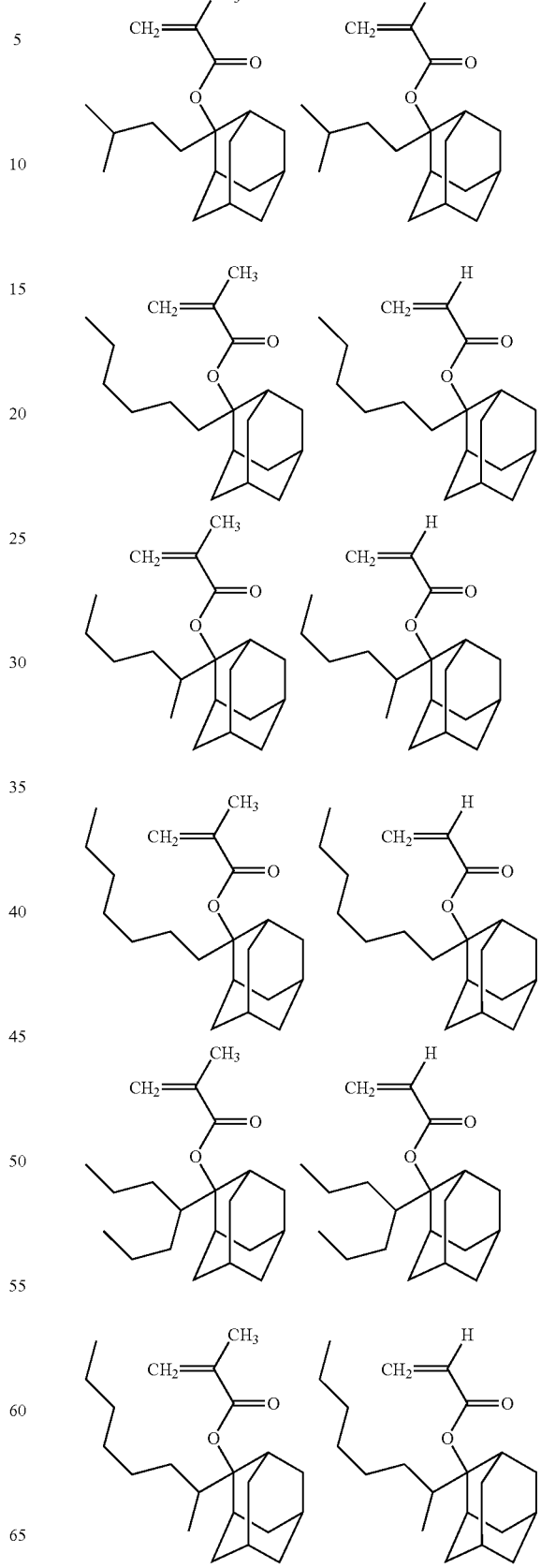

-continued
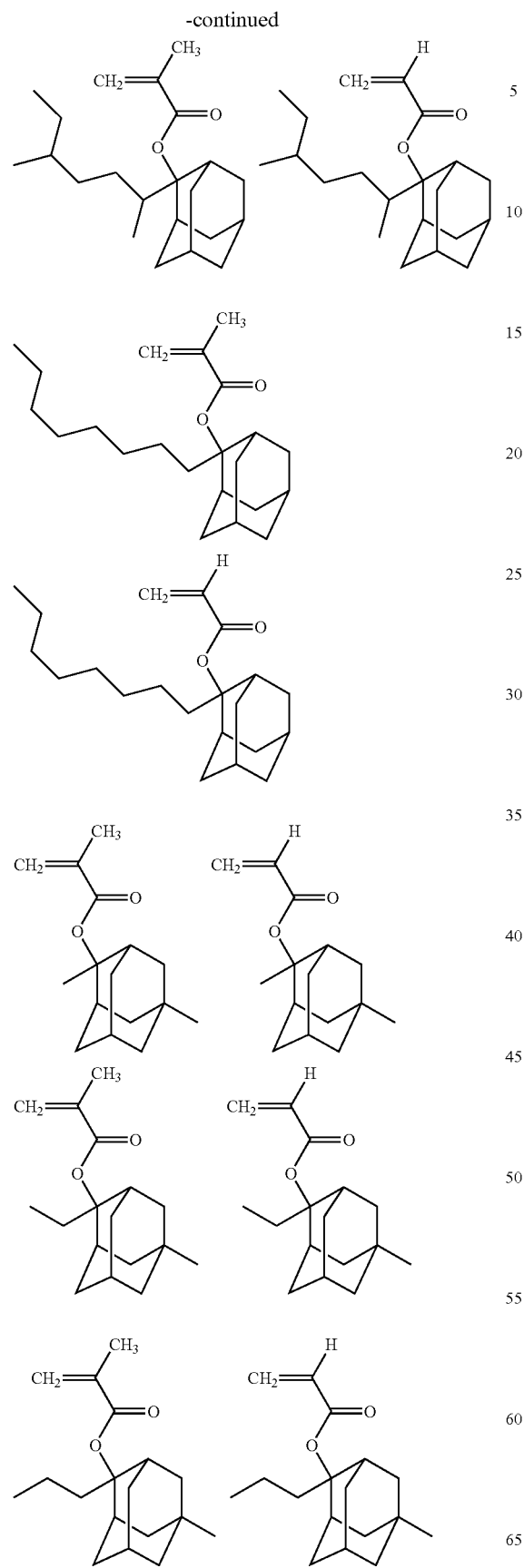
-continued
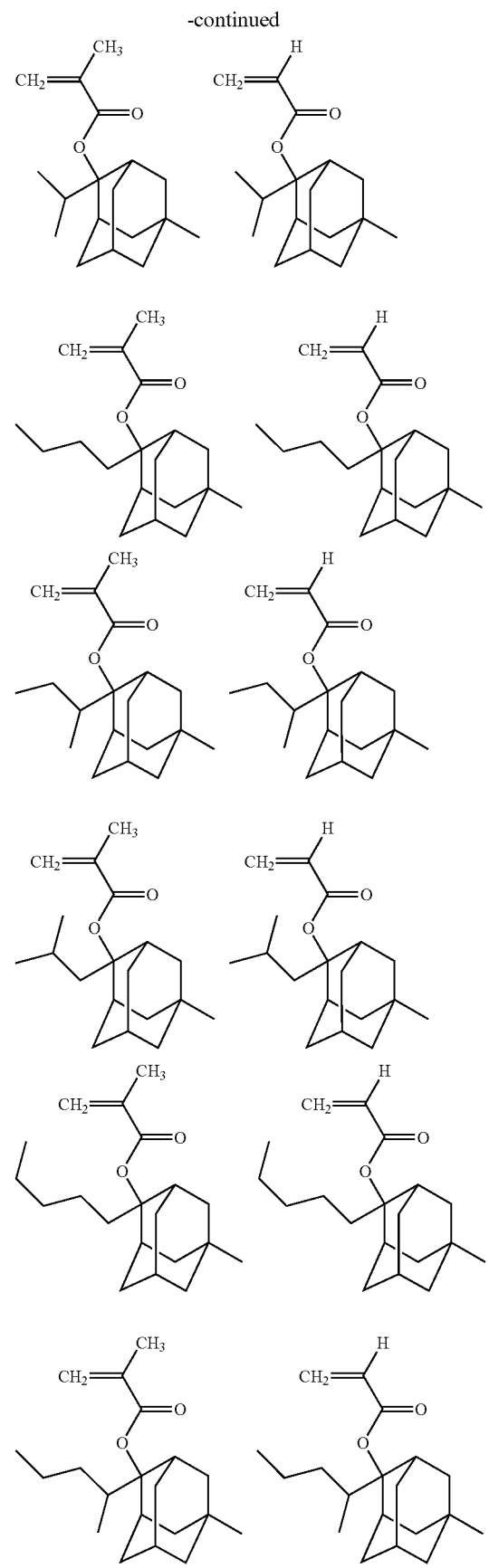

-continued
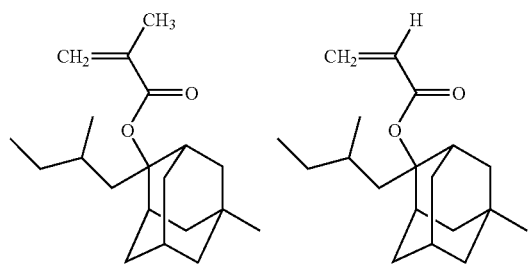
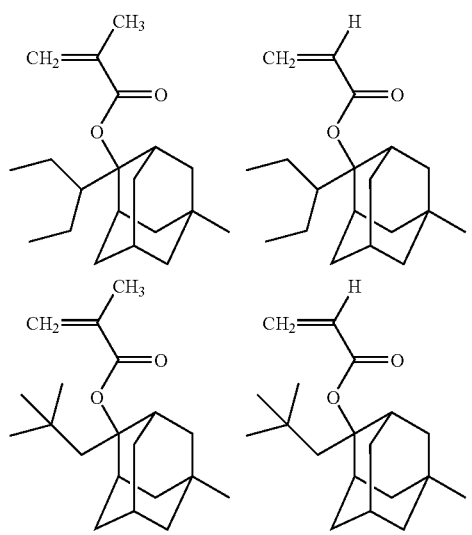
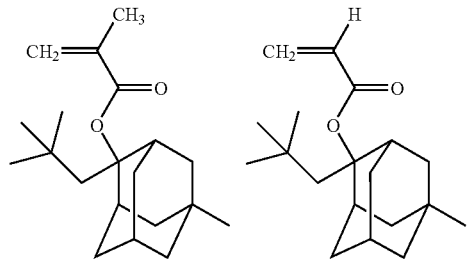
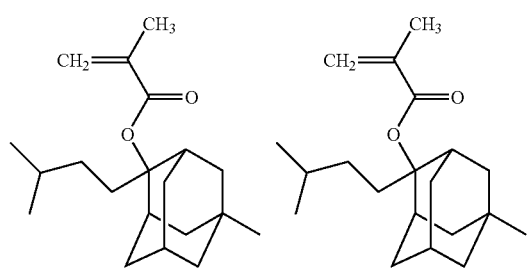
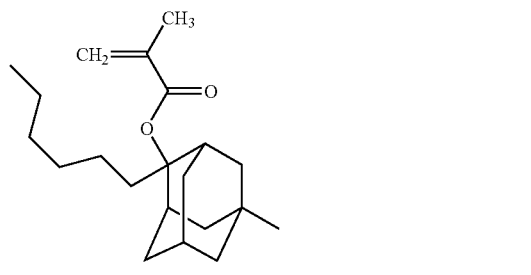
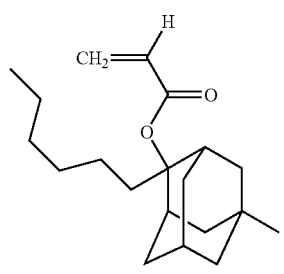
-continued
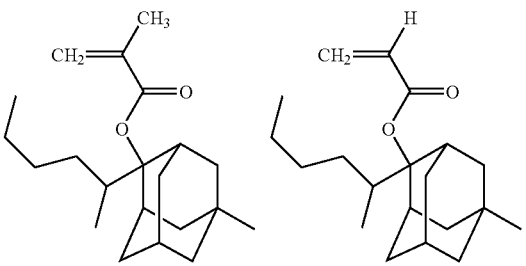
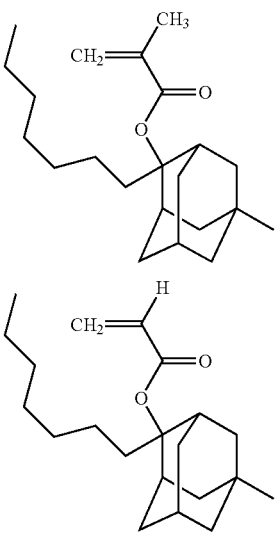
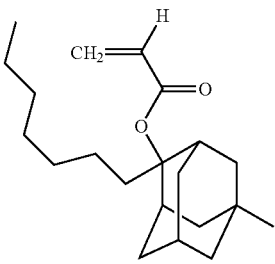
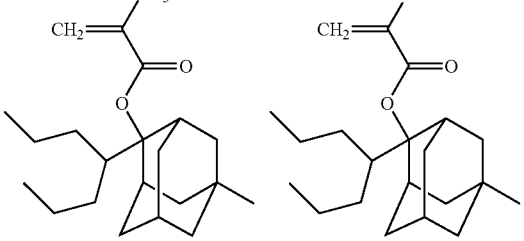
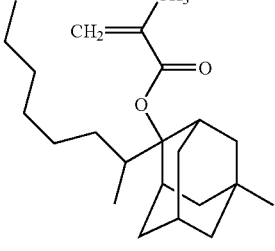
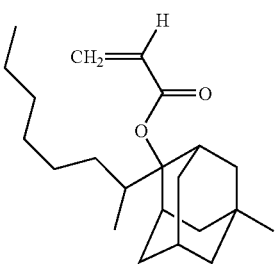

-continued
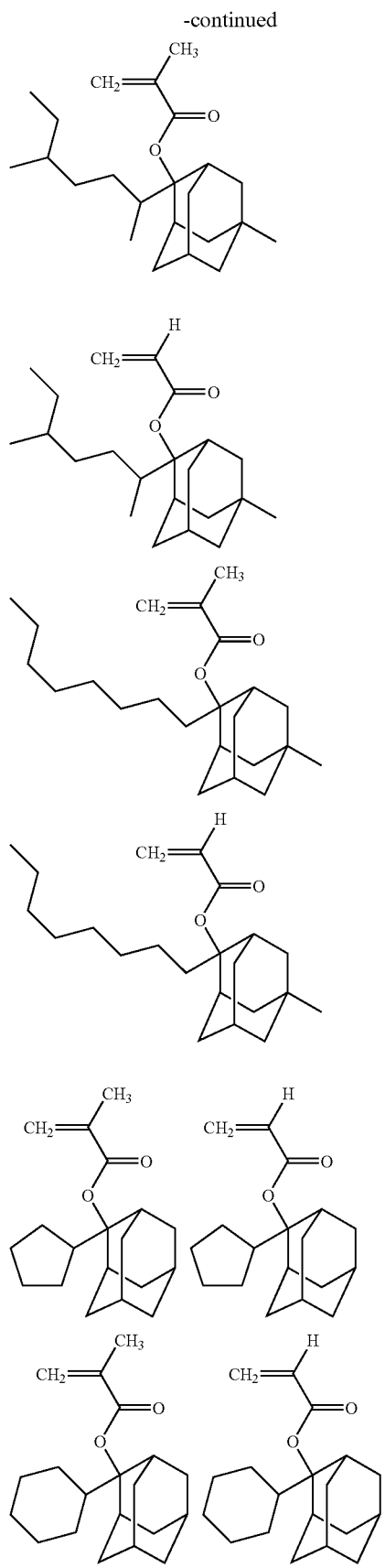
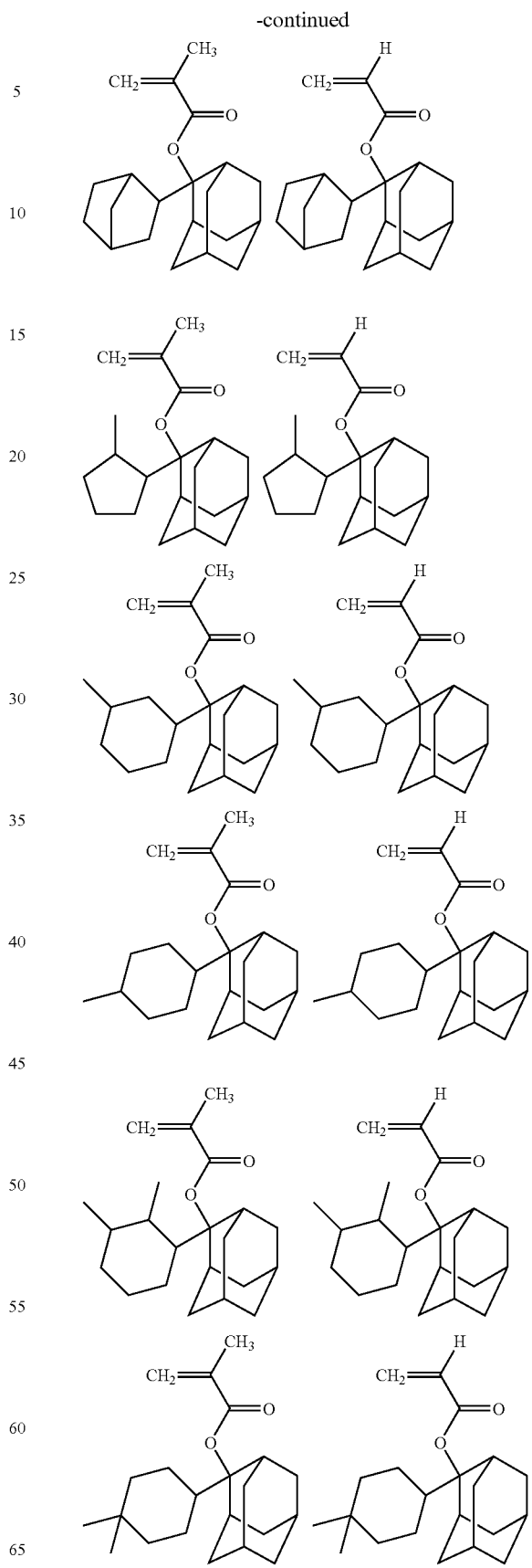

-continued
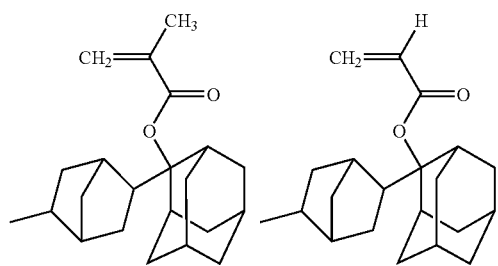
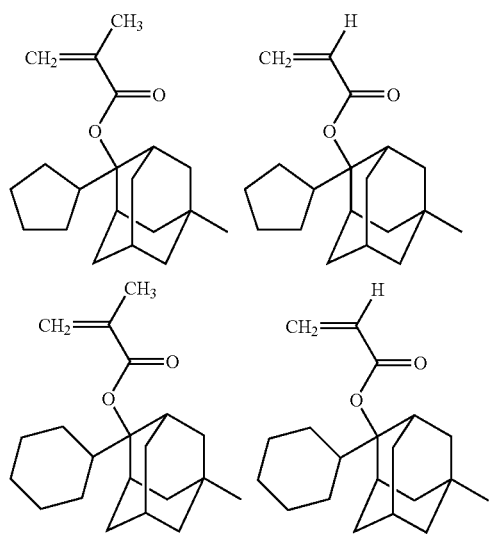
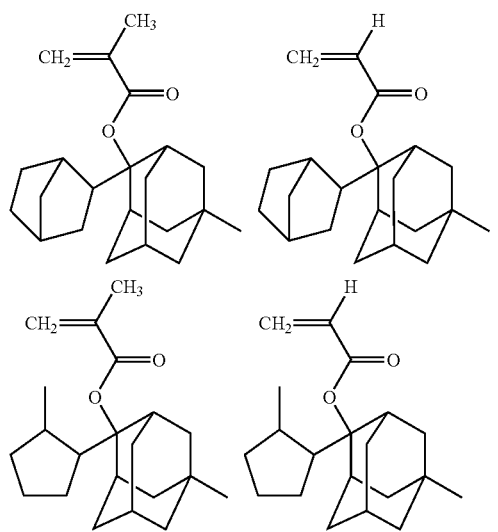
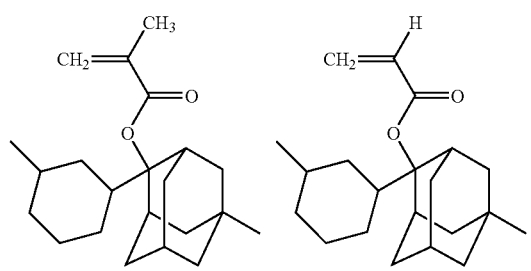
-continued
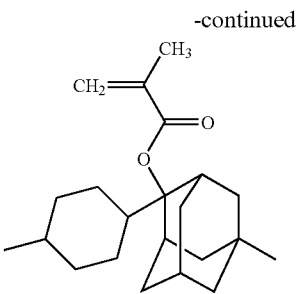
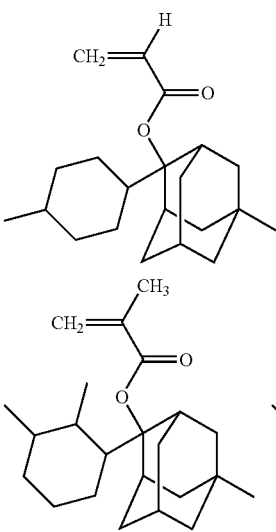
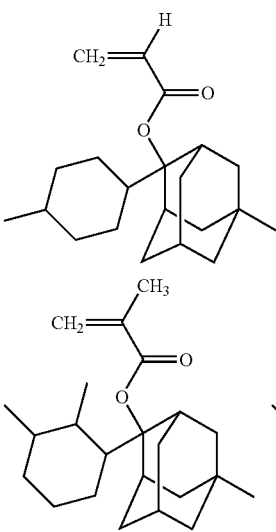
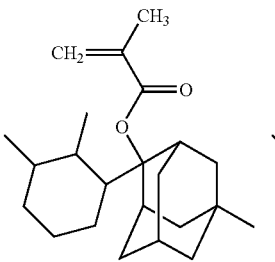
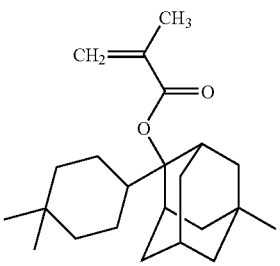
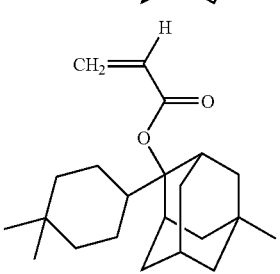
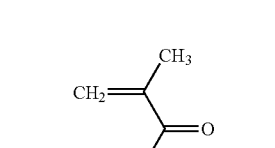
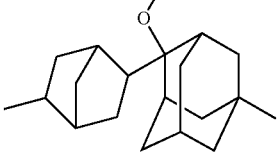

-continued
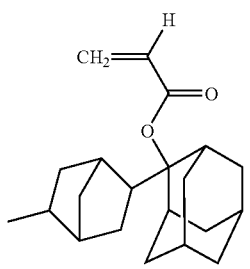
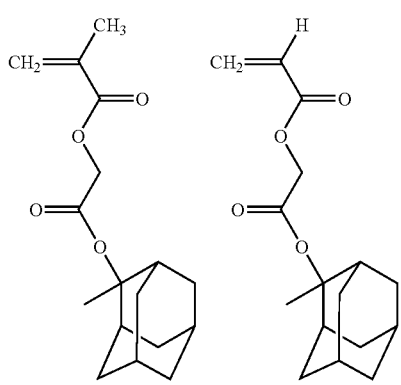
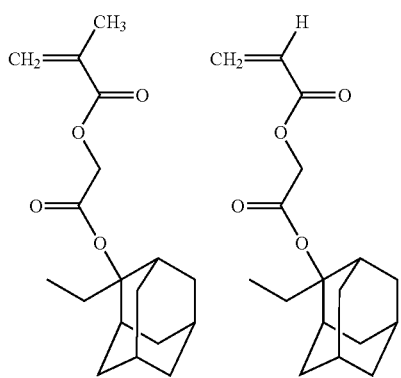
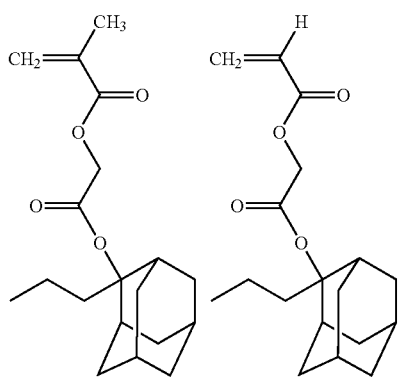
-continued
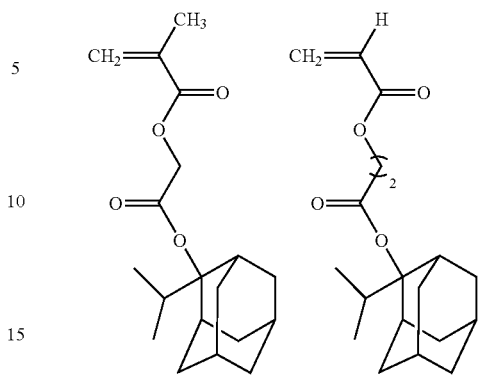
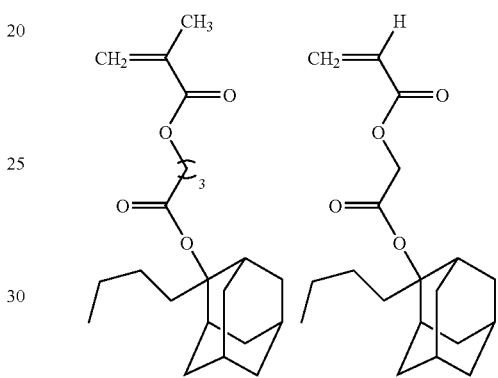
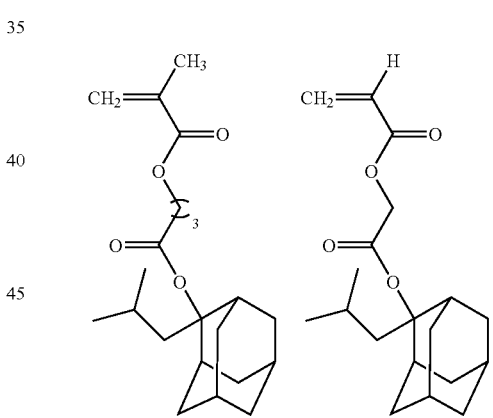
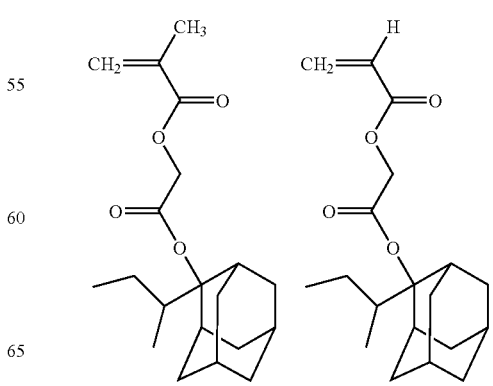

-continued
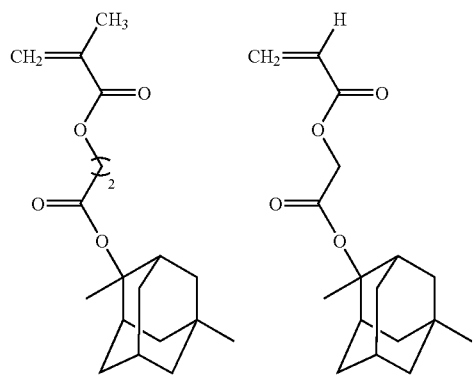
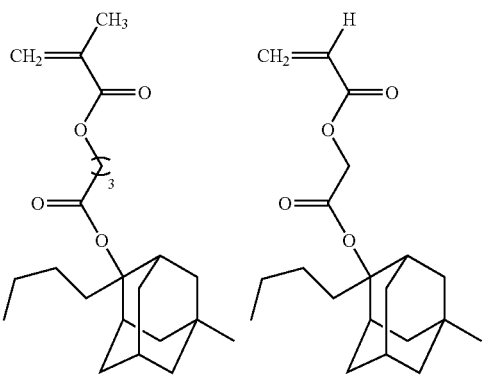
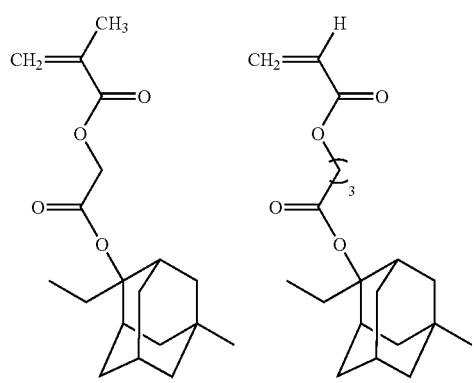
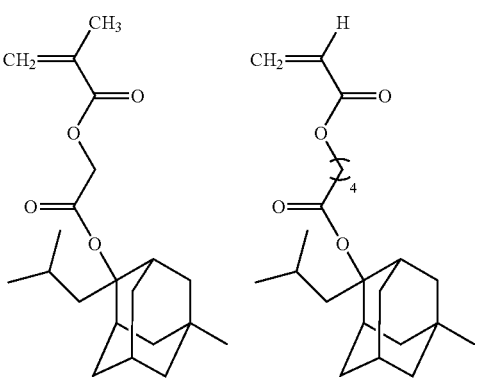
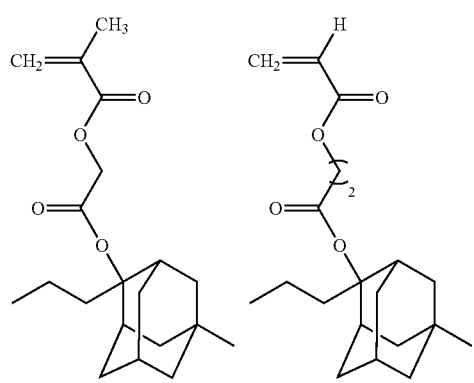
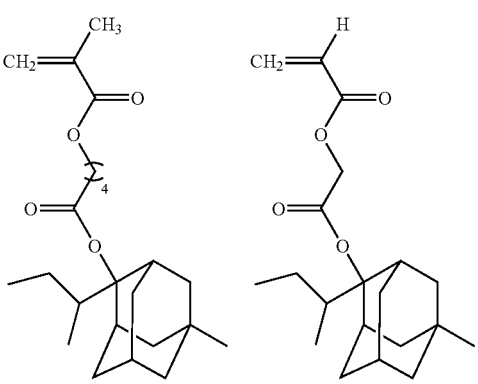
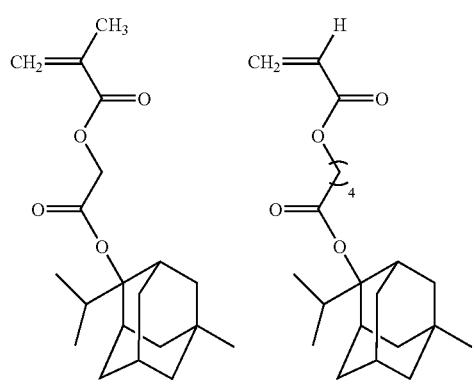
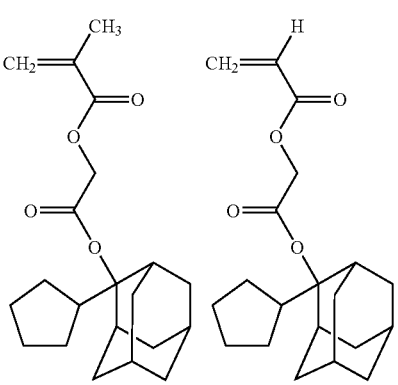

-continued
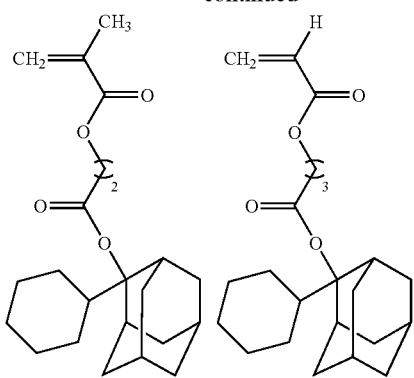
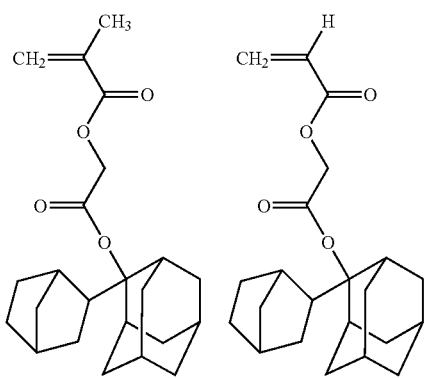
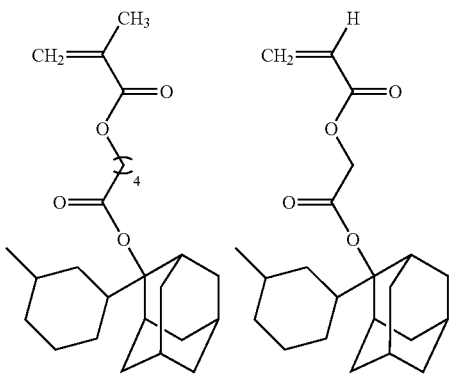
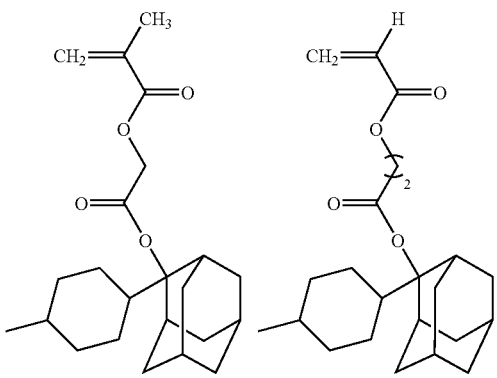
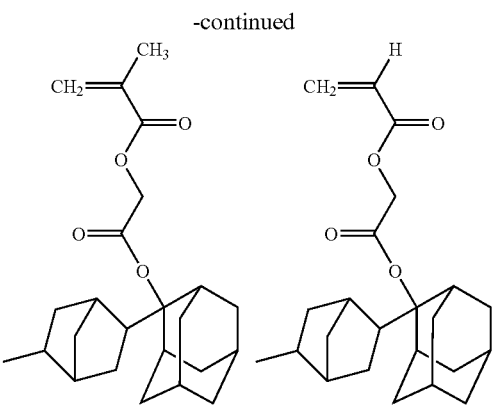
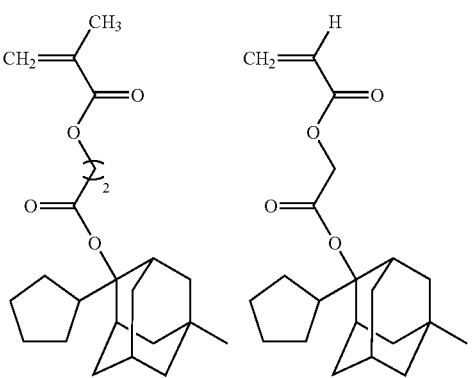
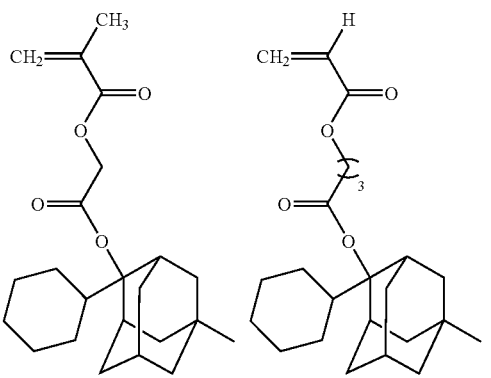
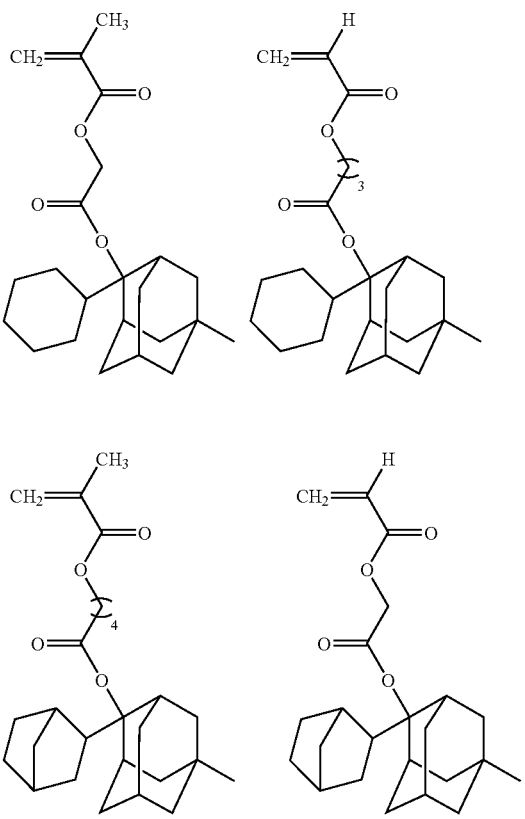

-continued

-continued
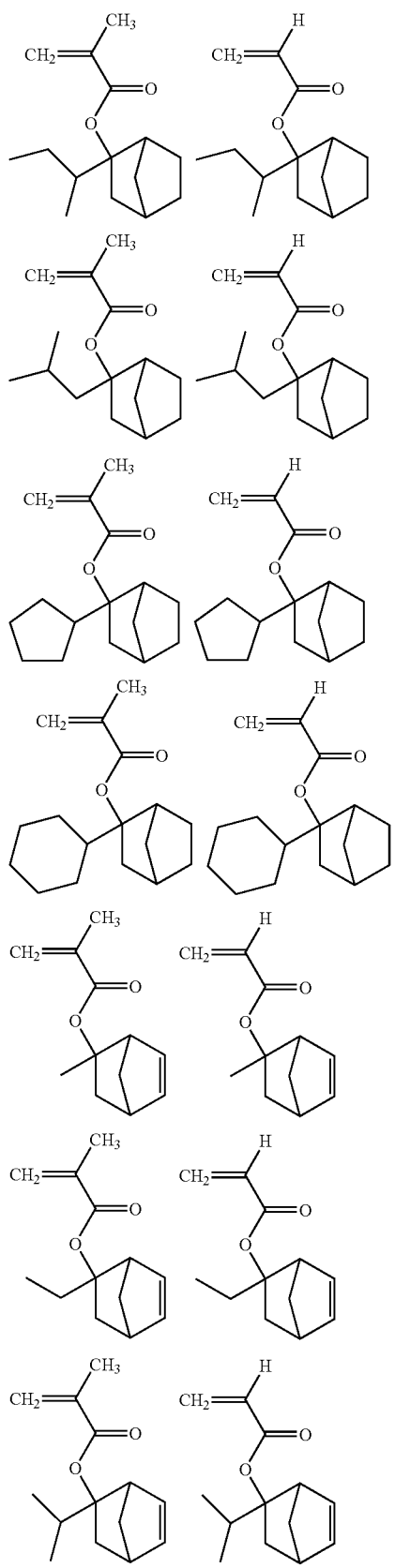
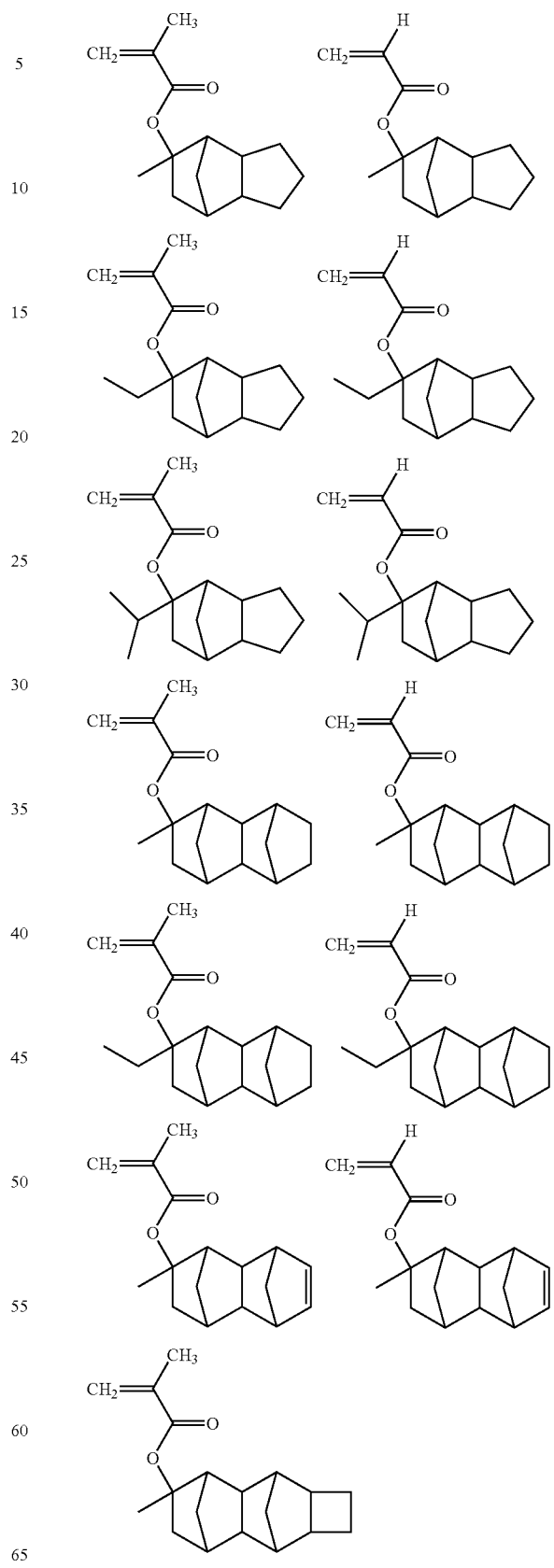

-continued
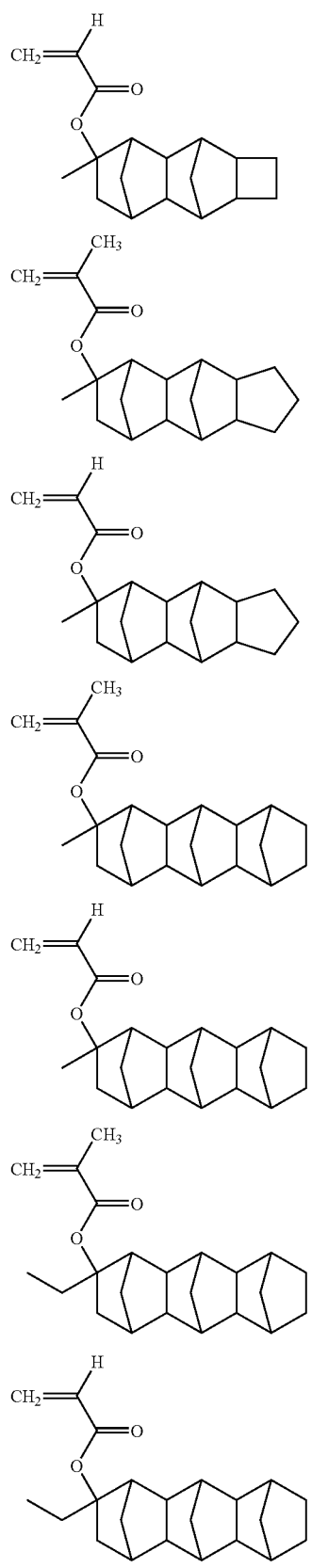
-continued
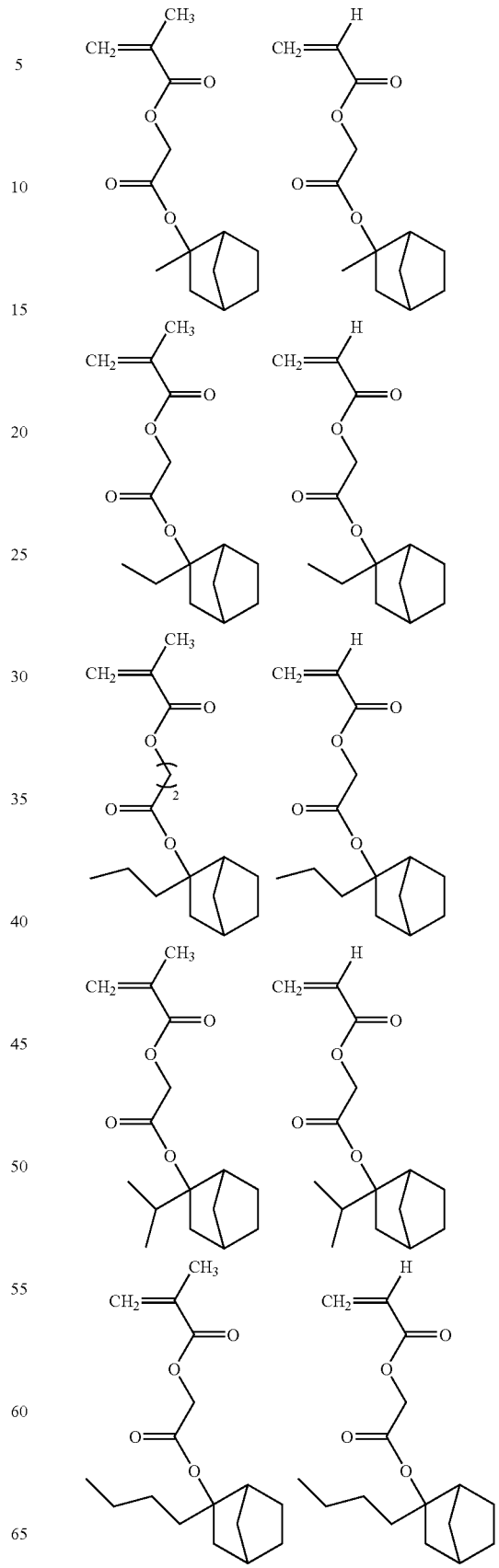

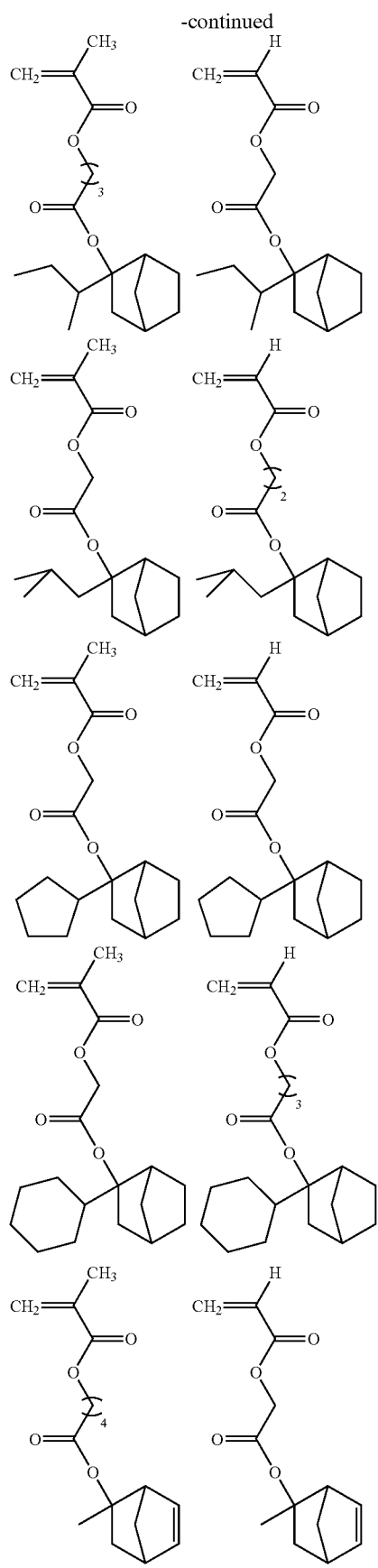
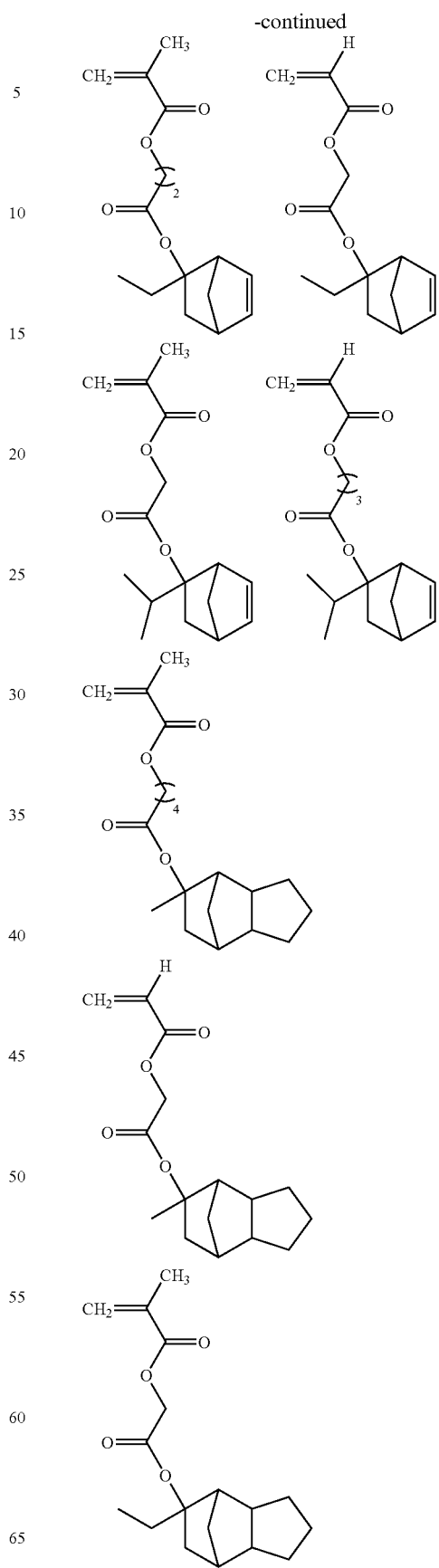

-continued

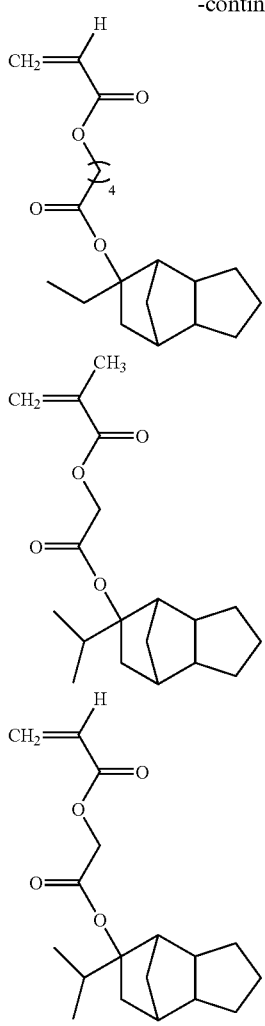

Among these monomers, 2-alkyl-2-adamantyl acrylate, 2-alkyl-2-adamantyl methacrylate, 1—(2-alkyl-2-adamntyloxycarbonyl)alkyl acrylate and 1-(2-alkyl-2-adamntyloxycarbonyl)alkyl methacrylate are preferable and 2-ethyl-2-adamantyl acrylate, 2-ethyl-2-adamantyl methacrylate, 2-isopropyl-2-adamantyl acrylate, 2-isopropyl-2-adamantyl methacrylate and 1-(2-methyl-2-adamantyloxycarbonyl)methyl methacrylate are more preferable since excellent sensitivity is obtained when the resin containing such structural unit is used in the present resist composition.

2-Alkyl-2-adamantyl acrylate can be produced, for example, by reacting 2-alkyl-2-adamantanol or metal salt thereof with an acryloyl halide, and 2-alkyl-2-adamantyl methacrylate can be produced, for example, by reacting 2-alkyl-2-adamantanol or metal salt thereof with a methacryloyl halide.

The structural unit (a3) and (b3) have a hydroxyl group. The structural unit (a3) and (b3) may be the same or different.

As the structural units (a3), and (b3), structural units derived from optionally substituted acrylic compounds are preferable. Examples of the optionally substituted acrylic compound include those as same as described above.

As the structural unit (a3), a structural unit represented by the formula (IIa) (hereinafter, simply referred to as the structural unit (IIa)) is preferable. As the structural unit (b3), a structural unit represented by the formula (IIb) (hereinafter, simply referred to as the structural unit (IIb)) is preferable.

In the structural unit (IIa), $R^{12}$ represents a hydrogen atom or a methyl group, $R^{13}$ and $R^{14}$ are the same or different and each independently represents a hydrogen atom, a methyl group or a hydroxyl group, $R^{15}$ represents a methyl group, n" represents an integer of 0 to 12, $Z^4$ represents a single bond or a —$(CH_2)_{q'}$—COO— group, and q' represents an integer of 1 to 4. In the structural unit (IIb), $R^8$ represents a hydrogen atom or a methyl group, $R^9$ and $R^{10}$ are the same or different and each independently represents a hydrogen atom, a methyl group or a hydroxyl group, $R^{11}$ represents a methyl group, n' represents an integer of 0 to 12, $Z^3$ represents a single bond or a —$(CH^2)_q$—COO— group, and q represents an integer of 1 to 4.

The structural unit (IIa) is derived from a monomer represented by the following formula:

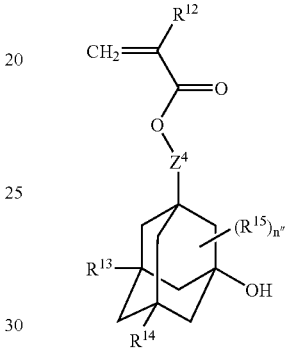

wherein $R^{12}$, $R^{13}$, $R^{14}$, $R^{15}$, n" and $Z^4$ are the same as defined above, and the structural unit (IIb) is derived from a monomer represented by the following formula:

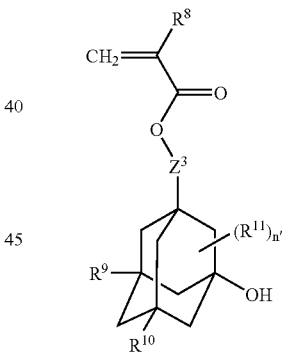

wherein $R^8$, $R^9$, $R^{10}$, $R^{11}$, n' and $Z^3$ are the same as defined above.

Specific examples of the monomer represented by the above-mentioned formulae include the followings:

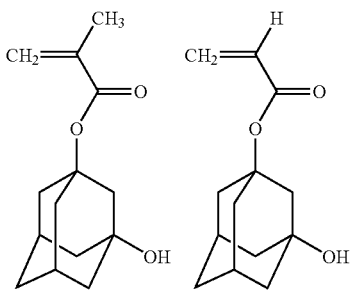

-continued
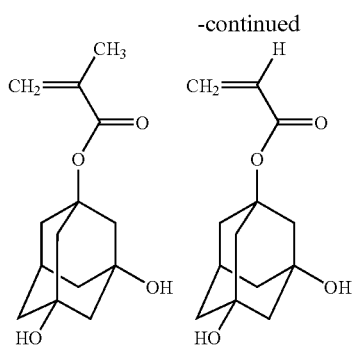
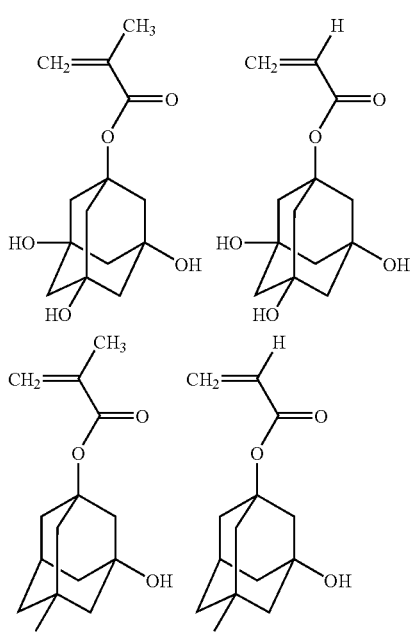
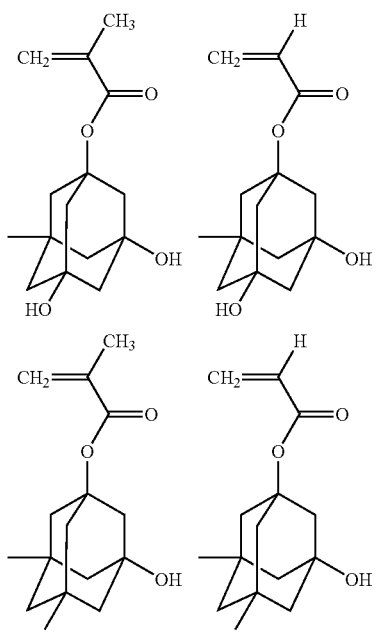
-continued
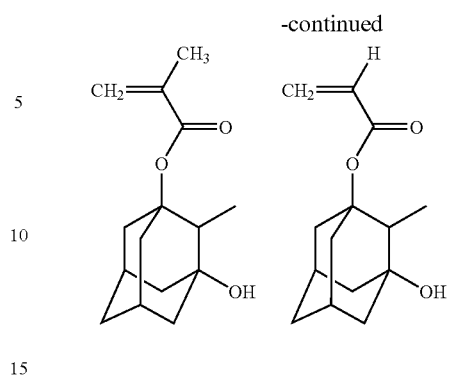
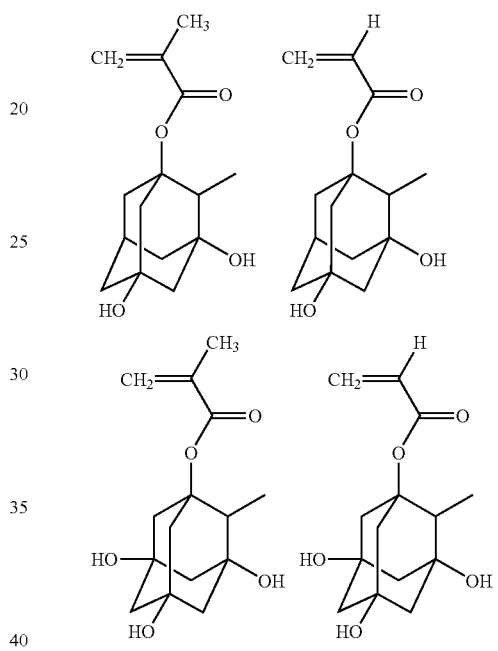
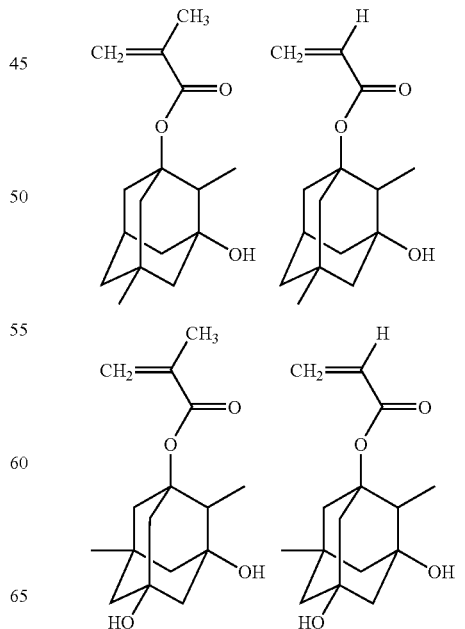

-continued
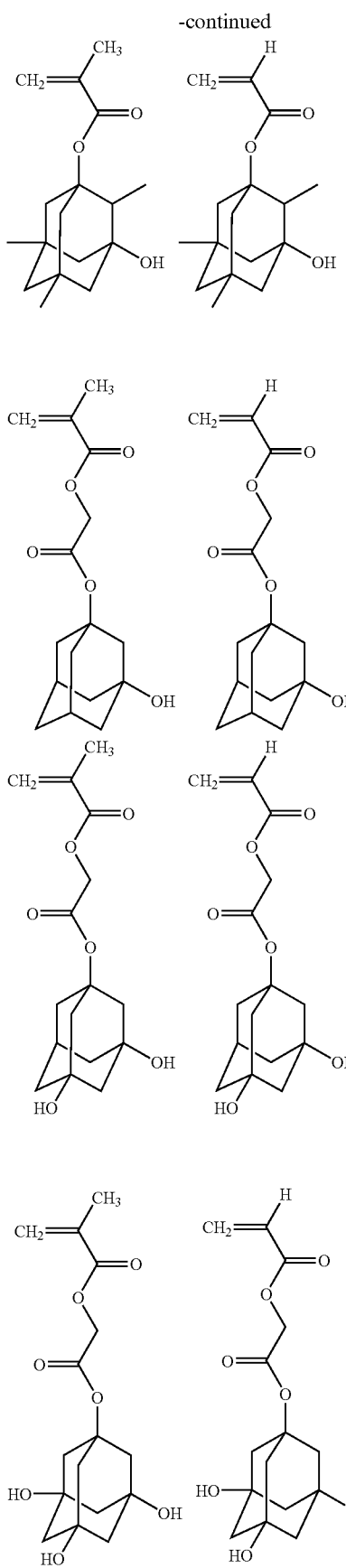
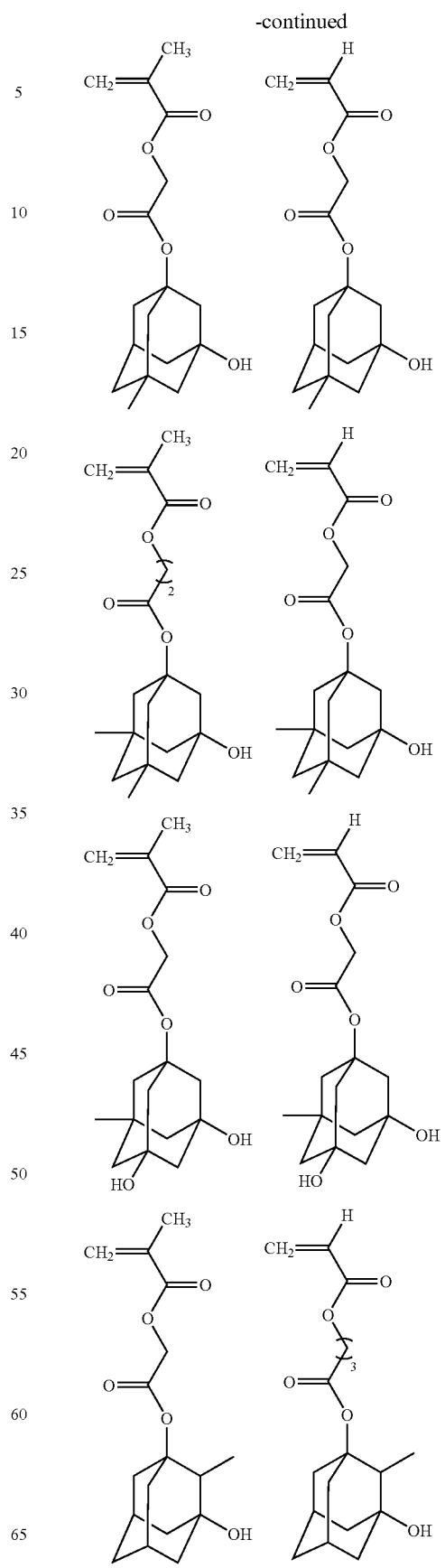

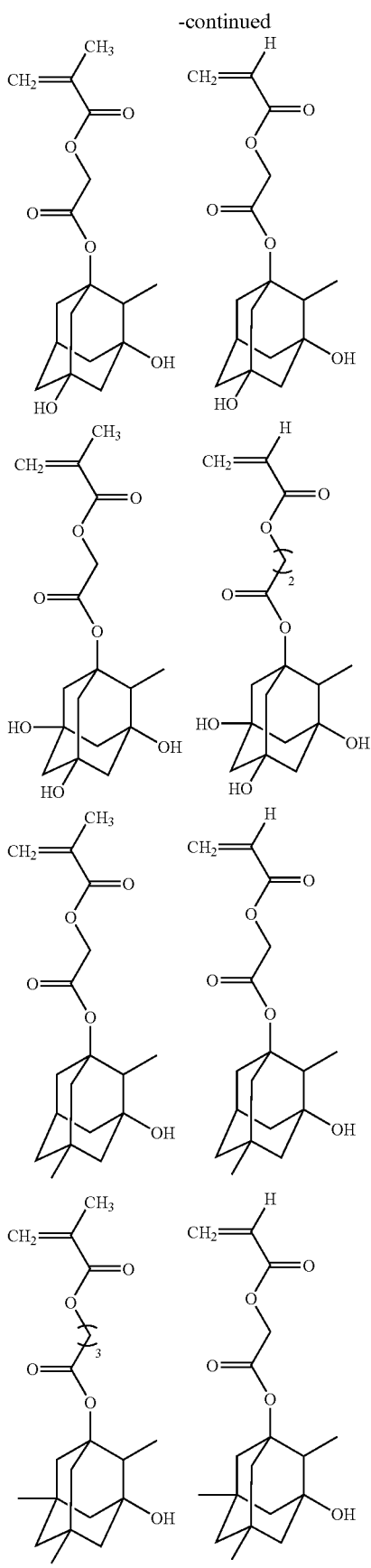

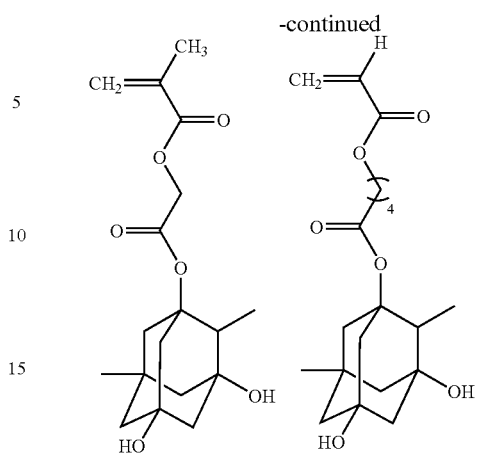

Among these monomers, 3-hydroxy-1-adamantyl acrylate, 3,5-dihydroxy-1-adamantyl acrylate, 3-hydroxy-1-adamantyl methacrylate, 3,5-dihydroxy-1-adamantyl methacrylate, 1-(3-hydroxy-1-adamantyloxycarbonyl) methyl methacrylate and 1-(3,5-dihydroxy-1-adamantyloxycarbonyl)methyl methacrylate are preferable since excellent resolution is obtained when the resin containing the structural unit derived from such monomer is used in the present resist composition.

3-Hydroxy-1-adamantyl acrylate, 3,5-dihydroxy-1-adamantyl acrylate, 3-hydroxy-1-adamantyl methacrylate and 3,5-dihydroxy-1-adamantyl methacrylate can be produced, for example, by reacting corresponding hydroxyl-substituted adamantane with acrylic acid, methacrylic acid, or its acid halide, and they are also commercially available.

The structural unit (a4) and (b4) have a lactone structure respectively. The structural unit (a4) and (b4) may be the same or different.

As the structural units (a4) and (b4), a structural unit derived from an optionally substituted acrylic compound is preferable. Examples of the optionally substituted acrylic compound include those as same as described above.

As the structural unit (a4), a structural unit represented by the formula (IIIg), (IIIh), (IIIi), (IIIj), (IIIk) or (IIIl) is preferable, and the structural units represented by the formulae (IIIg) and (IIIh) are more preferable.

As the structural unit (b4), a structural unit represented by the formula (IIIa), (IIIb), (IIIc), (IIId), (IIIe) or (IIIf) is preferable, and the structural units represented by the formulae (IIIa) and (IIIb) are more preferable.

In the structural unit represented by the formula (IIIa), (IIIb), (IIIc), (IIId), (IIIe) or (IIIf), $R^{17}$ represents a hydrogen atom or a methyl group, $R^{18}$ represents a methyl group, $R^{19}$ represents a carboxyl, cyano or C1-C4 hydrocarbon group, $R^{20}$ represents a carboxyl, cyano or C1-C4 hydrocarbon group, j represents an integer of 0 to 3, a represents an integer of 0 to 5, b represents an integer of 0 to 3, and when b represents 2 or 3, $R^{19}$s or $R^{20}$s may be same or different, c represents an integer of 0 to (2j+2), $Z^5$ represents a single bond or a —$(CH_2)_{q''}$—COO— group, and q'' represents an integer of 1 to 4.

In the structural unit represented by the formula (IIIg), (IIIh), (IIIi), (IIIj), (IIIk) or (IIIl), $R^{21}$ represents a hydrogen atom or a methyl group, $R^{22}$ represents a methyl group, $R^{23}$ represents a carboxyl, cyano or C1-C4 hydrocarbon group, $R^{24}$ represents a carboxyl, cyano or C1-C4 hydrocarbon group, i represents an integer of 0 to 3, d represents an integer of 0 to 5, e represents an integer of 0 to 3, and when e represents 2 or 3, $R^{23}$s or $R^{24}$s may be same or different, f represents an integer of 0 to (2i+2), $Z^6$ represents a single bond or a $-(CH_2)_{q'''}-COO-$ group, and q''' represents an integer of 1 to 4.

Examples of the C1-C4 hydrocarbon group include a C1-C4 alkyl group such as a methyl, ethyl, n-propyl, isopropyl, n-butyl, isobutyl, sec-butyl and tert-butyl group, and the methyl group is preferable.

The structural units represented by the formulae (IIIa), (IIIb), (IIIc), (IIId), (IIIe), (IIIf), (IIIg), (IIIh), (IIIi), (IIIj), (IIIk) and (IIIl) are respectively derived from the corresponding monomers.

Specific examples of the monomer used to give the structural units represented by the formulae (IIIa) and (IIIg) include the followings:

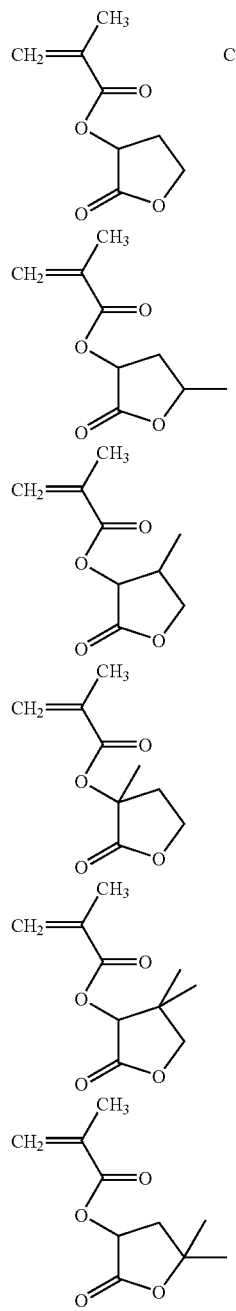

-continued

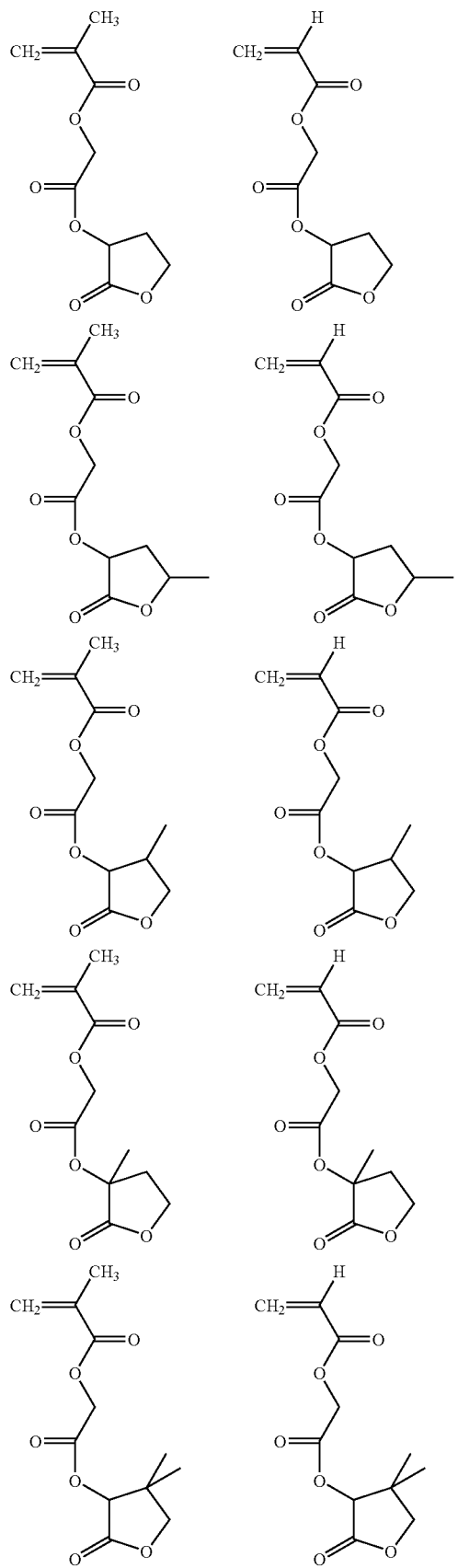

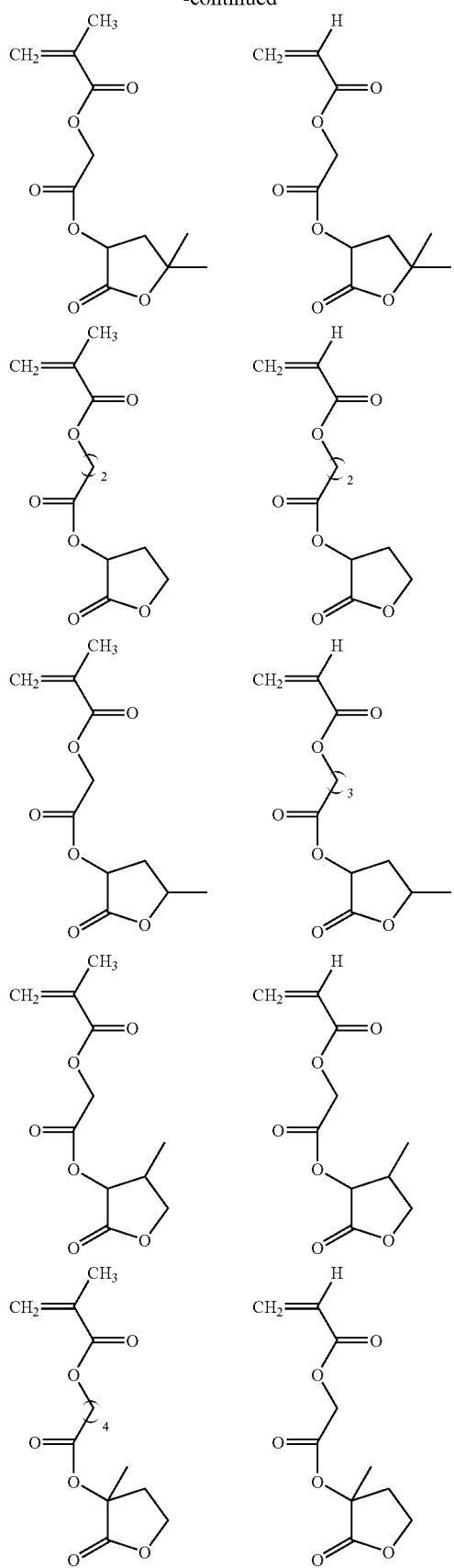
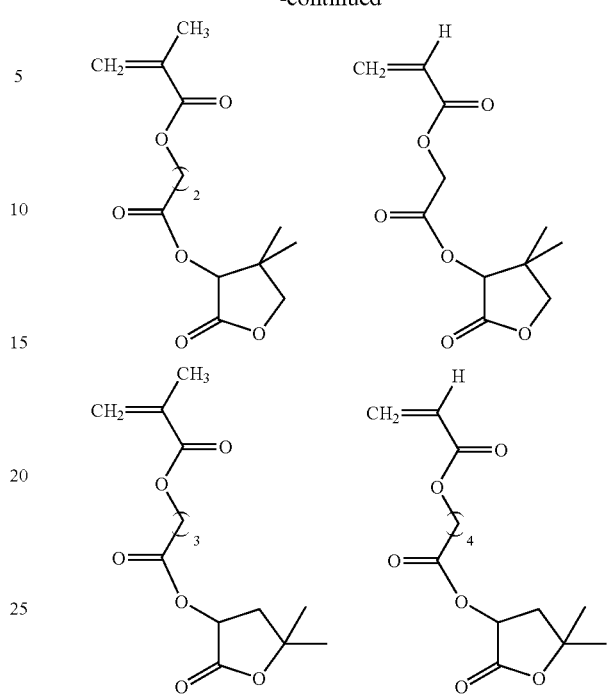
Specific examples of the monomer used to give the structural units represented by the formulae (IIIb) and (IIIh) include the followings:
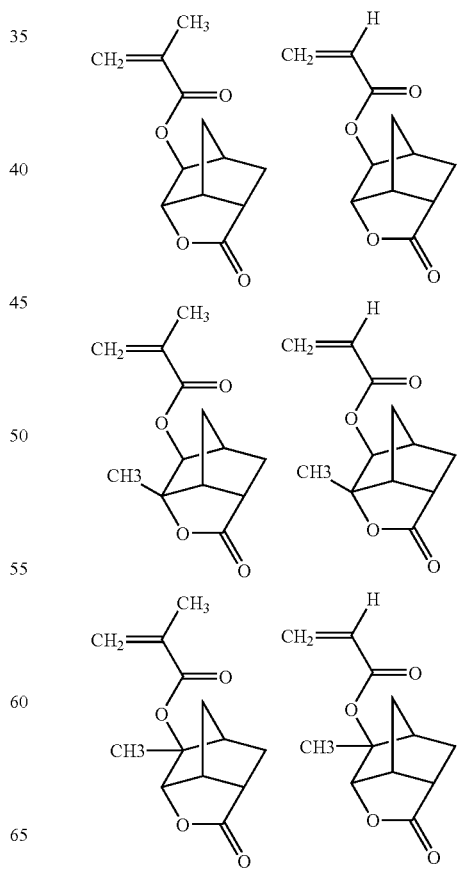

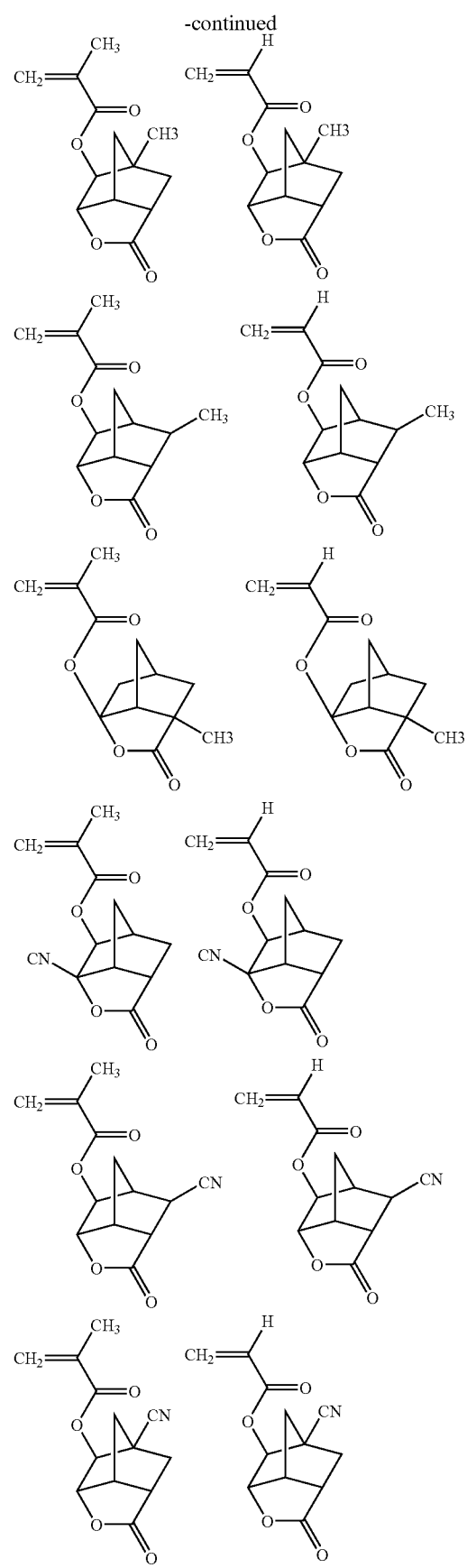
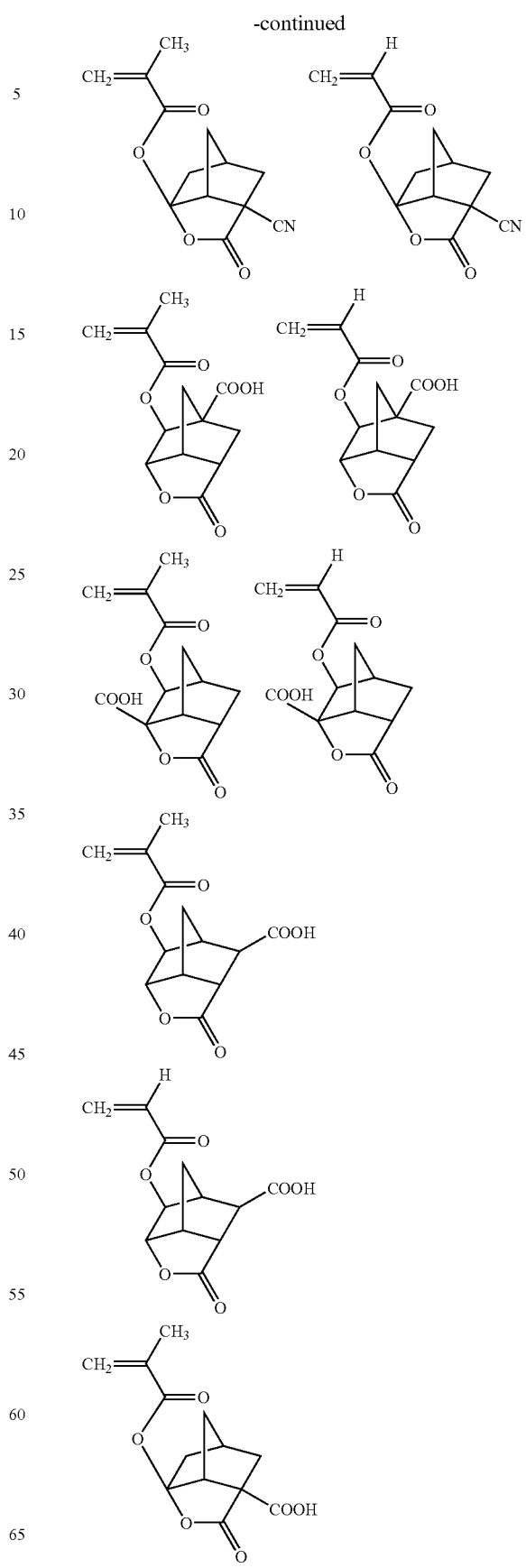

-continued
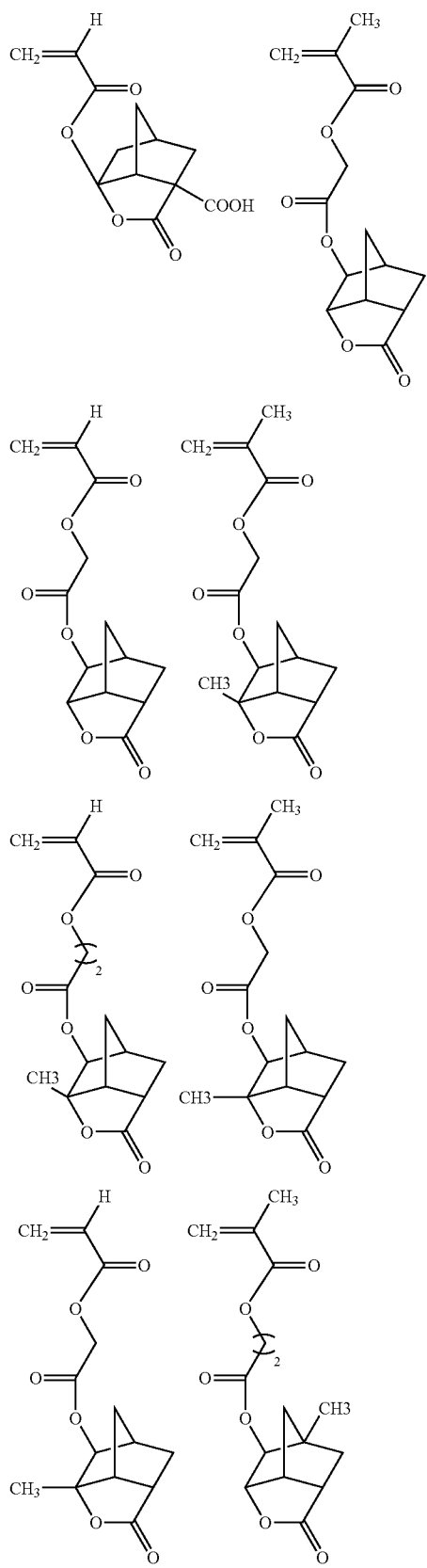
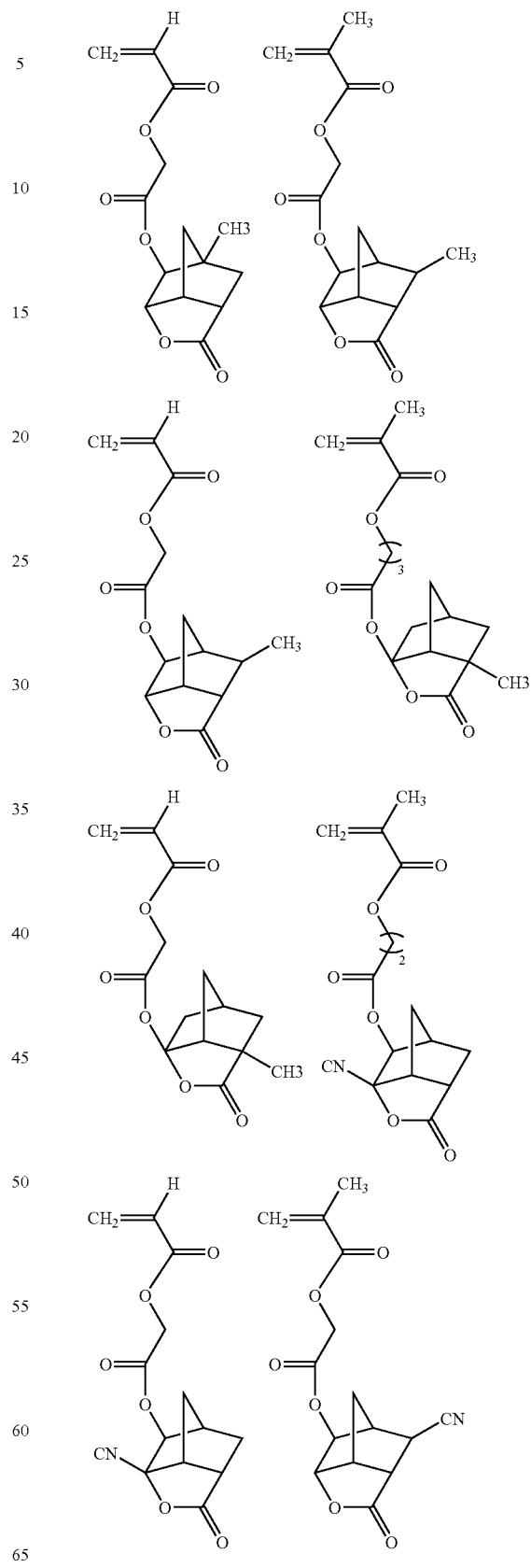

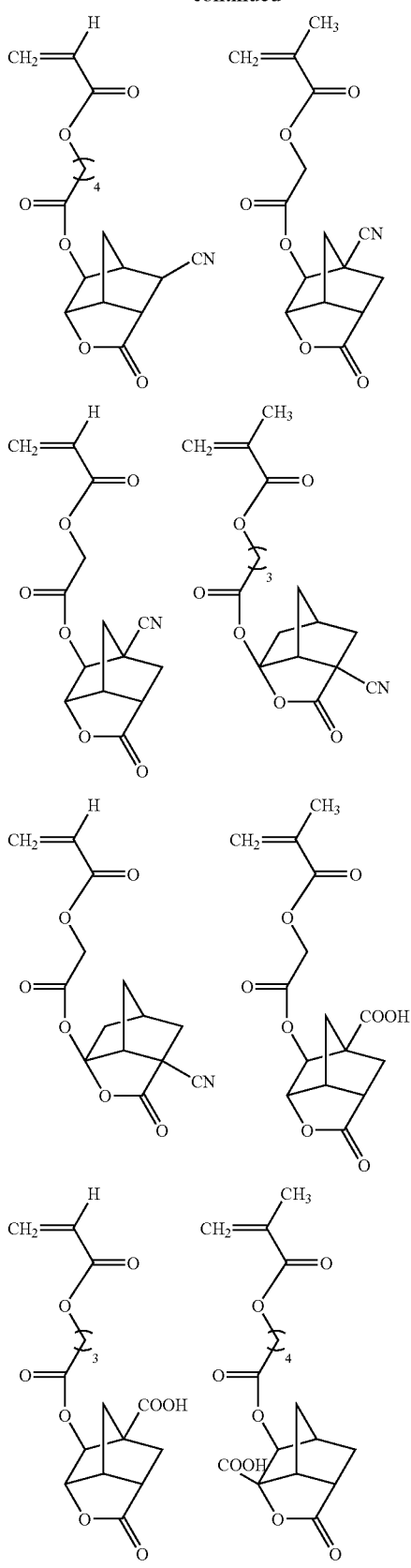
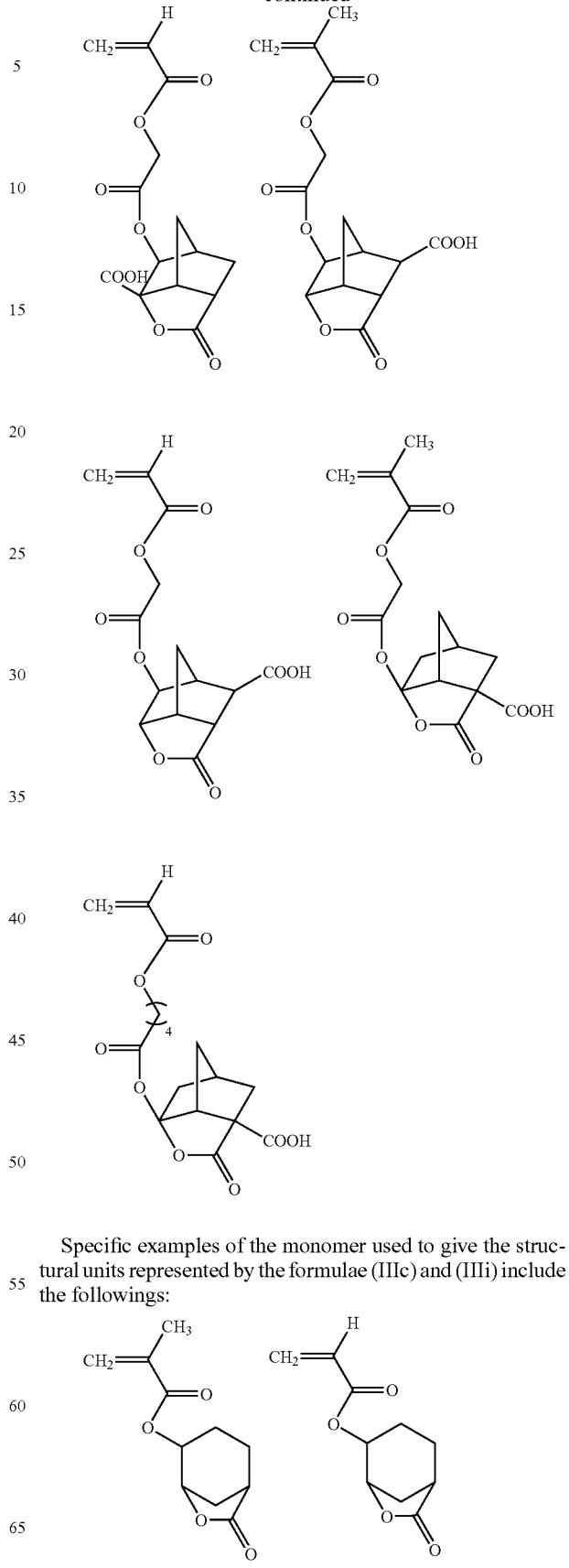
Specific examples of the monomer used to give the structural units represented by the formulae (IIIc) and (IIIi) include the followings:

-continued
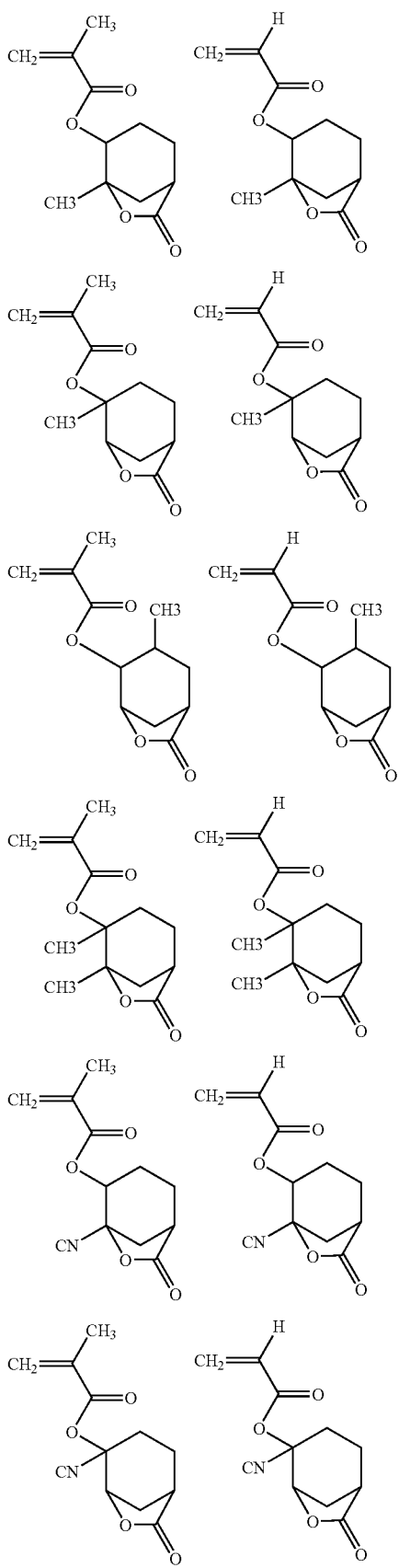
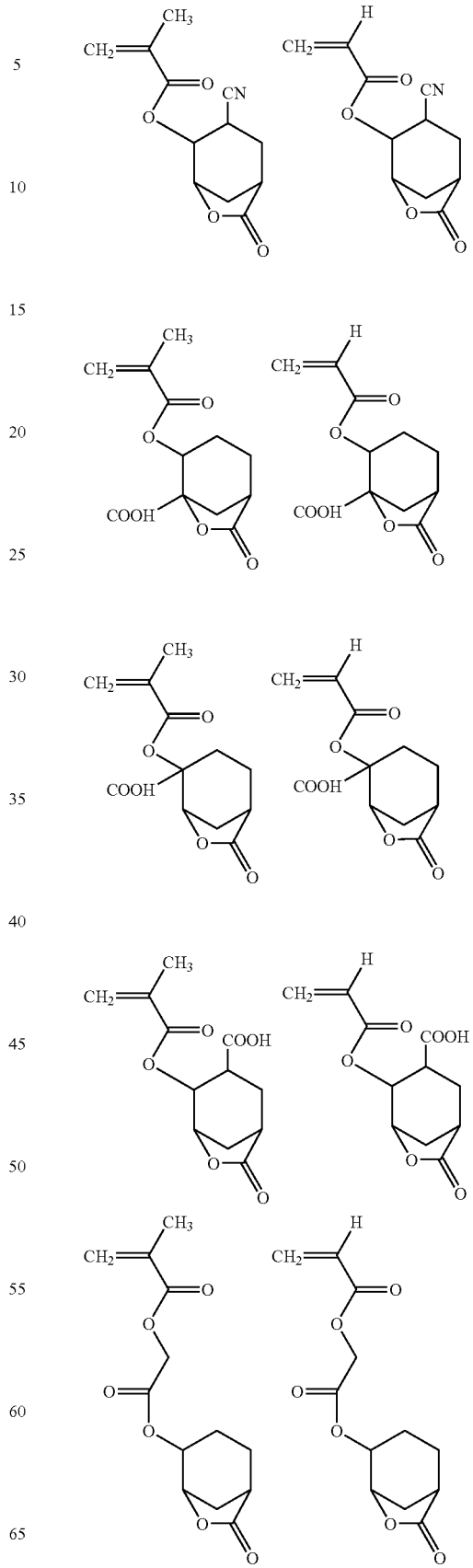

-continued
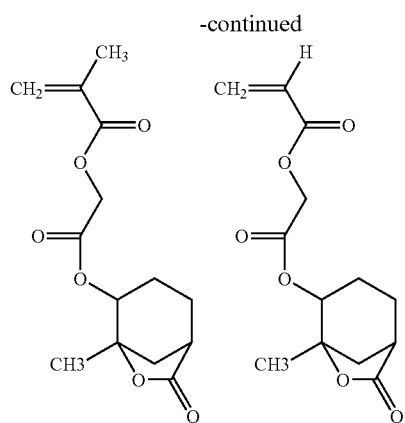
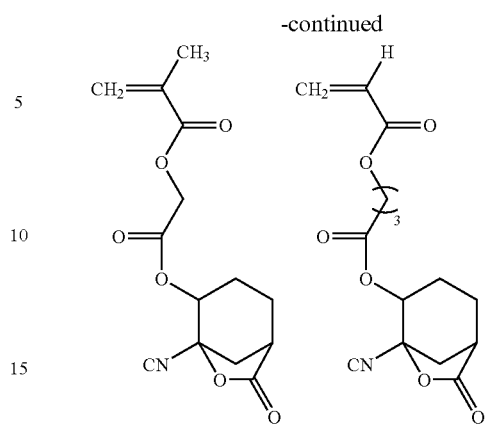
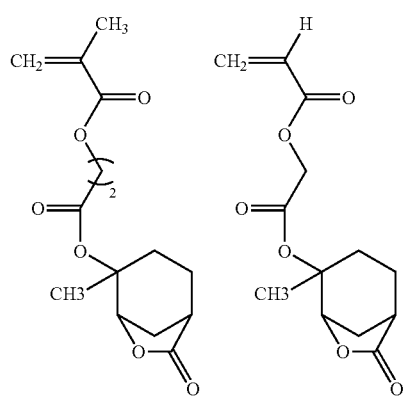
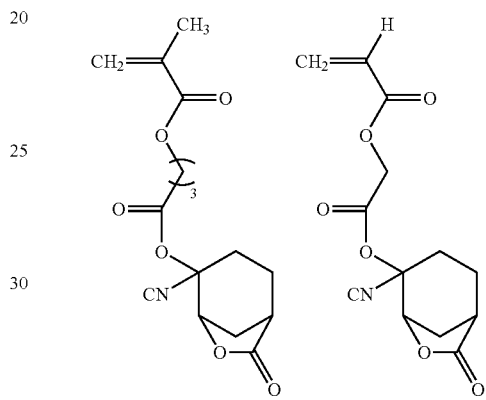
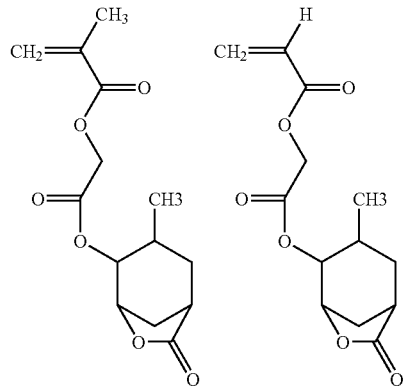
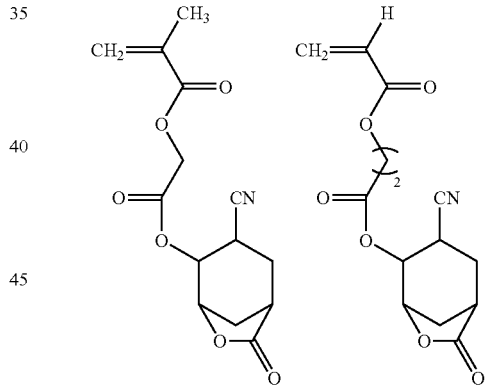
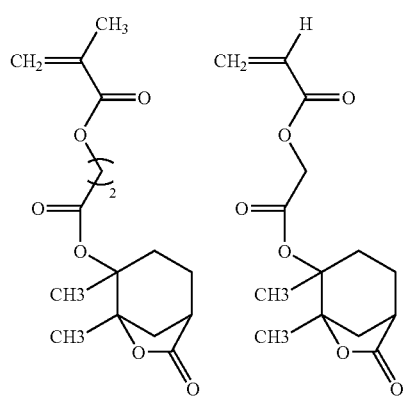
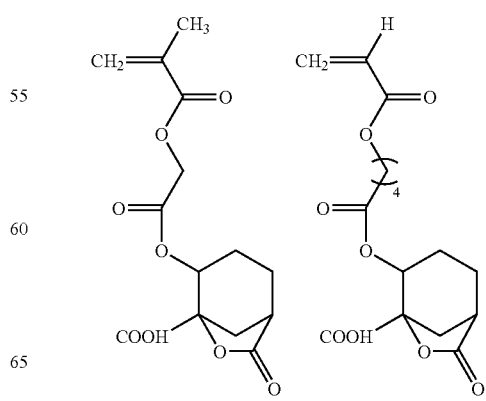

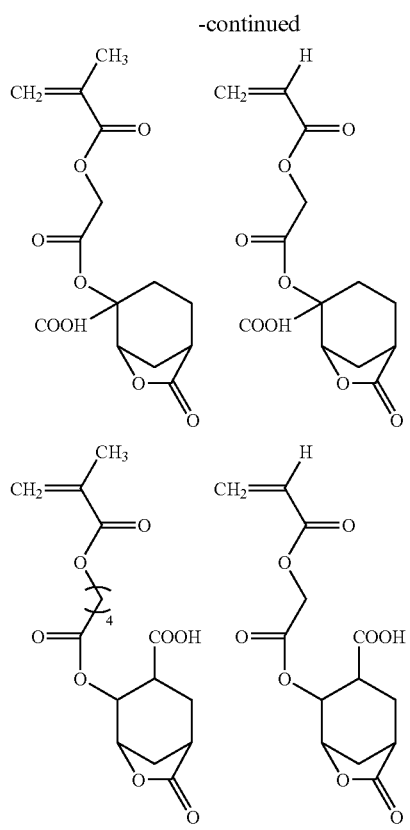
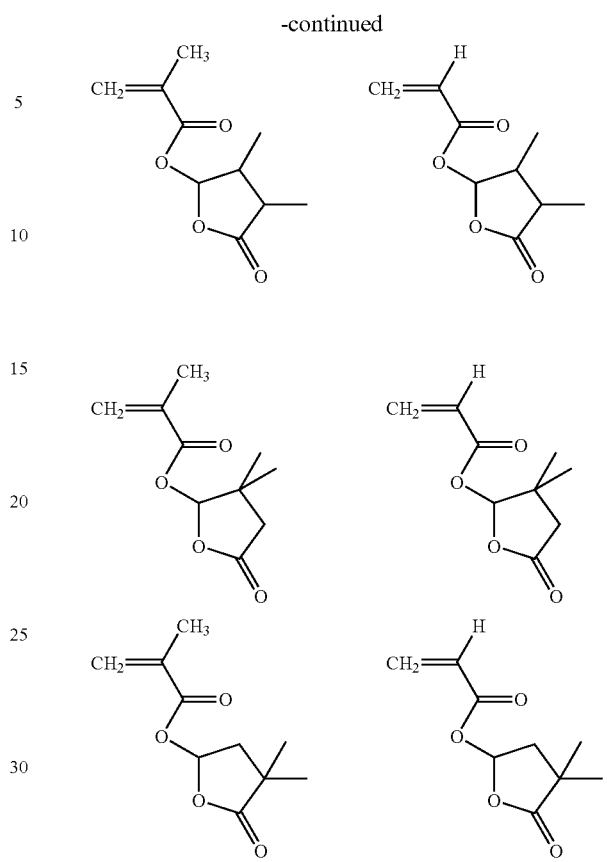
Specific examples of the monomer used to give the structural units represented by the formulae (IIId) and (IIIj) include the followings:
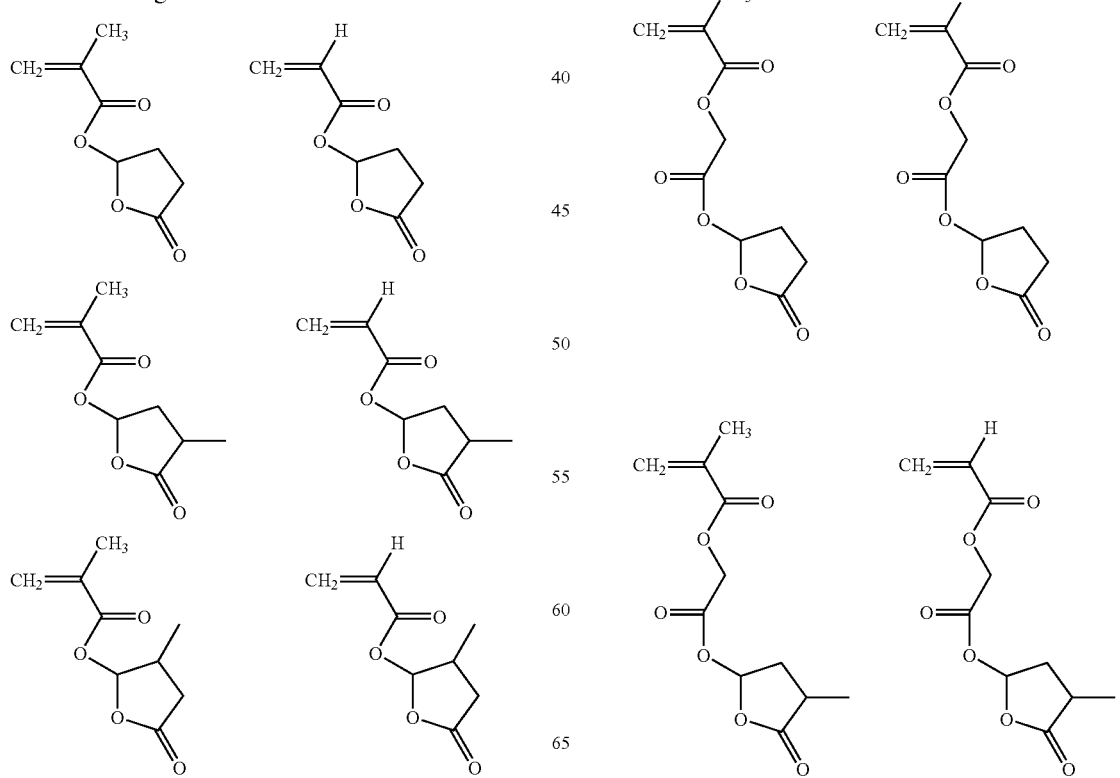

-continued
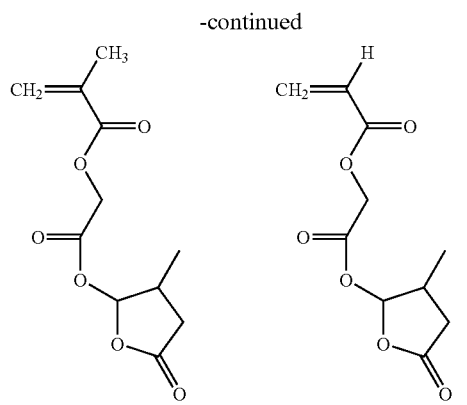 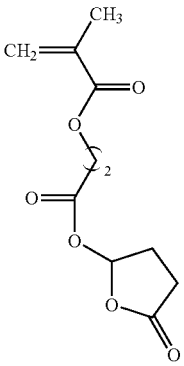 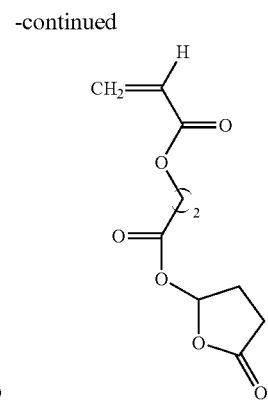
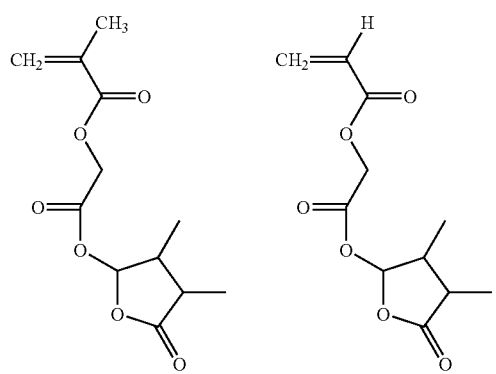 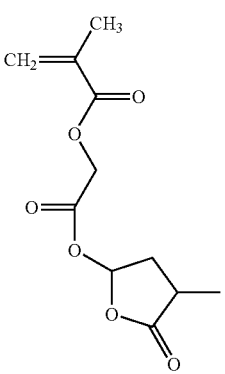 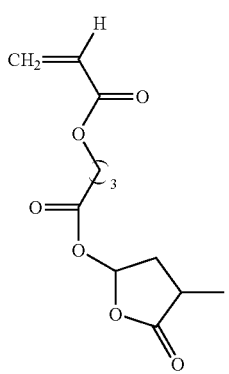
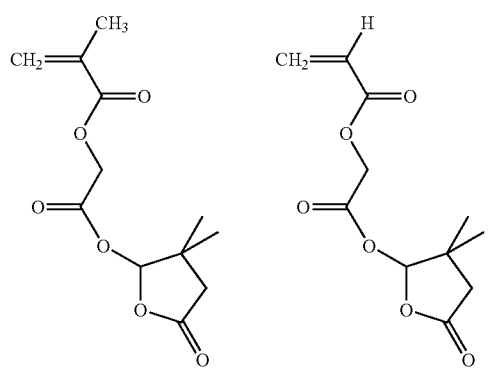 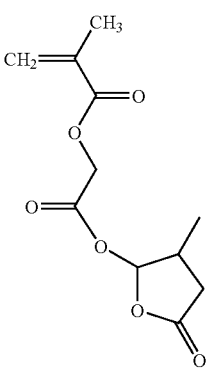 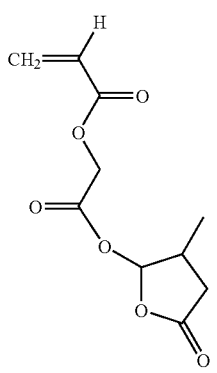
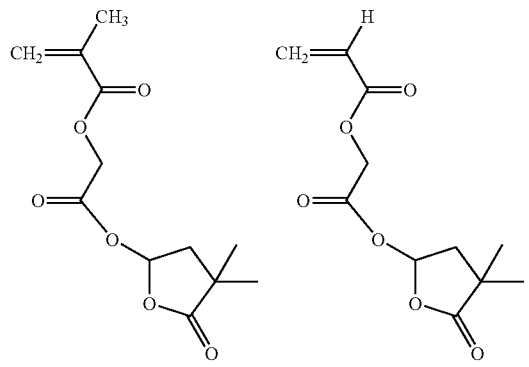 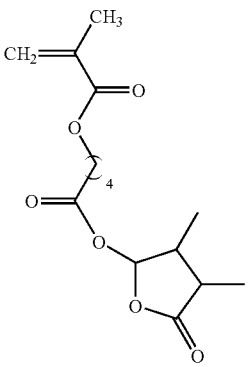 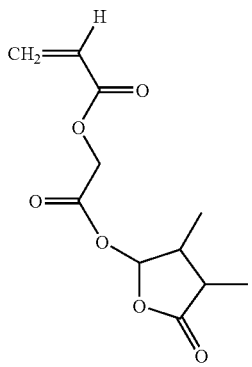

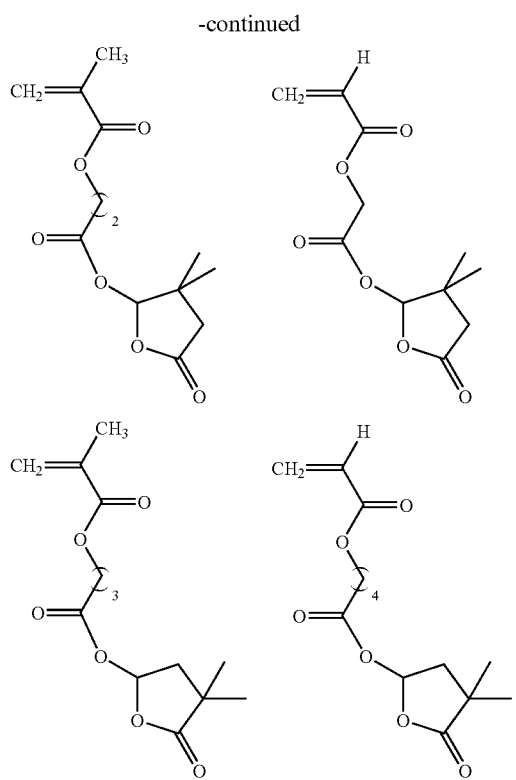
Specific example of the monomer used to give the structural units represented by the formulae (IIIe) and (IIIk) include the followings:
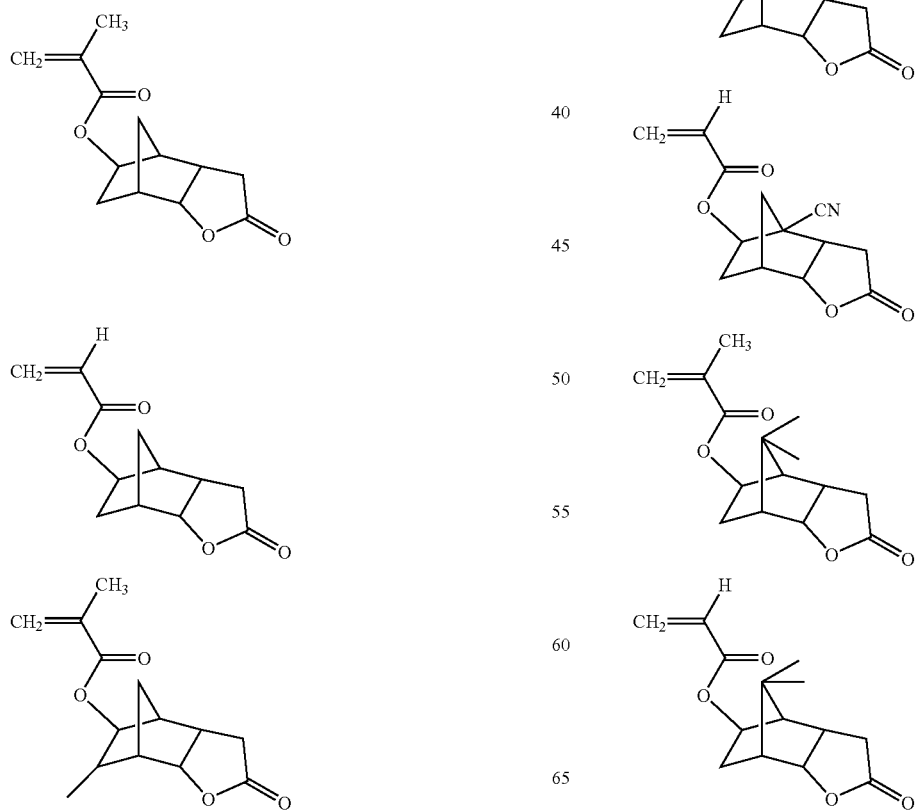
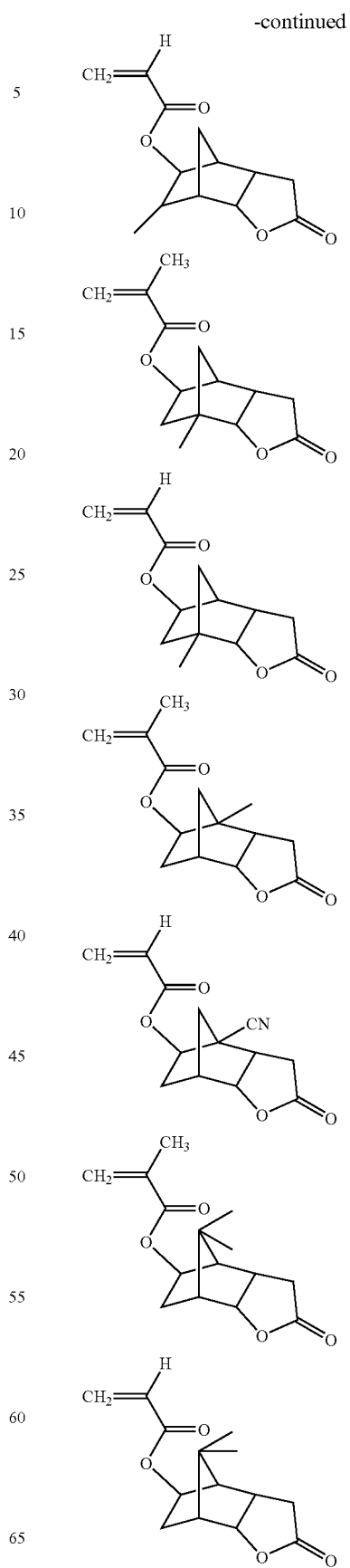

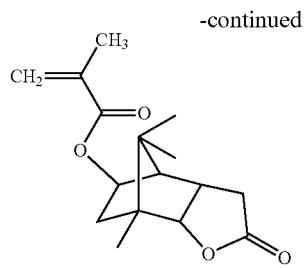
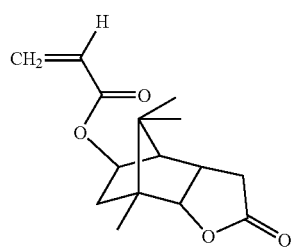
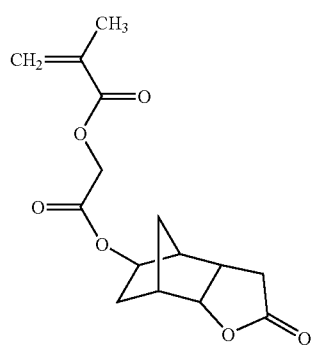
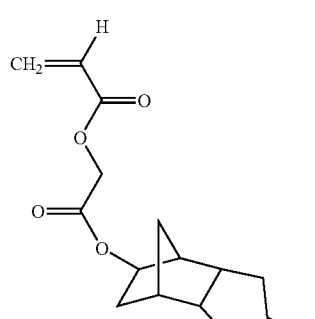
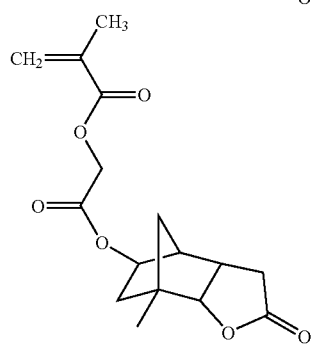
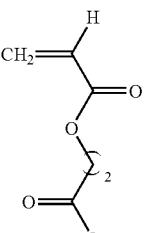
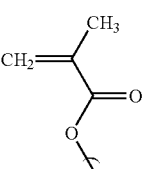
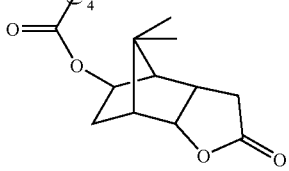
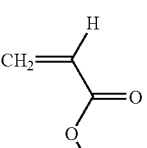
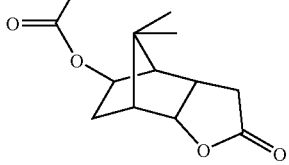
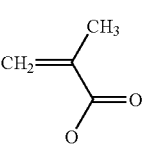
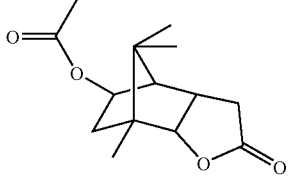

-continued

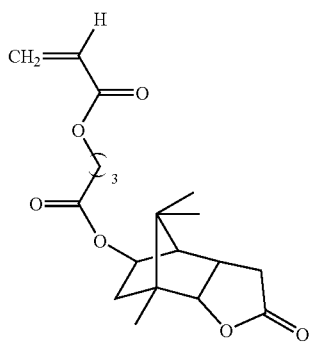

Specific examples of the monomer used to give the structural units represented by the formulae (IIIf) and (IIIl) include the followings:

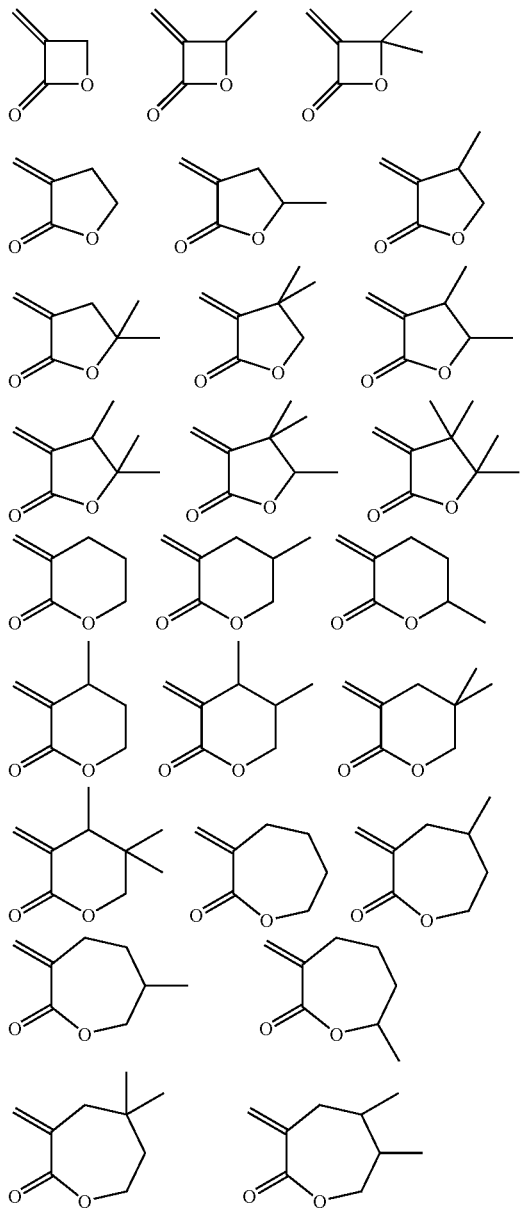

-continued

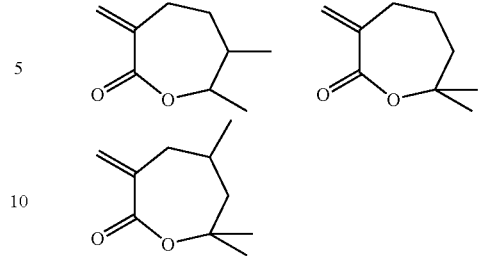

Among these monomers, the followings are preferable.

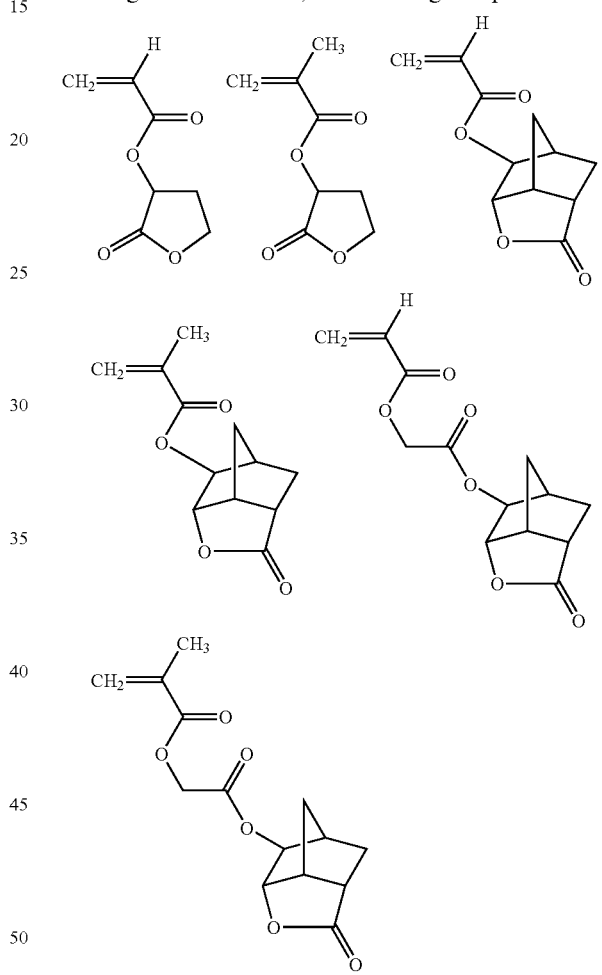

Among the above-mentioned monomers, acryloyloxy-γ-butyrolactone can be produced by reacting the corresponding α- or β-bromo-γ-butyrolactone with acrylic acid, or reacting the corresponding α- or β-hydroxy-γ-butyrolactone with an acryloyl halide, and methacryloyloxy-γ-butyrolactone can be produced by reacting the corresponding α- or β-bromo-γ-butyrolactone with methacrylic acid, or reacting the corresponding α- or β-hydroxy-γ-butyrolactone with a methacryloyl halide.

Among the above-mentioned monomers, examples of the monomer used to give the structural unit represented by the formulae (IIIb), (IIIc), (IIIh) and (IIIi) include an acrylate and methacrylate of the following alicyclic lactone having a hydroxyl group.

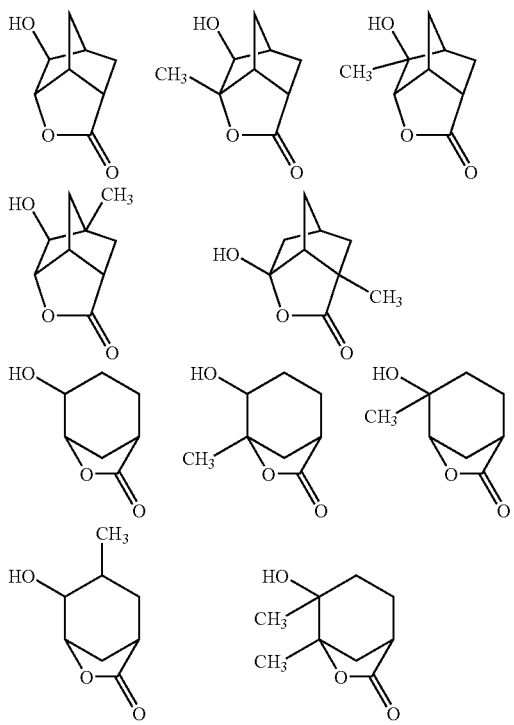

The above-mentioned acrylate and methacrylate of the alicyclic lactone having a hydroxyl group can be produced, for example, by reacting corresponding alicyclic lactone having a hydroxyl group with acryloyl halide or methacryloyl halide described in JP 2000-26446 A.

The structural unit (b2) has a fluorine-containing group. The structural unit (b2) may have two or more fluorine-containing groups.

Examples of the fluorine-containing group include an alkyl group which is substituted with at least one fluorine atom, an alkoxy group which is substituted with at least one fluorine atom and an alkoxycarbonyl group which is substituted with at least one fluorine atom and may be substituted with an alkyl group or an alkoxy group substituted with at least one fluorine atom.

The structural unit (b2) may also have one or more hydroxyl groups in addition to the fluorine-containing group.

As the structural unit (b2), a structural unit derived from an optionally substituted acrylic compound is preferable. Examples of the optionally substituted acrylic compound include those as same as described above.

Preferable examples of the structural unit (b2) include a structural unit represented by the formula (IV) (hereinafter, simply referred to as the structural unit (IV)).

In the structural unit (IV), $R^{25}$ represents a hydrogen atom or a methyl group, and AR represents a C1-C30 fluorine-containing alkyl group which may contain one to five hydroxyl groups and at least one heteroatom selected from a oxygen, nitrogen and sulfur atom.

Examples of the C1-C30 fluorine-containing alkyl group include a C1-C30 perfluoroalkyl group such as a trifluoromethyl, pentafluoroethyl, heptafluoropropyl and nonafluorobutyl group; a C1-C30 perfluoroalkoxyalkyl group such as a 1-trifluoromethoxyethyl and 1-pentafluoroethoxyethyl group; a C1-C30 perfluoroalkoxyperfuloroalkyl group such as a 1-trifluoromethoxydifluoroethyl and 1-pentafluoroethoxydifluoroethyl group; and the following:

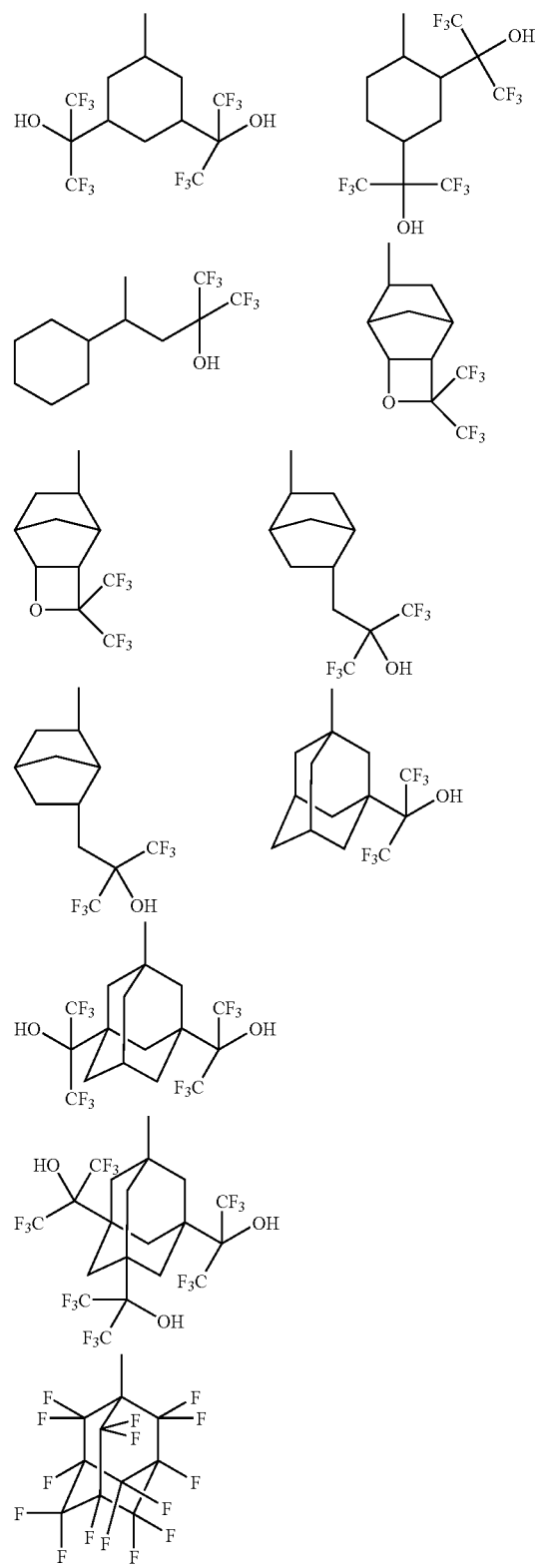

In the formulae above, straight line with an open end shows a bond extended from the adjacent oxygen group.

As the structural unit (IV), the structural unit derived from the following monomer is exemplified.

-continued
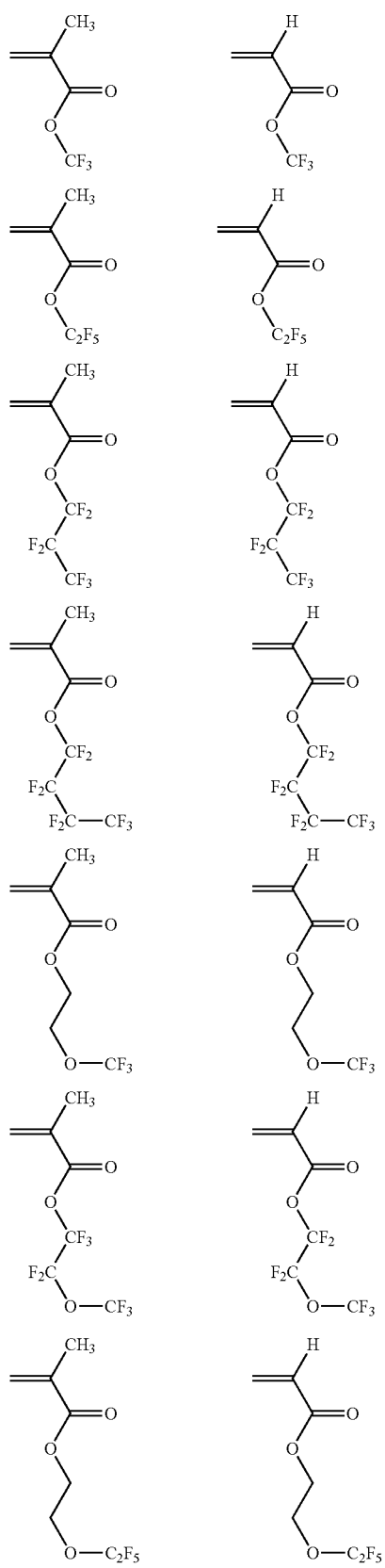
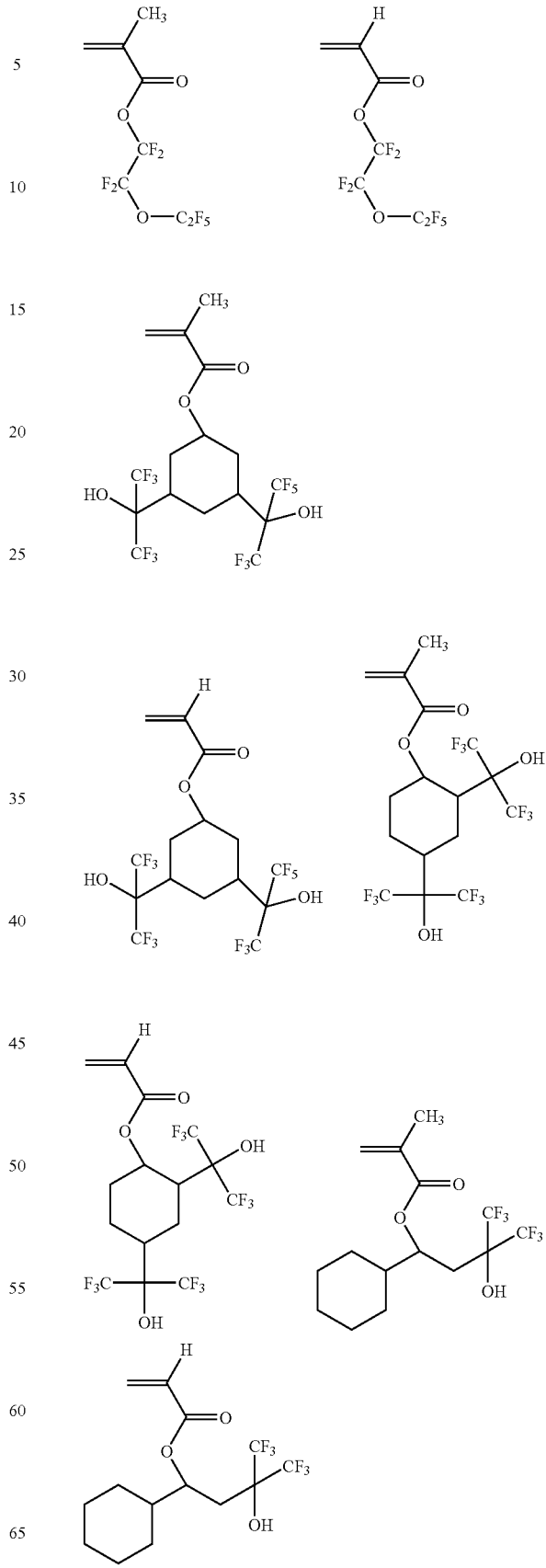

-continued
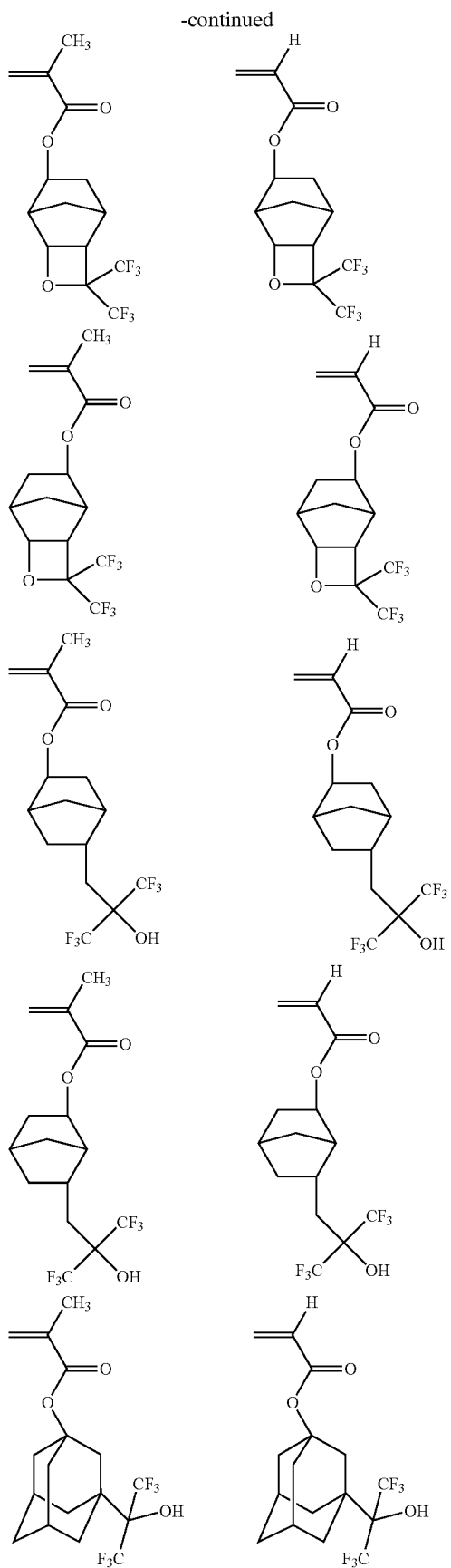
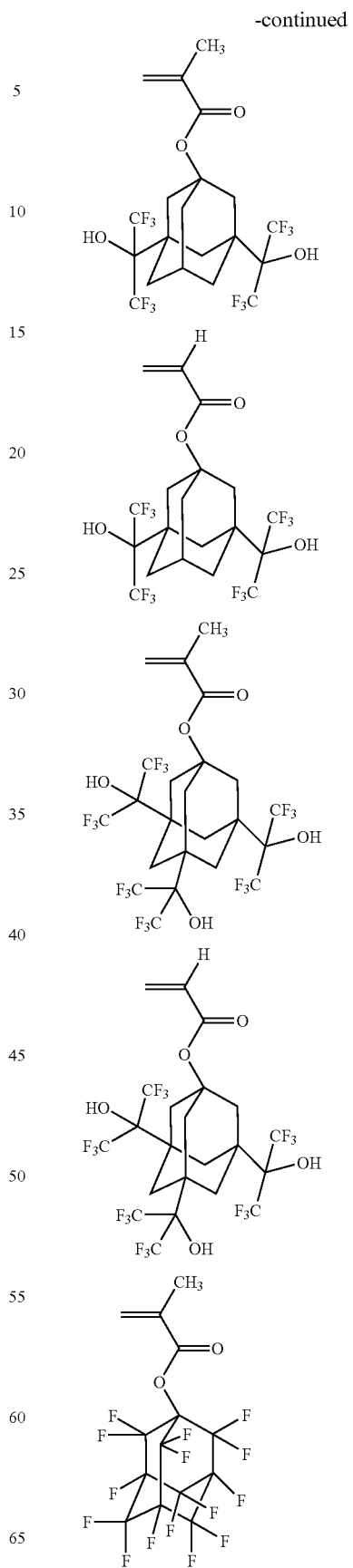

-continued

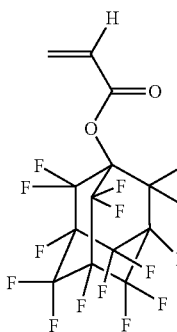

Among them, the structural units derived from the following monomers are preferable since excellent resolution is obtained when the resin containing the structural unit derived from such monomer is used in the present resist composition.

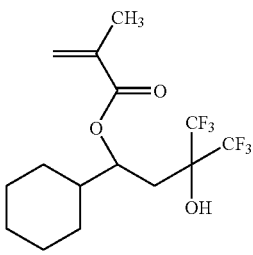

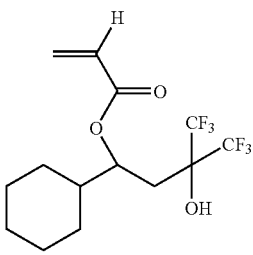

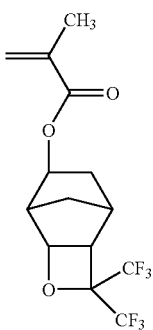 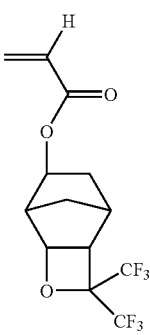

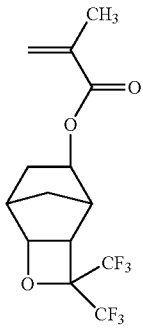 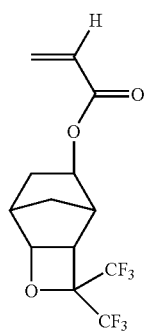

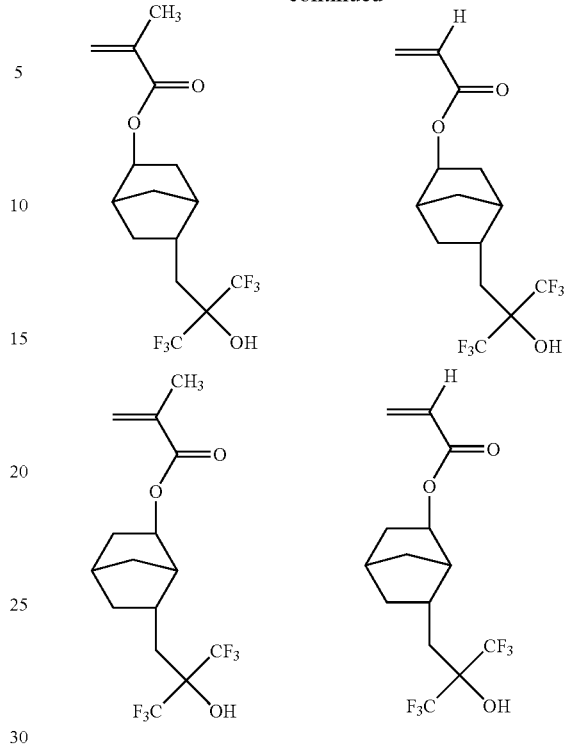

The resin (A) and (B) may contain the other structural unit or units in addition to the above-mentioned structural unit. The resin containing the structural unit derived from 2-norbornene shows strong structure because an alicyclic group is directly present on its main chain and shows a property that dry etching resistance is excellent.

The structural unit derived from 2-norbornene can be introduced into the main chain by radical polymerization using, for example, aliphatic unsaturated dicarboxylic anhydrides such as maleic anhydride and itaconic anhydride together in addition to 2-norbornene. The structural unit derived from 2-norbornene is formed by opening of its double bond, and can be represented by the formula (d):

(d)

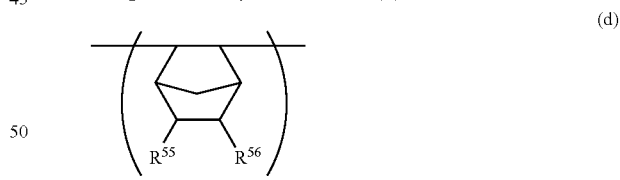

wherein, $R^{55}$ and $R^{56}$ each independently represents a hydrogen atom, a C1-C3 alkyl group, a C1-C3 hydroxyalkyl group, a carboxyl group, a cyano group or —COOU$^1$ group in which U$^1$ represents an alcohol residue, provided that the alcohol residue is not an acid-labile group, or $R^{55}$ and $R^{56}$ can be bonded together to form a carboxylic anhydride residue represented by —C(=O)OC(=O)—.

The structural unit derived from maleic anhydride and the structural unit derived from itaconic anhydride which are the structural unit derived from aliphatic unsaturated dicarboxylic anhydrides are formed by opening of their double bonds, and can be represented by the formula (e) and the formula (f), respectively.

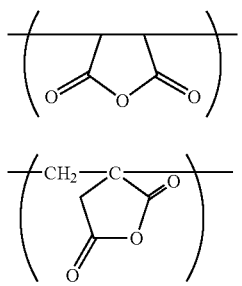

(e)

(f)

In $R^{55}$ and $R^{56}$, examples of the C1-C3 alkyl group include a methyl, ethyl, n-propyl and isopropyl group, and examples of the C1-C3 hydroxyalkyl group include a hydroxymethyl group and a 2-hydroxyethyl group.

In $R^{55}$ and $R^{56}$, —COOU$^1$ group is an ester formed from a carboxyl group, and as the alcohol residue corresponding to U$^1$, for example, optionally substituted primary or secondary alkyl groups having about 1 to 8 carbon atoms, 2-oxooxolan-3- or -4-yl and the like are exemplified, and as the substituent on the alkyl group, a hydroxyl group, an alicyclic hydrocarbon residues and the like are exemplified.

Specific examples of the monomer used to give the structural unit represented by the formula (d) include 2-norbornene, 2-hydroxy-5-norbornene, 5-norbornen-2-carboxylic acid, methyl 5-norbornen-2-carboxylate, 2-hydroxyethyl 5-norbornen-2-carboxylate, 5-norbornen-2-methanol, 5-norbornen-2,3-dicarboxylic acid anhydride, and the like.

A structural unit represented by the formula (g):

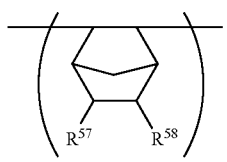

(g)

wherein, any of $R^{57}$ and $R^{58}$ represents —COOU$^2$ group in which U$^2$ represents an acid-labile group, and the other represents a hydrogen atom, a C1-C3 alkyl group, a C1-C3 hydroxyalkyl group, a carboxyl group, a cyano group or —COOU$^3$ group in which U$^3$ represents an alcohol residue, is a structural unit having acid-labile group even if it has norbornene structure, and the structural unit (a1) and (b1) also include the structural unit represented by the formula (g).

Examples of monomers giving the structural unit represented by the formula (g) include t-butyl 5-norbornen-2-cart) oxylate, 1-cyclohexyl-1-methylethyl 5-norbornen-2-carboxylate, 1-methylcyclohexyl 5-norbornen-2-carboxylate, 2-methyl-2-adamantyl 5-norbornen-2-carboxylate, 2-ethyl-2-adamantyl 5-norbornen-2-carboxylate, 1-(4-methylcyclohexyl)-1-methylethyl 5-norbornen-2-carboxylate, 1-(4-hydroxylcyclohexyl)-1-methylethyl 5-norbornen-2-carboxylate, 1-methyl-1-(4-oxocyclohexyl)ethyl 5-norbornen-2-carboxylate, 1-(1-adamantyl)-1-methylethyl 5-norbornen-2-carboxylate, and the like.

A structural unit represented by the formula (h):

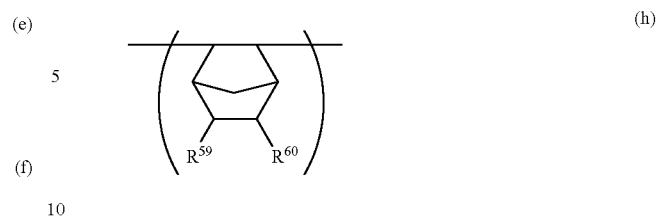

(h)

wherein, any of $R^{59}$ and $R^{60}$ represents a C1-C3 fluorine-containing alkyl group, a C1-C3 fluorine-containing hydroxyalkyl group or —COOU$^4$ group in which U$^4$ represents a fluorine-containing alcohol residue, provided that the fluorine-containing alcohol residue is not an acid-labile group, and the other represents a hydrogen atom, a C1-C3 alkyl group which may be substituted with at least one fluorine atom, a C1-C3 hydroxyalkyl group which may be substituted with at least one fluorine atom, a carboxyl group, a cyano group or —COOU$^5$ group in which U$^5$ represents an alcohol residue, provided that the alcohol residue is not an acid-labile group is a structural unit having a fluorine-containing group, and the structural unit (b2) also includes the structural unit represented by the formula (h).

As the resin (B), a resin of which Log P value is 2.10 or more is preferable. Here, the hydrophilicity/hydrophobicity parameter Log P of the resin means a common logarithm of a partition coefficient P of the resin and is a value representing how the resin is distributed at equilibrium in a two-phase system containing an oil (typically, 1-octanol) and water, which can be calculated by the following equation:

$$\text{Log } P = \text{Log}(C_{oil}/C_{water})$$

wherein $C_{oil}$ represents a mol concentration of the resin in oil phase and $C_{water}$ represents a mol concentration of the resin in water phase. Log P values may be empirically measured in a distribution experiment and calculated by using calculating software for estimating Log P value form structural formulae. In the present invention, Log P value of the monomer used to give the corresponding structural unit is calculated by using a Log P value estimating program incorporated into Chem Draw Ultra version 9.0.1 provided by CambridgeSoft Corporation and Log P value of the resin is calculated by the following equation:

Log $P$ value of the resin=Σ(each calculated Log $P$ value of the monomer used to give the corresponding structural unit in the resin×each content ratio of the corresponding structural unit in the resin).

The resin (A) generally contains the structural unit (a1) in a ratio of 10 to 80% by mole in all structural units of the resin (A) although the ratio varies depending on the kind of radiation for patterning exposure, the kind of the acid-labile group, and the like. When the resin (B) contains the structural unit (b1), the resin (B) generally contains the structural unit (b1) in a ratio of 10 to 80% by mole in all structural units of the resin (B) though the ratio varies depending on the kind of radiation for patterning exposure, the kind of the acid-labile group, and the like.

When the structural unit (a1) is particularly a structural unit derived from 2-alkyl-2-adamantyl acrylate, 2-alkyl-2-adamantyl methacrylate, 1-(1-adamantyl)-1-alkylalkyl acrylate or 1-(1-adamantyl)-1-alkylalkyl methacrylate, it is advantageous that the ratio of the structural units is 15% by mole or more in all structural units of the resin (A), and when the structural unit (b1) is particularly a structural unit derived from 2-alkyl-2-adamantyl acrylate, 2-alkyl-2-adamantyl methacrylate, 1-(1-adamantyl)-1-alkylalkyl acrylate or 1-(1-adamantyl)-1-alkylalkyl methacrylate, it is advantageous that the ratio of the structural units is 15% by mole or more in all structural units of the resin (B).

The resin (A) has usually a weight-average molecular weight of about 1000 to 500,000, preferably 4000 to 50,000 using polystyrene as a standard reference material. The resin (B) has usually a weight-average molecular weight of about 1000 to 500,000, preferably 4000 to 50,000 using polystyrene as a standard reference material.

The resin (A) and (B) can be produced, for example, by polymerizing the corresponding monomer or monomers. The resin (A) and (B) can be also produced by conducting oligomerization of the corresponding monomer or monomers followed by polymerizing the oligomer obtained.

For example, resin (A) containing the structural unit (Ia), the structural unit (IIa) and the structural unit represented by the formula (IIIh) respectively as the structural unit (a1), the structural unit (a3) and the structural unit (a4) can be produced, for example, by polymerizing a monomer used to give the structural unit (Ia), a monomer used to give the structural unit (IIa) and a monomer used to give the structural unit represented by the formula (IIIh).

For example, resin (B) containing the structural unit (Ia), the structural unit (IIb), the structural unit represented by the formula (IIIb) and the structural unit (IV) respectively as the structural unit (b1), the structural unit (b3), the structural unit (b4) and the structural unit (b2) can be produced, for example, by polymerizing a monomer used to give the structural unit (Ia), a monomer used to give the structural unit (IIb), a monomer used to give the structural unit represented by the formula (IIIb) and a monomer used to give the structural unit (IV).

The polymerization reaction is usually carried out in the presence of a radical initiator.

The radical initiator is not limited and examples thereof include an azo compound such as 2,2'-azobisisobutyronitrile, 2,2'-azobis (2-methylbutyronitrile), 1,1'-azobis(cyclohexane-1-carbonitrile), 2,2'-azobis(2,4-dimethylvaleronitrile), 2,2'-azobis (2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis (2,4-dimethylvaleronitrile) and dimethyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited. When the mixture of two kinds of radical initiators is used, preferred examples of the combination include a combination of 2,2'-azobisisobutyronitrile and 2,2'-azobis(2,4-dimethylvaleronitrile), a combination of 2,2'-azobis(2,4-dimethylvaleronitrile) and 2,2'-azobis(2-methylbutyronitrile), a combination of 2,2'-azobis(2,4-dimethylvaleronitrile) and 1,1'-azobis (cyclohexane-1-carbonitrile), and a combination of 2,2'-azobis (2,4-dimethylvaleronitrile) and dimethyl-2,2'-azobis(2-methylpropionate).

The amount of the radical initiator is preferably 1 to 20% by mole based on all monomer or oligomer molar amount.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran; a ketone solvent such as methyl isobutyl ketone; an alcohol solvent such as isopropyl alcohol; a cyclic ester solvent such as γ-butyrolactone; a glycol ether ester solvent such as propyleneglycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

When an alicyclic compound having an olefinic double bond and an aliphatic unsaturated dicarboxylic anhydride are used as monomers, it is preferable to use them in excess amount in view of a tendency that these are not easily polymerized.

After competition of the polymerization reaction, the resin produced can be isolated, for example, by adding a solvent in which the present resin is insoluble or poorly soluble to the reaction mixture obtained and filtering the precipitated resin. If necessary, the isolated resin may be purified, for example, by washing with a suitable solvent.

The present chemically amplified positive resist composition contains the acid generator. The acid generated by irradiation to the composition catalytically acts against acid-labile groups in the resin(A) and the resin (B) in the case that the resin (B) contains the structural unit (b1), cleaves the acid-labile-group, and the resin becomes soluble in an alkali aqueous solution.

The present resist composition usually includes 80 to 99.9% by weight of sum of the resin (A) and (B) and 0.1 to 20% by weight of the acid generator based on the total solid content of the present composition.

Specific examples of the acid generator include a salt represented by the formula (V) (hereinafter, simply referred to as the salt (V)).

As the salt (V), a salt represented by the formula (VI) (hereinafter, simply referred to as the salt (VI)) is preferable.

In the salt (V), $R^{26}$ represents a C1-C6 linear or branched chain hydrocarbon group or a C3-C30 monocyclic or bicyclic hydrocarbon group, and at least one hydrogen atom in the monocyclic or bicyclic hydrocarbon group may be replaced with a C1-C6 alkoxy, C1-C4 perfluoroalkyl, C1-C6 hydroxyalkyl, hydroxyl, cyano, carbonyl or ester group, or at least one —CH$_2$— in the monocyclic or bicyclic hydrocarbon group may be replaced with —CO— or —O—; A$^+$ represents an organic counter ion; $Y^1$ and $Y^2$ are the same or different and each independently represents a fluorine atom or a C1-C6 perfluoroalkyl group.

In the salt (VI), Q represents —CO— group or —C(OH)— group; ring X represents a C3-C30 monocyclic or polycyclic hydrocarbon group in which a hydrogen atom is replaced with a hydroxyl group at Q position when Q is —C(OH)— group or in which two hydrogen atoms are replaced with =O group at Q position when Q is —CO— group, and at least one hydrogen atom in the monocyclic or polycyclic hydrocarbon group may be replaced with a C1-C6 alkyl, a C1-C6 alkoxy, a C1-C4 perfluoroalkyl, a C1-C6 hydroxyalkyl, a hydroxyl or a cyano group; $Y^3$ and $Y^4$ each independently represent a fluorine atom or a C1-C6 perfluoroalkyl group, and $A'^+$ represents an organic counter ion.

Examples of the C1-C6 linear or branched chain hydrocarbon group include a methyl, ethyl, propyl, isopropyl, n-butyl, isobutyl, sec-butyl, tert-butyl, n-pentyl and n-hexyl group. Examples of the C1-C6 alkoxy group include a methoxy, ethoxy, propoxy, isopropoxy, n-butoxy, isobutoxy, sec-butoxy, tert-butoxy, n-pentyloxy and n-hexyloxy group.

Examples of the C1-C4 perfluoroalkyl group include a trifluoromethyl, pentafluoroethyl, heptafluoropropyl and nonafluorobutyl group. Examples of the C1-C6 hydroxyalkyl group include a hydroxymethyl, 2-hydroxyethyl, 3-hydroxypropyl and 4-hydroxybutyl group. Examples of the ester group include a methoxycarbonyl, ethoxycarbonyl and 2-oxotetrahydrofiiran-3-yl group. Examples of the C1-C6 perfluoroalkyl group include a trifluoromethyl, pentafluoroethyl, heptafluoropropyl, nonafluorobutyl, undecafluoropentyl and tridecafluorohexyl group.

Examples of the C3-C30 monocyclic or bicyclic hydrocarbon group of the ring X include a C4-C8 cycloalkyl ring, an adamantyl ring and a norbornane ring. Specific examples thereof include 2-oxocyclopentyl group, 2-oxocyclohexyl group, 3-oxocyclopentyl group, 3-oxocyclohexyl group, 4-oxocyclohexyl group, 2-hydroxycyclopentyl group, 2-hydroxycyclohexyl group, 3-hydroxycyclopentyl group, 3-hydroxycyclohexyl group, 4-hydroxycyclohexyl group, 4-oxo-2-adamantyl group, 3-hydroxy-1-adamantyl group, 4-hydroxy-1-adamantyl group, 5-oxonorbornan-2-yl group, 1,7,7-trimethyl-2-xonorbornan-2-yl group, 3,6,6-trimethyl-2-oxobicyclo[3.1.1]hept-3-yl group, 2-hydroxynorbornan-3-yl group, 1,7,7-trimethyl-2-hydroxynorbornan-3-yl group, 3,6,6-trimethyl-2-hydroxybicyclo[3.1.1]hept-3-yl group, and the like. In the formulae above, straight line with an open end shows a bond which is extended from an adjacent group.

When Q is —CO— group, the salt (VI) is a salt represented by the formula (VIa):

(VIa)

$$A'^+ \quad ^-O_3SCOO_2—C\begin{pmatrix}Y^3\\X\\Y^4\end{pmatrix}C=O$$

wherein ring X, $Y^3$, $Y^4$ and $A'^+$ are the same as defined above, and when Q is —C(OH)— group, the salt represented by the formula (VI) is a salt represented by the formula (VIb):

(VIb)

$$A'^+ \quad ^-O_3SCOO_2—C\begin{pmatrix}Y^3\\X\\Y^4\end{pmatrix}C-OH$$

wherein ring X, $Y^3$, $Y^4$ and $A'^+$ are the same as defined above.

Specific examples of the anion part of the salt (VI) include the followings:

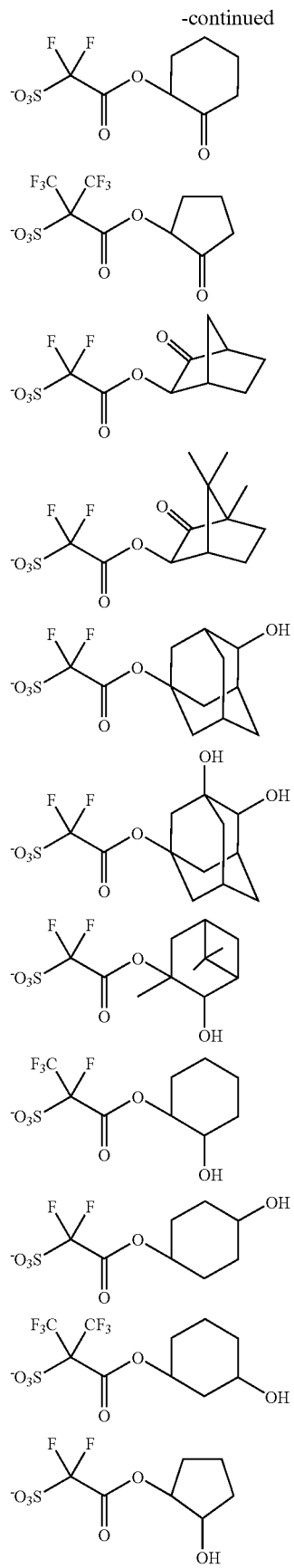

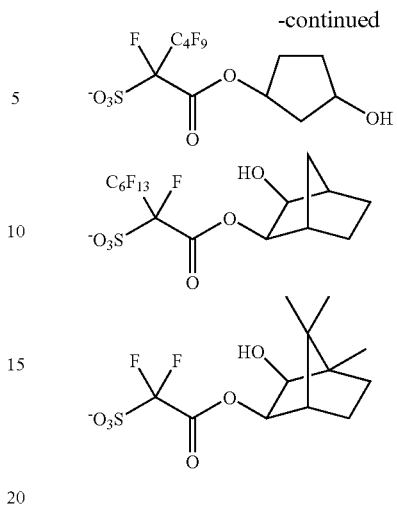

As the acid generator, a salt represented by the formula (VII) (hereinafter, simply referred to as the salt (VII)) is also exemplified.

In the salt (VII), $R^{27}$ represents a C1-C6 linear or branched chain perfluoroalkyl group and $A''^+$ represents an organic counter ion.

Examples of the C1-C6 linear or branched chain perfluoroalkyl group include a trifluoromethyl, pentafluoroethyl, heptafluoropropyl, nonafluorobutyl, undecafluoropentyl and tridecafluorohexyl group.

Specific examples of the anion part of the salt (VII) include a trifluoromethanesulfonate anion, a pentafluoroethanesulfonate anion, a heputafluoropropanesulfonate anion and a nonafluorobutanesulfonate anion.

Examples of the organic counter ion include a cation represented by the formula (IXz), a cation represented by the formula (Ixb), a cation represented by the formula (IXc), and a cation represented by the formula (IXd).

In the cation represented by the formula (IXz), $P^a$, $P^b$ and $P^c$ each independently represent a C1-C30 alkyl group which may be substituted with at least one selected from a hydroxyl group and a C1-C12 alkoxy group, or a C3-C30 cyclic hydrocarbon group which may be substituted with at least one selected from a hydroxyl group and a C1-C12 alkoxy group, Examples of the C1-C30 alkyl group in the formula (IXz) include a methyl, ethyl, propyl, isopropyl, n-butyl, isobutyl, sec-butyl, tert-butyl, n-pentyl, n-hexyl, n-octyl and 2-ethylhexyl group. Examples of the C1-C12 alkoxy group in the formula (IXz) include a methoxy, ethoxy, propoxy, isopropoxy, n-butoxy, isobutoxy, sec-butoxy, tert-butoxy, n-pentyloxy, n-hexyloxy, n-octyloxy and 2-ethylhexyloxy group. Examples of the C3-C30 cyclic hydrocarbon group include a cyclopentyl, cyclohexyl, 1-adamantyl, 2-adamantyl, bicyclohexyl, phenyl, 2-methylphenyl, 4-methylphenyl, 4-ethylphenyl, 4-isopropylphenyl, 4-tert-butylphenyl, 2,4-dimethylphenyl, 2,4,6-trimethylphenyl, 4-n-hexylphenyl, 4-n-octylphenyl, 1-naphthyl, 2-naphthyl, fluorenyl and biphenyl group.

In the formula (IXb), $P^4$ and $P^5$ each independently represent a hydrogen atom, a hydroxyl group, a C1-C12 alkyl group or a C1-C12 alkoxy group. Examples of the C1-C12 alkyl group in the formula (IXb) include a methyl, ethyl, propyl, isopropyl, n-butyl, isobutyl, sec-butyl, tert-butyl, n-pentyl, n-hexyl, n-octyl and 2-ethylhexyl group, and examples of the C1-C12 alkoxy group in the formula (IXb) include the same groups as mentioned in the above formula (IXz).

In the formula (IXc), $P^6$ and $P^7$ each independently represents a C1-C12 alkyl group or a C3-C12 cycloalkyl group, or $P^6$ and $P^7$ bond to form a C3-C12 divalent hydrocarbon group which forms a ring together with the adjacent $S^+$, and at least one —$CH_2$— in the divalent hydrocarbon group may be replaced with —CO—, —O— or —S—, $P^8$ represents a hydrogen atom, $P^9$ represents a C1-C12 alkyl group, a C3-C12 cycloalkyl group or an aromatic group optionally substituted, or $P^8$ and $P^9$ bond to form a divalent hydrocarbon group which forms a 2-oxocycloalkyl group together with the adjacent —CHCO—, and at least one —$CH_2$— in the divalent hydrocarbon group may be replaced with –CO—, —O— or —S—, Examples of the C1-C12 alkyl group in the formula (IXc) include the same groups as mentioned in the above formula (IXb) and examples of the C3-C12 cycloalkyl group in the formula (IXc) include a cyclopropyl, cyclobutyl, cyclopentyl, cyclohexyl, cycloheptyl, cyclooctyl and cyclodecyl group. Examples of the C3-C12 divalent hydrocarbon group formed by bonding $P^6$ and $P^7$ include a trimethylene, tetramethylene, pentamethylene group and examples of the ring group together with the adjacent $S^+$ and the divalent hydrocarbon group include a tetramethylenesulfonio, pentamethylenesulfonlo and oxybisethylenesulfonio group.

Examples of the aromatic group in the formula (IXc) include a phenyl, tolyl, xylyl and naphthyl group. Examples of the divalent hydrocarbon group formed by bonding $P^8$ and $P^9$ include a methylene, ethylene, trimethylene, tetramethylene and pentamethylene group and examples of the 2-oxocycloalkyl group formed by bonding $P^8$ and $P^9$ together with the adjacent —CHCO— include a 2-oxocyclopentyl and 2-oxocyclohexyl group.

In the formula (IXd), $P^{10}$ $P^{11}$ $P^{12}$ $P^{13}$ $P^{14}$ $P^{15}$ $P^{16}$ $P^{17}$ $P^{18}$ $P^{19}$ $P^{20}$ and $P^{21}$ each independently represent a hydrogen atom, a hydroxyl group, a C1-C12 alkyl group or a C1-C12 alkoxy group, B represents a sulfur or oxygen atom and r represents 0 or 1.

Examples of the C1-C12 alkyl group in the formula (IXd) include the same groups as mentioned in the above formula (IXb) and examples of the C1-C12 alkoxy groups in the formula (IXd) include the same groups as mentioned in the above formula (IXz).

Examples of the cation represented by the formula (IXz) include the followings:

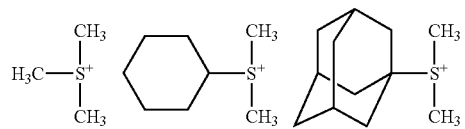

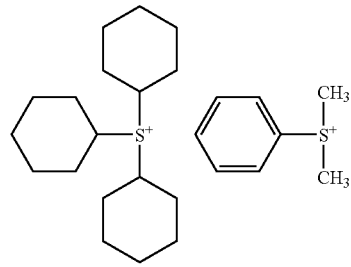

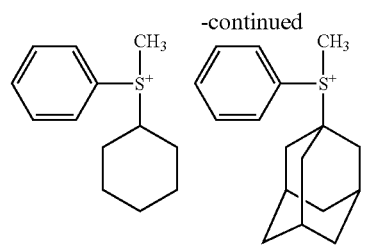

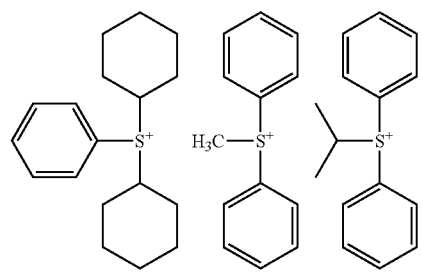

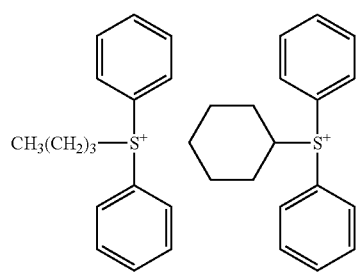

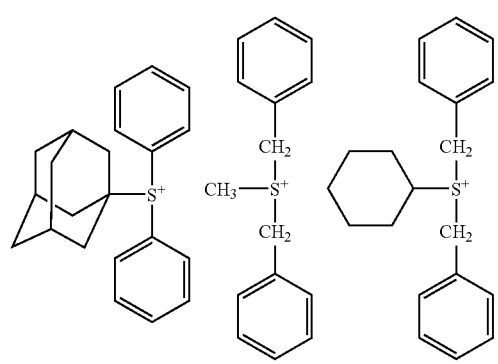

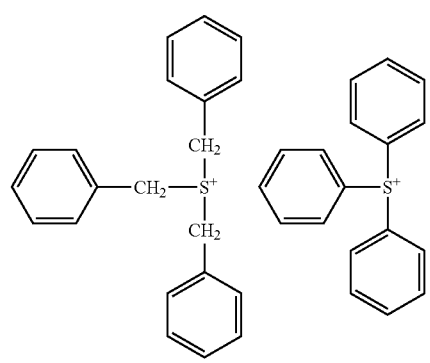

-continued
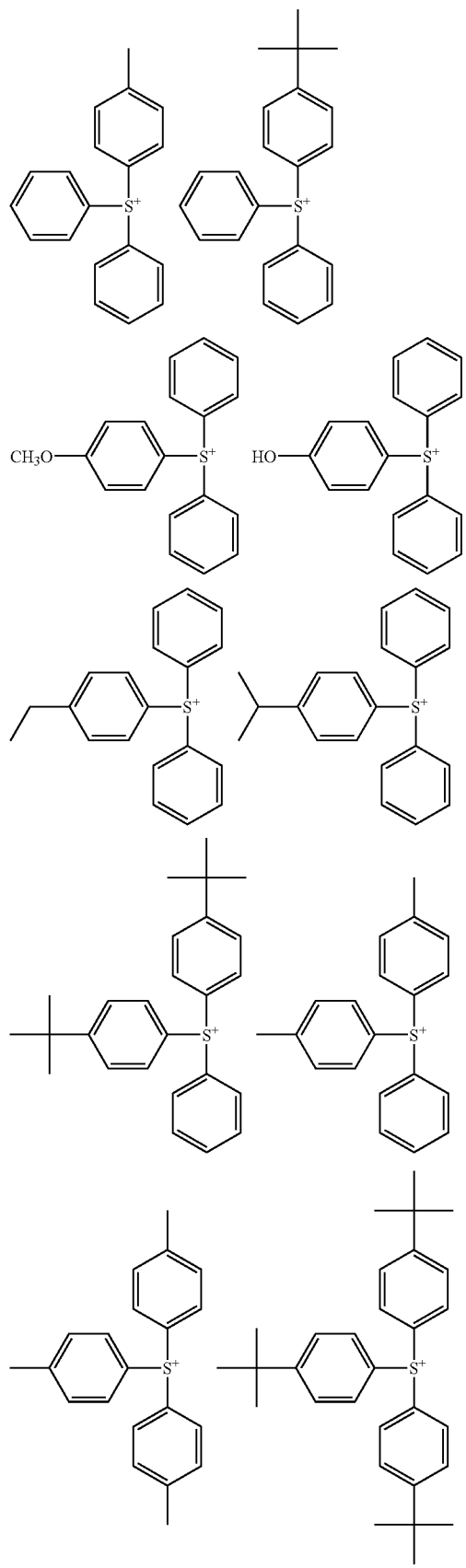
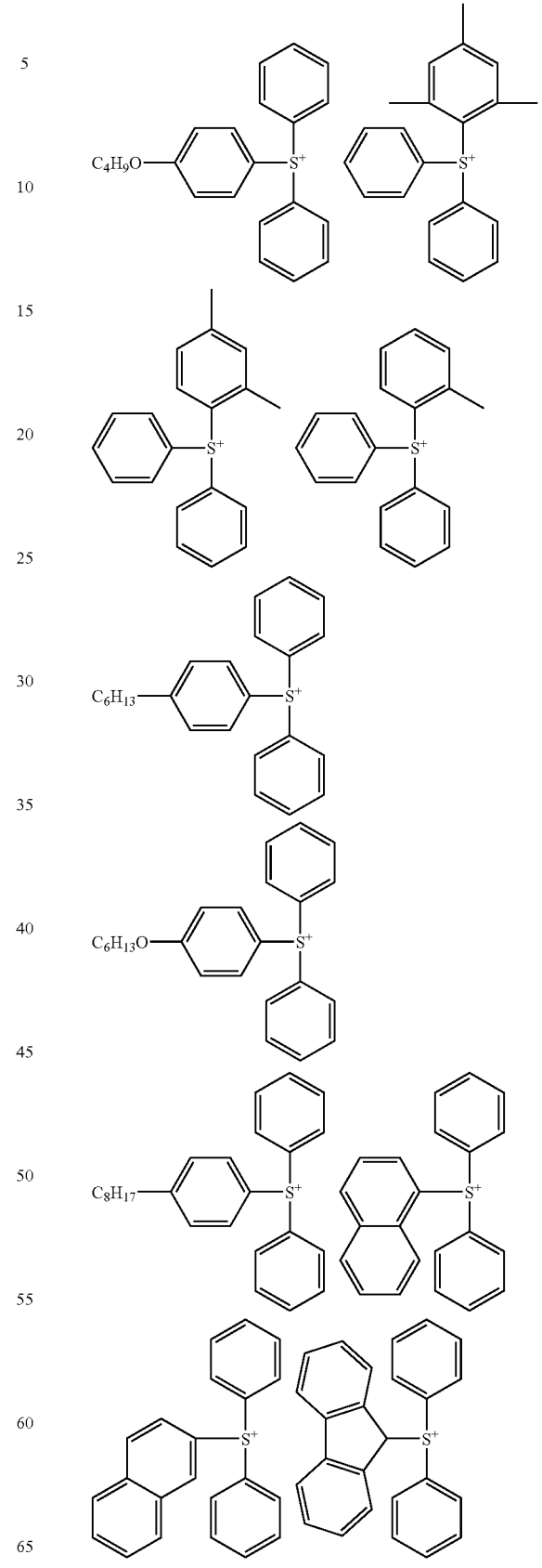

In the organic cation represented by the formula (IXz), a cation represented by the formula (IXa) is preferable and in the cation represented by the formula (IXa), a cation of the formula (IXe) is preferable.

In the formula (IXa), $P^1$, $P^2$ and $P^3$ each independently represent a hydrogen atom, a hydroxyl group, a C1-C12 alkyl group or a C1-C12 alkoxy group, and examples of the C1-C12 alkyl group include the same groups as mentioned in the above formula (IXb) and examples of the C1-C12 alkoxy group include the same groups as mentioned in the above formula (IXz).

In the formula (IXe), $P^{22}$, $P^{23}$ and $P^{24}$ each independently represents a hydrogen atom or a C1-C4 alkyl group, and examples of the C1-C4 alkyl group include a methyl, ethyl, propyl, isopropyl, n-butyl, isobutyl, sec-butyl and tert-butyl group.

Examples of the cation represented by the formula (IXb) include the followings:

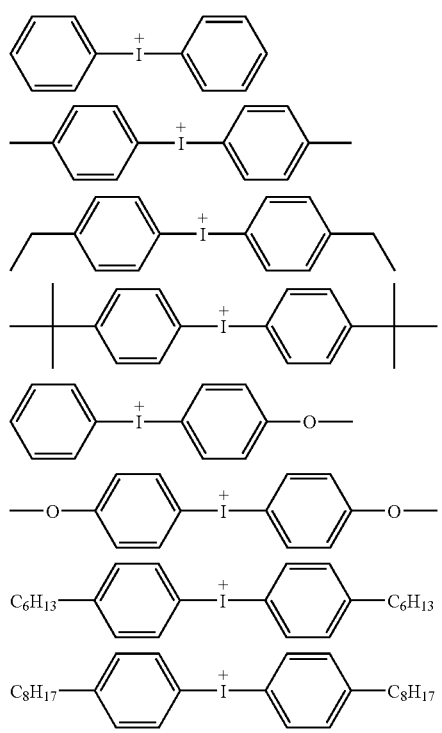

Examples of the cation represented by the formula (IXc) include the followings:

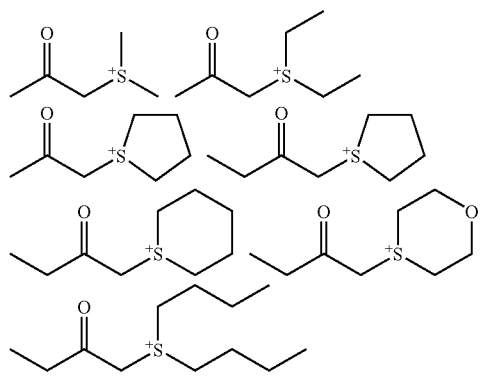

-continued

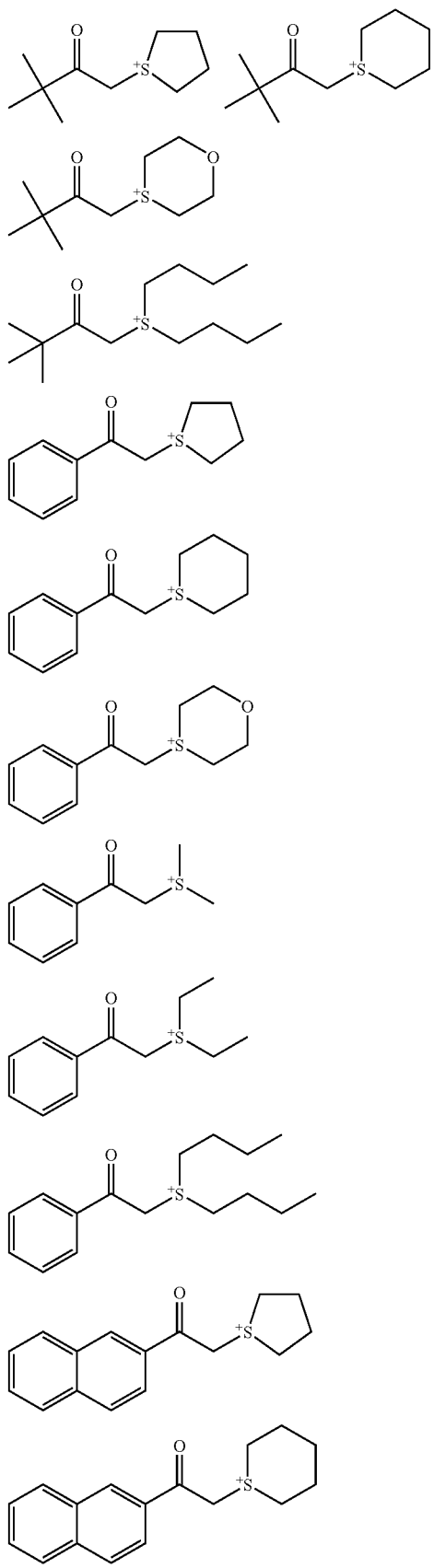

-continued
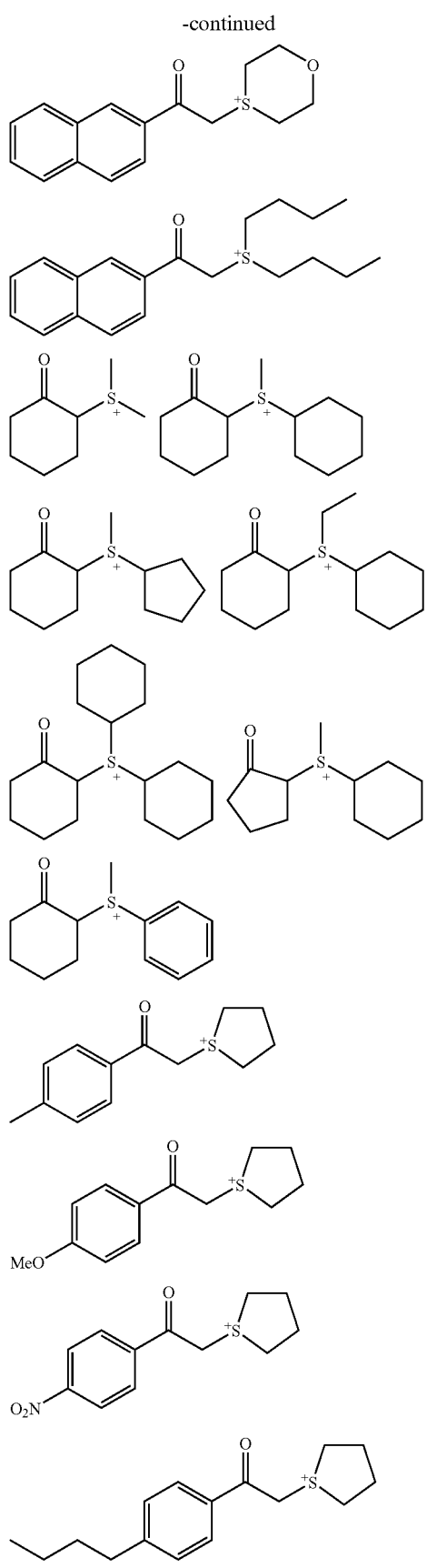
-continued
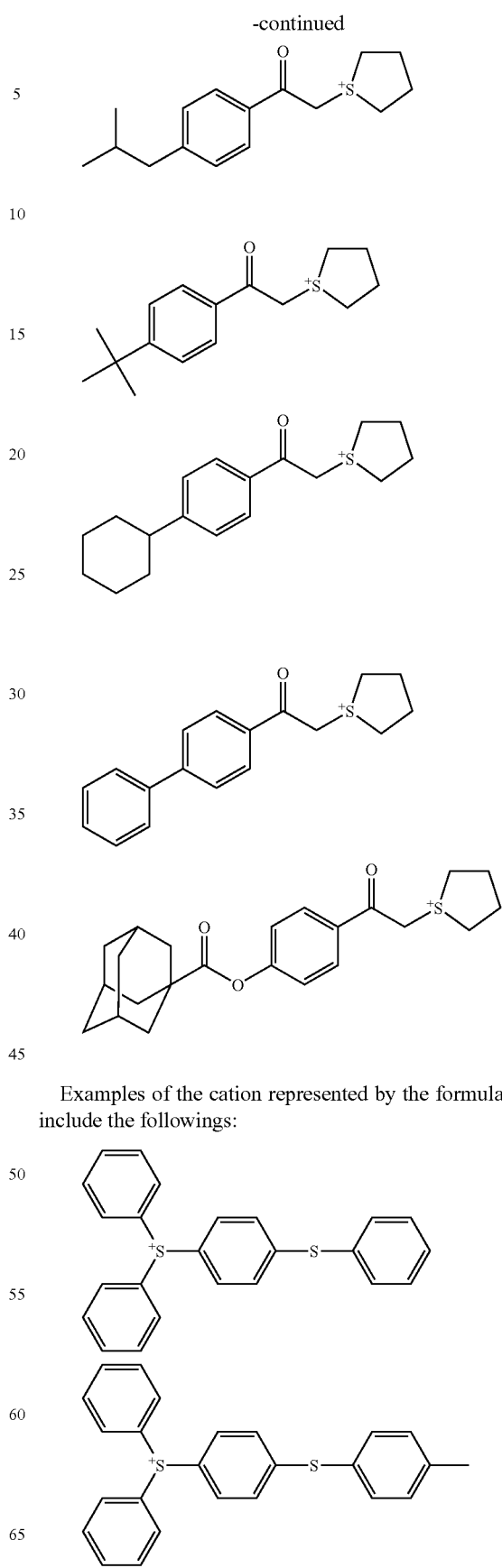
Examples of the cation represented by the formula (IXd) include the followings:

-continued
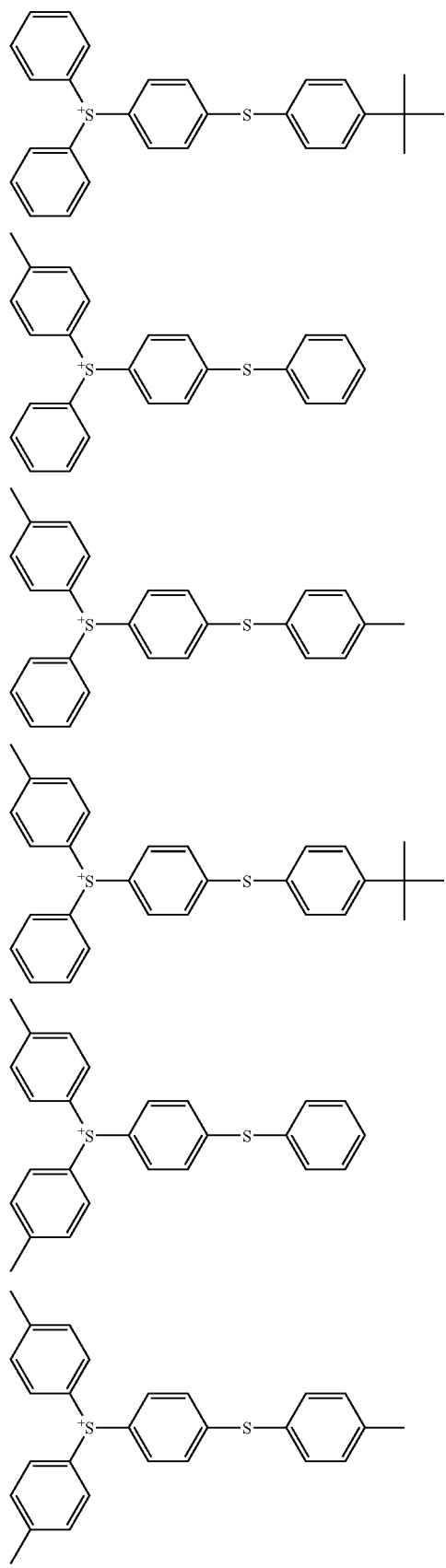
-continued
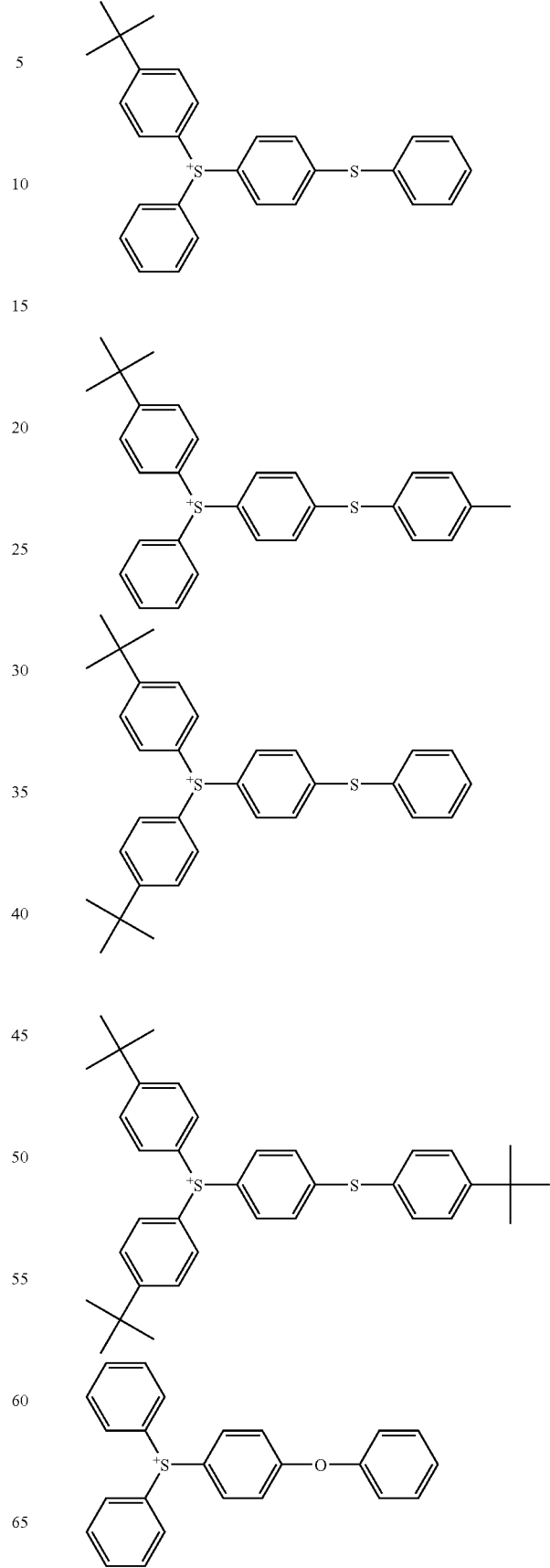

-continued
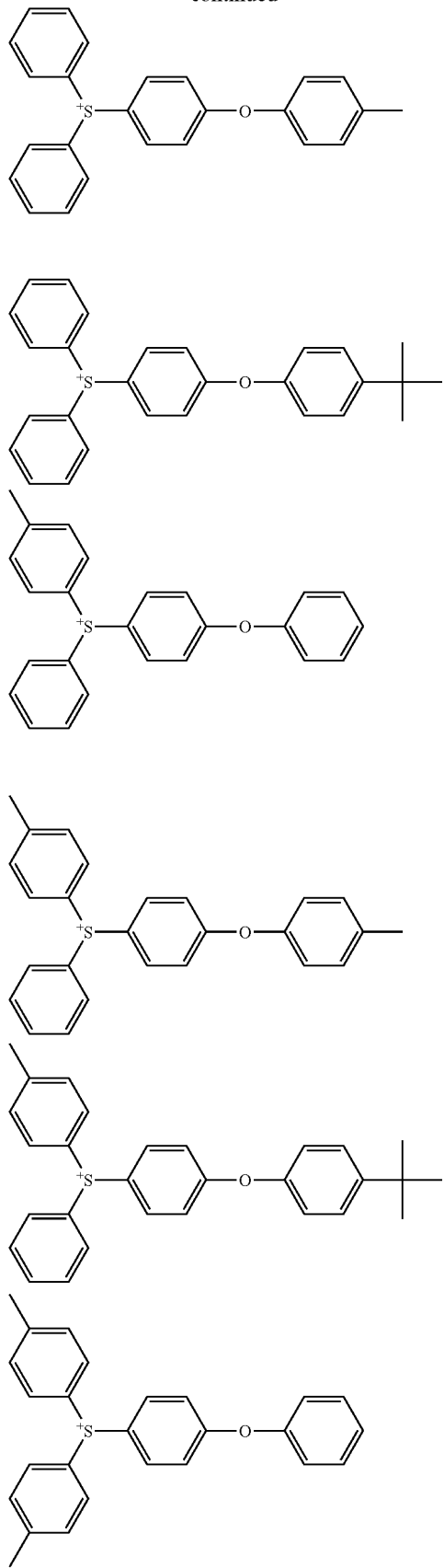
-continued
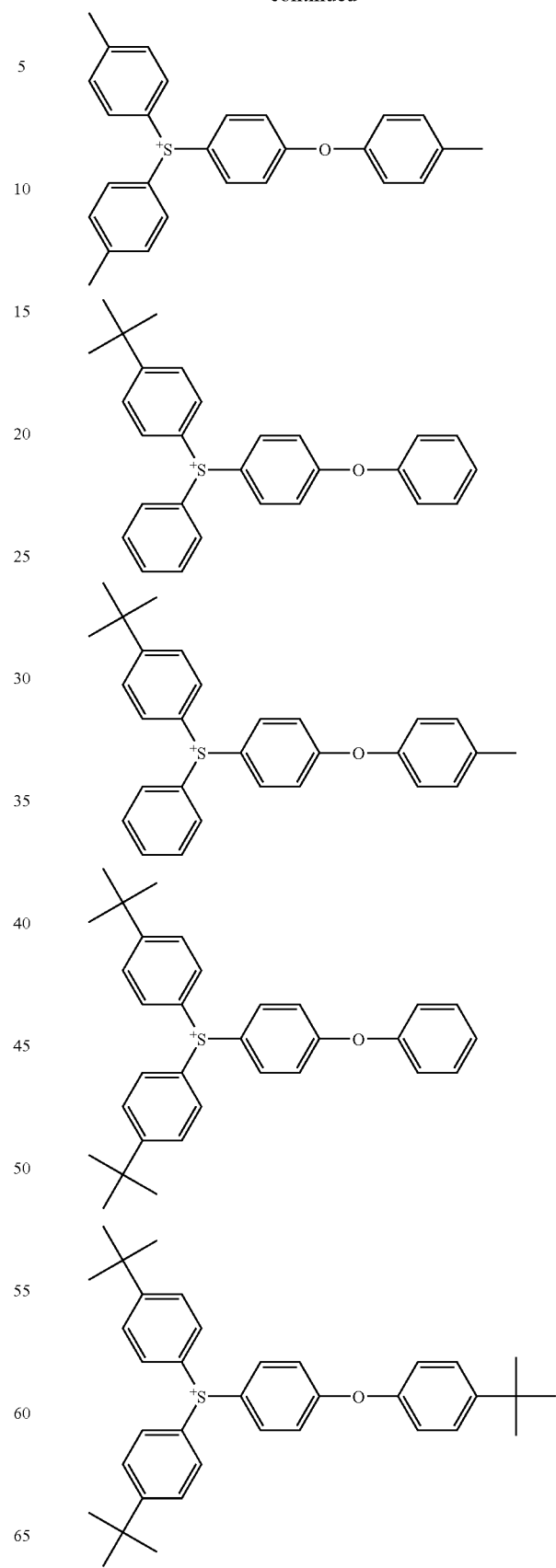

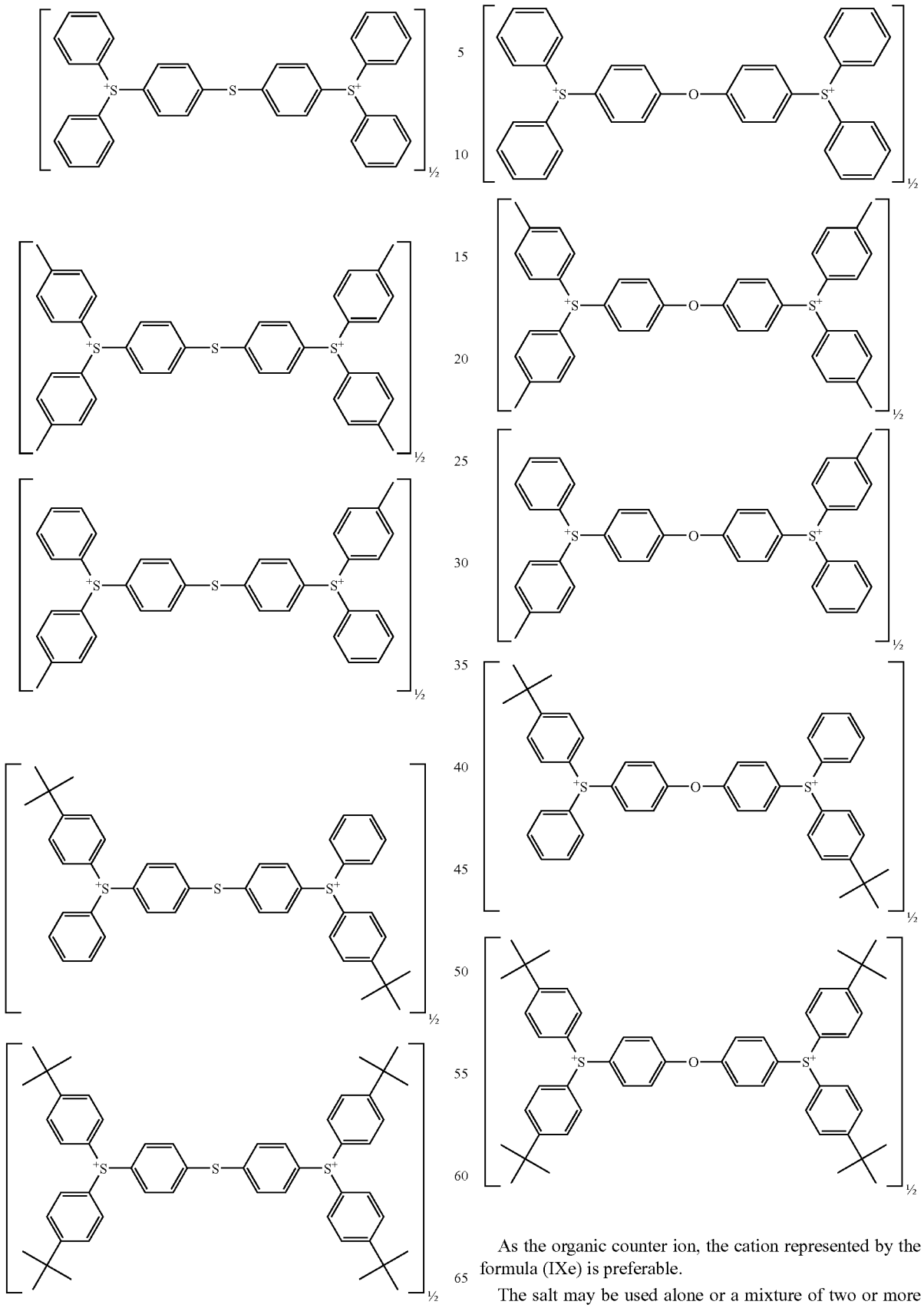
As the organic counter ion, the cation represented by the formula (IXe) is preferable.
The salt may be used alone or a mixture of two or more thereof may be used.

Examples of the acid generator include diphenyliodonium trifluoromethanesulfonate, 4-methoxyphenylphenyliodonium hexafluoroantimonate, 4-methoxyphenylphenyliodonium trifluoromethanesulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, bis(4-tert-butylphenyl)iodonium trifluoromethanesulfonate, triphenylsulfonium hexafluorophosphate, triphenylsulfonium hexafluoroantimonate, triphenylsulfonium adamantanemethoxycarbonyldifluoromethanesulfonate, triphenylsulfonium 1-(3-hydroxymethyladamantane) methoxycarbonyldifluoromethanesulfonate, triphenylsulfonium 1-(hexahydro-2-oxo-3,5-methano-2H-cyclopenta[b]furan-6-yloxycarbonyl)difluoromethanesulfonate, triphenylsulfonium 4-oxo-1-adamantyloxycarbonyldifluoromethanesulfonate, triphenylsulfonium 3-hydroxy-1-adamantylmethoxycarbonyldifluoromethanesulfonate, 4-methoxyphenyldiphenylsulfonium hexafluoroantimonate, 4-methoxyphenyldiphenylsulfonium trifluoromethanesulfonate, p-tolyldiphenylsulfonium trifluoromethanesulfonate, p-tolyldiphenylsulfonium heptadecafluorooctanesulfonate, 2,4,6-trimethylphenyldiphenylsulfonium trifluoromethanesulfonate, 4-tert-butylphenyldiphenylsulfonium trifluoromethanesulfonate, 4-phenylthiophenyldiphenylsulfonium hexafluorophosphate, 4-phenylthiophenyldiphenylsulfonium hexafluoroantimonate, 1-(2-naphthoylmethyl)thiolanium hexafluoroantimonate, 1-(2-naphthoylmethyl)thiolanium trifluoromethanesulfonate, 4-hydroxy-1-naphthyldimethylsulfonium hexafluoroantimonate and 4-hydroxy-1-naphthyldimethylsulfonium trifluoromethanesulfonate.

As the acid generator, a salt represented by the formula (Xa), (Xb) or (Xc) is preferred for the excellent resolution and pattern profile.

The salt (VI) can be produced by reacting a salt represented by the formula (1):

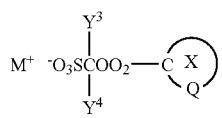

(1)

wherein Q, ring X, Y³ and Y⁴ are the same as defined above, and M represents Li, Na, K or Ag, with a compound represented by the formula (2):

A'⁺Z⁻ (2)

wherein Z represents F, Cl, Br, I, BF₄, AsF₆, SbF₆, PF₆ or ClO₄, and A'⁺ are the same as defined above, for example, in an inert solvent such as acetonitrile, water, methanol, dichloromethane, and the like, at a temperature of about 0 to 150° C., preferably of about 0 to 100° C., with stirring.

The amount of the compound represented by the formula (2) to be used is usually 0.5 to 2 moles per 1 mole of the salt represented by the formula (1). The salt (VI) obtained by the reaction above can be isolated by recrystallization, and can be purified by washing with water.

When Q is –CO—, the salt represented by the formula (1) is a salt represented by the formula (1a):

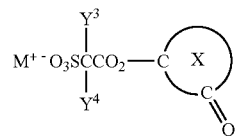

(Ia)

wherein Q, ring X, Y³, Y⁴ and M are the same as defined above, and when Q is —C(OH)—, the salt represented by the formula (1) is a salt represented by the formula (1b):

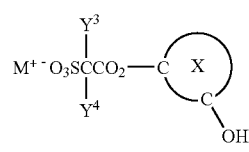

(Ib)

wherein Q, ring X, Y³, Y⁴ and M are the same as defined above.

The salt represented by the formula (1) used for the production of the salt (VI) can be produced, for example, by a process comprising esterifying an alcohol represented by the formula (3):

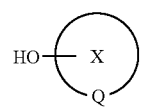

(3)

wherein X and Q are the same as defined above, with a carboxylic acid represented by the formula (4):

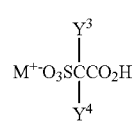

(4)

wherein Y³, Y⁴ and M are the same as defined above.

When Q is –CO—, the alcohol represented by the formula (3) is an alcohol represented by the formula (5):

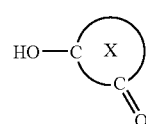

(5)

wherein ring X is the same as defined above, and when Q is —C(OH)—, the alcohol represented by the formula (3) is an alcohol of the formula (6):

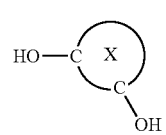

(6)

wherein ring X is the same as defined above.

The esterification reaction can generally be carried out by mixing materials in an aprotic solvent such as dichloroethane, toluene, ethylbenzene, monochlorobenzene, acetonitrile, N,N-dimethylformamide, and the like, at a temperature of about 20 to 200° C., preferably of about 50 to 150° C. In the esterification reaction, an acid catalyst or a dehydrating agent is usually added. Examples of the acid catalyst include organic acids such as p-toluenesulfonic acid, and inorganic acids such as sulfuric acid. Examples of the dehydrating agent include 1,1'-carbonyldiimidazole, N,N'-dicyclohexylcarbodiimide, and the like.

The esterification may be preferably carried out with dehydration, for example, by Dean and Stark method as the reaction time tends to be shortened.

The amount of the carboxylic acid represented by the formula (4) to be used is usually about 0.2 to 3 moles, preferably about 0.5 to 2 moles per 1 mole of the alcohol represented by the formula (3). The amount of the acid catalyst may be catalytic amount or the amount equivalent to solvent, and is usually 0.001 to 5 moles per 1 mole of the alcohol represented by the formula (3). The amount of the dehydrating agent is usually 0.2 to 5 moles, preferably 0.5 to 3 mole per 1 mole of the alcohol represented by the formula (3).

The salt represented by the formula (1) can be also produced by a process comprising esterifying the alcohol represented by the formula (3) with a carboxylic acid of the formula (7):

(7)

wherein $Y^3$, $Y^4$ and M are the same as defined above, then hydrolyzing the esterified compound with MOH, wherein M is the same as defined above.

The esterification reaction can be carried out in the same manner as in the esterification of the alcohol represented by the formula (3) with carboxylic acid represented by the formula (4).

The hydrolysis reaction can be usually carried out by stirring a mixture of the esterified compound obtained by the esterification reaction and MOH in a solvent. The solvent may be water or a mixed solvent of water and water-soluble solvent such as acetonitrile, tetrahydrofuran, and the like. The end point of the reaction can be determined, for example, by the analysis of $^{19}$FNMR.

The amount of the carboxylic acid represented by the formula (7) to be used is usually 0.2 to 3 moles, preferably 0.5 to 2 moles per 1 mole of the alcohol represented by the formula (3). The amount of the acid catalyst may be catalytic amount or the amount equivalent to solvent, and is usually 0.001 to 5 moles per 1 mole of the alcohol represented by the formula (3). The amount of the dehydrating agent is usually 0.2 to 5 moles, preferably 0.5 to 3 moles per 1 mole of the alcohol represented by the formula (3).

The amount of the MOH is usually 0.2 to 3 moles, preferably 1 to 2 moles per 1 mole of the esterified compound.

The salt represented by the formula (VIb) can also be produced by reducing the salt represented by the formula (VIa), and similarly the salt represented by the formula (1b) can also be produced by reducing the salt represented by the formula (1a).

The reduction reaction can be carried out by using reducing agents such as boron hydride compounds (e.g. sodium borohydride, zinc borohydride, lithium tri(sec-butyl)borohydride, borane, and the like), aluminum hydride compound (e.g. lithium tri(tert-butoxy) aluminum hydride, diisobutylaluminum hydride, and the like), organosilicon hydride compound (e.g. $Et_3SiH$, $Ph_2SiH_2$, and the like), and the like, in a solvent such as water, alcohol, acetonitrile, N,N-dimethylformamide, diglyme, tetrahydrofuran, diethyl ether, dichloromethane, 1,2-dimethoxyethane, benzene, and the like. The reduction reaction is usually carried out at a temperature of about −80 to +100° C., preferably of about −10 to +60° C. with stirring.

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

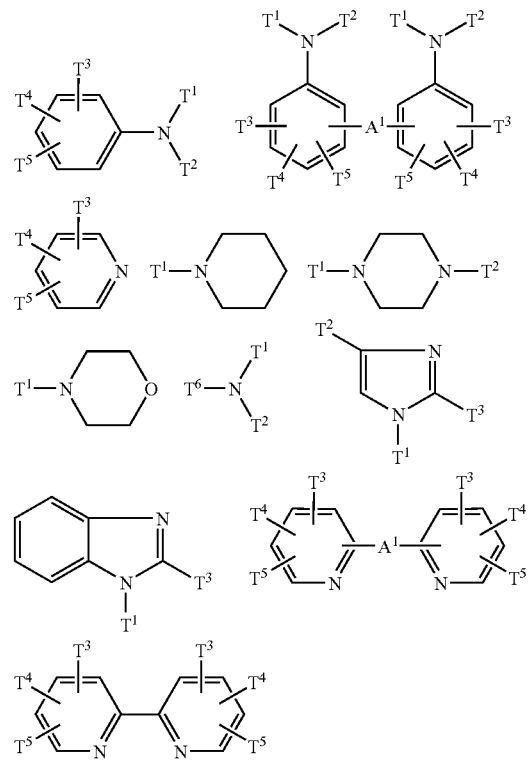

wherein $T^1$ and $T^2$ independently represent a hydrogen atom, an alkyl group, a cycloalkyl group or an aryl group, and the alkyl, cycloalkyl and aryl groups are optionally substituted with at least one group selected from a hydroxyl group, an amino group which is optionally substituted with a C1-C4 alkyl group and a C1-C6 alkoxy group which is optionally substituted with a C1-C6 alkoxy group, $T^3$ and $T^4$ independently represent a hydrogen atom, an alkyl group, a cycloalkyl group, an aryl group or an alkoxy group, and the alkyl, cycloalkyl, aryl and alkoxy groups are optionally substituted with at least one group selected from a hydroxyl group, an amino group which is optionally substituted with a C1-C4 alkyl group and a C1-C6 alkoxy group, or $T^3$ and $T^4$ bond together with the carbon atoms to which they bond to form an aromatic ring, $T^5$ represent a hydrogen atom, an alkyl group, a cycloalkyl group, an aryl group, an alkoxy group or a nitro group, and the alkyl, cycloalkyl, aryl and alkoxy groups are optionally substituted with at least one group selected from a hydroxyl group, an amino group which is optionally substituted with a C1-C4 alkyl group and a C1-C6 alkoxy group, $T^6$ represents an alkyl or cycloalkyl group, and the alkyl and cycloalkyl groups are optionally substituted with at least one group selected from a hydroxyl group, an amino group which is optionally substituted with a C1-C4 alkyl group and a C1-C6 alkoxy group, and $A^1$ represents —CO—, —NH—, —S—, —S—S—, an alkylene group of which at least one methylene group is optionally replaced with —O—, or an alkenylene group of which at least one methylene group is optionally replaced with —O—, and a quaternary ammonium hydroxide represented by the following formula:

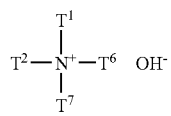

wherein $T^1$, $T^2$ and $T^6$ are the same as defined above, and $T^7$ represents a hydrogen atom, an alkyl group, a cycloalkyl group or an aryl group, and the alkyl and cycloalkyl groups are optionally substituted with at least one group selected from a hydroxyl group, an amino group which is optionally substituted with a C1-C4 alkyl group and a C1-C6 alkoxy group, and the aryl group is optionally substituted with at least one group selected from a hydroxyl group, an amino group which is optionally substituted with a C1-C4 alkyl group, a C1-C6 alkoxy group and a C1-C4 perfluoroalkyl group.

The alkyl group in $T^1$, $T^2$, $T^3$, $T^4$, $T^5$, $T^6$ and $T^7$ preferably has about 1 to 10 carbon atoms, and more preferably has about 1 to 6 carbon atoms.

Examples of the amino group which is optionally substituted with the C1-C4 alkyl group include an amino, methylamino, ethylamino, n-butylamino, dimethylamino and diethylamino group. Examples of the C1-C6 alkoxy group which is optionally substituted with the C1-C6 alkoxy group include a methoxy, ethoxy, n-propoxy, isopropoxy, n-butoxy, tert-butoxy, n-pentyloxy, n-hexyloxy and 2-methoxyethoxy group.

Specific examples of the alkyl group which is optionally substituted with at least one group selected from a hydroxyl group, an amino group which is optionally substituted with a C1-C4 alkyl group, and a C1-C6 alkoxy group which is optionally substituted with a C1-C6 alkoxy group include a methyl, ethyl, n-propyl, isopropyl, n-butyl, tert-butyl, n-pentyl, n-hexyl, n-octyl, n-nonyl, n-decyl, 2-(2-methoxyethoxy) ethyl, 2-hydroxyethyl, 2-hydroxypropyl, 2-aminoethyl, 4-aminobutyl and 6-aminohexyl group.

The cycloalkyl group in $T^1$, $T^2$, $T^3$, $T^4$, $T^5$, $T^6$ and $T^7$ preferably has about 5 to 10 carbon atoms. Specific examples of the cycloalkyl group which is optionally substituted with at least one group selected from a hydroxyl group, an amino group which is optionally substituted with a C1-C4 alkyl group and a C1-C6 alkoxy group include a cyclopentyl, cyclohexyl, cycloheptyl and cyclooctyl group.

The aryl group in $T^1$, $T^2$, $T^3$, $T^4$ and $T^5$ preferably has about 6 to 10 carbon atoms. Specific examples of the aryl group which is optionally substituted with at least one group selected from a hydroxyl group, an amino group which is optionally substituted with a C1-C4 alkyl group and a C1-C6 alkoxy group include a phenyl and naphthyl group.

The aryl group in $T^7$ preferably has about 6 to 10 carbon atoms. Specific examples of the aryl group which is optionally substituted with at least one group selected from a hydroxyl group, an amino group which is optionally substituted with a C1-C4 alkyl group, a C1-C6 alkoxy group and a C1-C4 perfluoroalkyl group include a phenyl, naphthyl and 3-trifluoromethylphenyl group.

The alkoxy group in $T^3$, $T^4$ and $T^5$ preferably has about 1 to 6 carbon atoms and specific examples thereof include a methoxy, ethoxy, n-propoxy, isopropoxy, n-butoxy, tert-butoxy, n-pentyloxy, n-hexyloxy group.

The alkylene and alkenylene groups in $A^1$ preferably have 2 to 6 carbon atoms. Specific examples of the alkylene group include an ethylene, trimethylene, tetramethylene, methylenedioxy and ethylene-1,2-dioxy group, and specific examples of the alkenylene group include an ethane-1,2-diyl, 1-propene-1,3-diyl and 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1, 2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris [2-(2-methoxyethoxy) ethyl] amine, triisopuropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl) ethane, 1,2-di(4-pyridyl) ethane, 1,3-di(4-pyridyl)propane, 1, 2-bis (2-pyridyl) ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl) ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl) trimethylammonium hydroxide and (2-hydroxyethyl) trimethylammonium hydroxide (so-called "choline").

A hindered amine compound having a piperidine skeleton as disclosed in JP 11-52575 A1 can be also used as the quencher.

In the point of forming patterns having higher resolution, the quaternary ammonium hydroxide is preferably used as the quencher.

The present resist composition preferably includes 0.01 to 1% by weight of the quencher based on the total solid content of the present composition. In the present invention, the total solid content means total content exclusive of solvents.

The present resist composition can contain, if necessary, a small amount of various additives such as a sensitizer, a solution suppressing agent, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl) trimethylammonium hydroxide (commonly known as "choline") is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The present invention will be described more specifically by Examples, which are not construed to limit the scope of the present invention. The "%" and "part(s)" used to represent the content of any component and the amount of any material to be used in the following Examples are on a weight basis unless otherwise specifically noted. The weight-average molecular weight of any material in the following Examples is a value found by gel permeation chromatography [Column (Total 3 Columns): TSKgel Multipore $H_{XL}$-M manufactured by TOSOH CORPORATION, and Solvent: tetrahydrofuran, Flow rate: 1.0 mm/min., Detector: R1 Detector, Column Temperature: 40° C., Injection volume: 100 μl] using polystyrene manufactured by TOSOH CORPORATION as a standard reference material.

Monomers used in Examples are following monomers A to J.

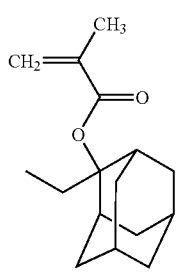

A

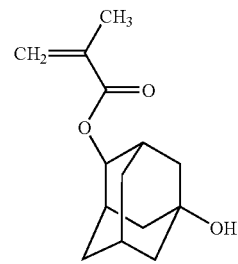

B

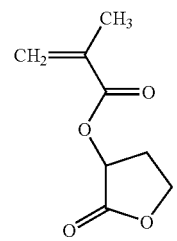

C

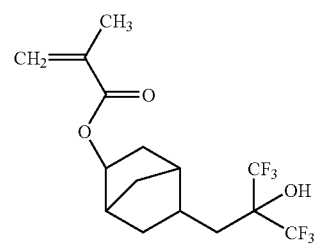

D

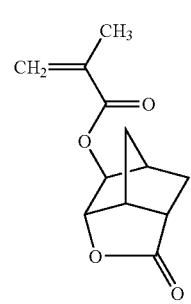

E

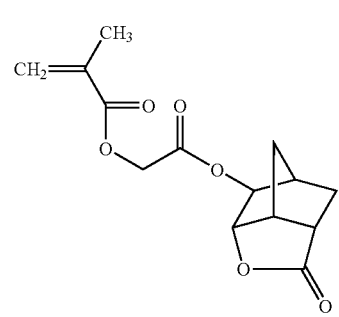

F

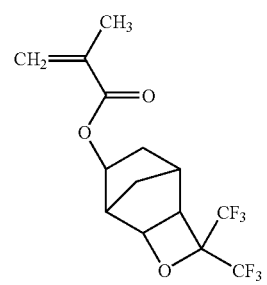

G

-continued

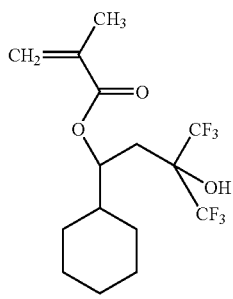

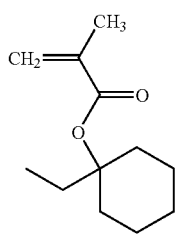

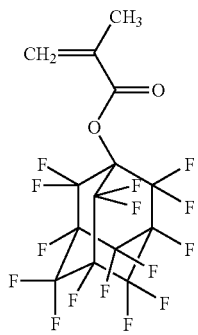

Acid generators, quenchers and solvents used in Examples are followings.

<Acid Generator>

Acid Generator P1: Triphenylsulfonium Perfuluorobutanesulfonate

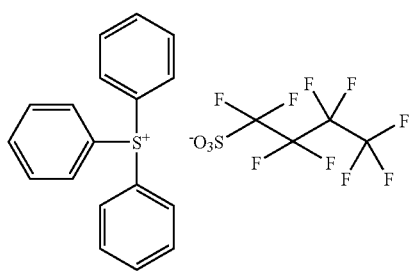

Acid Generator P2: Triphenylsulfonium 4-oxo-1-Adamantyloxycarbonyldifluoromethanesulfonate

| <Quencher> | |
|---|---|
| Quencher Q1: | tri-n-octylamine |
| Quencher Q2: | 2,6-diisopropylaniline |

| <Solvent> | | |
|---|---|---|
| Solvent S1: | propylene glycol monomethyl ether acetate | 200 parts |
| | propylene glycol monomethyl ether | 20.0 parts |
| Solvent S2: | propylene glycol monomethyl ether acetate | 100 parts |
| | 2-heptanone | 20.0 parts |
| | propylene glycol monomethyl ether | 20.0 parts |
| | γ-butyrolactone | 3.5 parts |
| Solvent S3: | propylene glycol monomethyl ether acetate | 140 parts |
| | 2-heptanone | 35.0 parts |
| | propylene glycol monomethyl ether | 20.0 parts |
| | γ-butyrolactone | 3.0 parts |

| <Evaluation condition> | | |
|---|---|---|
| H1: | Evaluation film thickness | 150 nm |
| | Exposure condition | NA = 0.75, ⅔ Annular |
| H2: | Evaluation film thickness | 150 nm |
| | Exposure condition | NA = 0.75, ¾ Annular |
| H3: | Evaluation film thickness | 120 nm |
| | Exposure condition | NA = 0.75, ¾ Annular |

Resin Synthesis Example 1

Synthesis of Resin A1

30.00 parts of monomer A, 14.27 parts of monomer B, and 10.28 parts of monomer C were dissolved in 2.6 times amount of methyl isobutyl ketone as much as the amount of all monomers to be used (monomer ratio; monomer A: monomer B: monomer C=50:25:25). To the solution, 2,2'-azobisisobutyronitrile was added as an initiator in a ratio of 2 mol % based on all monomer molar amount, and the resultant mixture was heated at 87° C. for about 6 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 9,400 was obtained in a yield of 47%. This copolymer had the following structural units. This is called as resin A1.

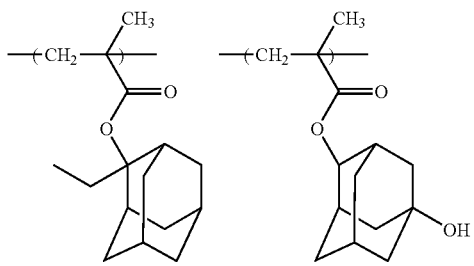

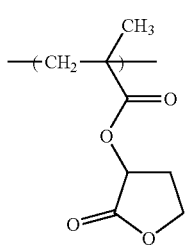

Resin Synthesis Example 2

Synthesis of Resin A2

23.00 parts of monomer A, 5.47 parts of monomer B, 7.88 parts of monomer C and 5.14 parts of monomer E were dissolved in 2.6 times amount of 1,4-dioxane as much as the amount of all monomers to be used (monomer ratio; monomer A: monomer B: monomer C: monomer E=50:12.5:25:12.5). To the solution, 2,2'-azobisisobutyronitrile was added as an initiator in a ratio of 3 mol % based on all monomer molar amount, and the resultant mixture was heated at 87° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,200 was obtained in a yield of 58%. This copolymer had the following structural units. This is called as resin A2.

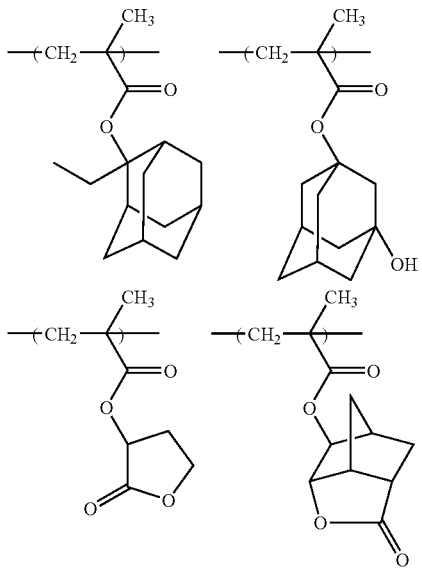

Resin Synthesis Example 3

Synthesis of resin A3

13.50 parts of monomer A, 3.53 parts of monomer B, and 18.66 parts of monomer F were dissolved in 1.5 times amount of 1,4-dioxane as much as the amount of all monomers to be used (monomer ratio; monomer A: monomer B: monomer F=40:11:49). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 74° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,300 was obtained in a yield of 85%. This copolymer had the following structural units. This is called as resin A3.

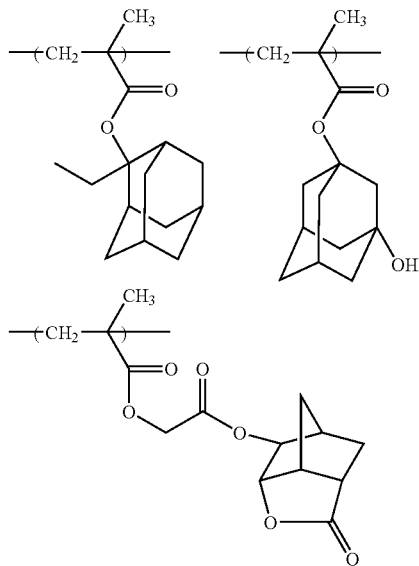

Resin Synthesis Example 4

Synthesis of Resin B1

25.00 parts of monomer A, 11.89 parts of monomer B, and 18.13 parts of monomer D were dissolved in 2.6 times amount of 1,4-dioxane as much as the amount of all monomers to be used (monomer ratio; monomer A: monomer B: monomer D=50:25:25). To the solution, 2,2'-azobisisobutyronitrile was added as an initiator in a ratio of 3 mol % based on all monomer molar amount, and the resultant mixture was heated at 87° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,900 was obtained in a yield of 62%. This copolymer had the following structural units. This is called as resin B1.

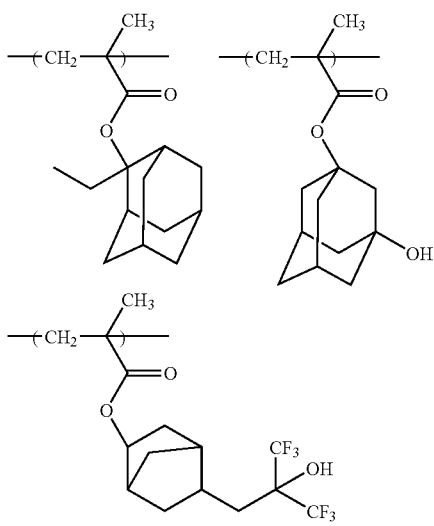

Resin Synthesis Example 5

Synthesis of Resin B2

11.20 parts of monomer A and 15.52 parts of monomer G were dissolved in 1.5 times amount of 1,4-dioxane as much as the amount of all monomers to be used (monomer ratio; monomer A: monomer G=50:50). To the solution, 2,2'-azobisisobutyronitrile and 2,2'-azobis (2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,200 was obtained in a yield of 72%. This copolymer had the following structural units. This is called as resin B2.

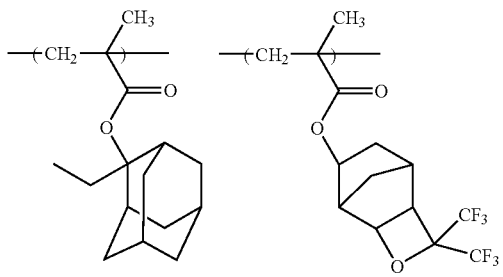

Resin Synthesis Example 6

Synthesis of Resin B3

12.05 parts of monomer A, 4.59 parts of monomer B and 10.02 parts of monomer G were dissolved in 1.5 times amount of 1,4-dioxane as much as the amount of all monomers to be used (monomer ratio; monomer A: monomer B: monomer G=50:20:30). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,000 was obtained in a yield of 75%. This copolymer had the following structural units. This is called as resin B3.

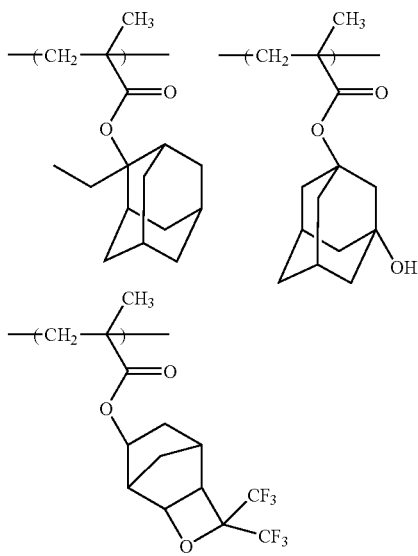

Resin Synthesis Example 7

Synthesis of Resin B4

12.55 parts of monomer A, 7.16 parts of monomer B and 6.96 parts of monomer G were dissolved in 1.5 times amount of 1,4-dioxane as much as the amount of all monomers to be used (monomer ratio; monomer A: monomer B: monomer G=50:30:20). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 7,900 was obtained in a yield of 68%. This copolymer had the following structural units. This is called as resin B4.

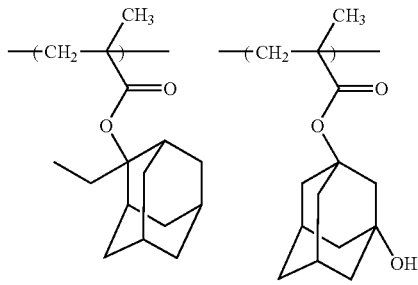

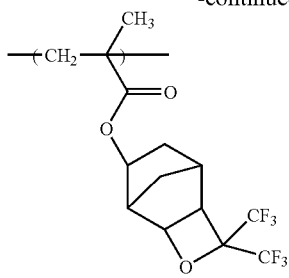

Resin Synthesis Example 8

Synthesis of Resin B5

12.40 parts of monomer A, 7.08 parts of monomer B and 7.20 parts of monomer D were dissolved in 1.5 times amount of 1,4-dioxane as much as the amount of all monomers to be used (monomer ratio; monomer A: monomer B: monomer D=50:30:20). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,900 was obtained in a yield of 68%. This copolymer had the following structural units. This is called as resin B5.

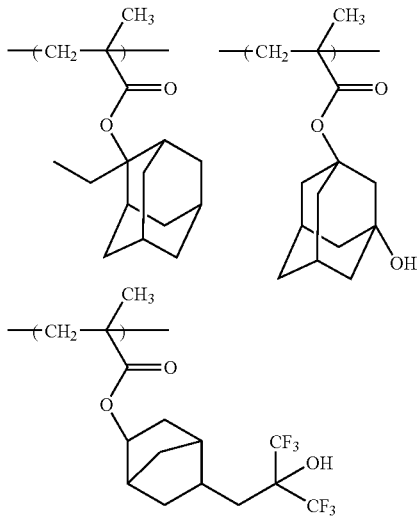

Resin Synthesis Example 9

Synthesis of Resin B6

12.40 parts of monomer A, 7.08 parts of monomer B and 7.24 parts of monomer H were dissolved in 1.5 times amount of 1,4-dioxane as much as the amount of all monomers to be used (monomer ratio; monomer A: monomer B: monomer D=50:30:20). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 7,900 was obtained in a yield of 68%. This copolymer had the following structural units. This is called as resin B6.

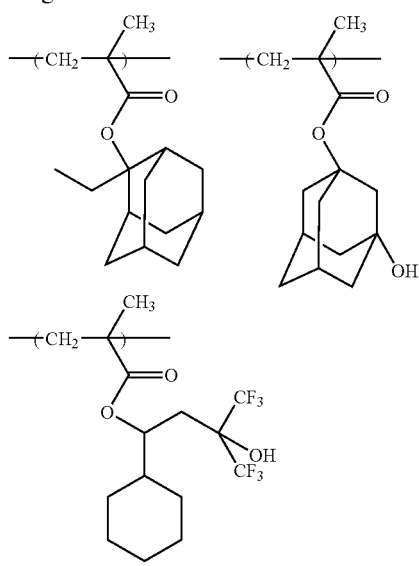

Resin Synthesis Example 10

Synthesis of Resin B7

10.85 parts of monomer B and 15.81 parts of monomer G were dissolved in 1.5 times amount of 1,4-dioxane as much as the amount of all monomers to be used (monomer ratio; monomer B: monomer G=50:50). To the solution, 2,2'-azobisisobutyronitrile and 2,2'-azobis (2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 16,500 was obtained in a yield of 68%. This copolymer had the following structural units. This is called as resin B7.

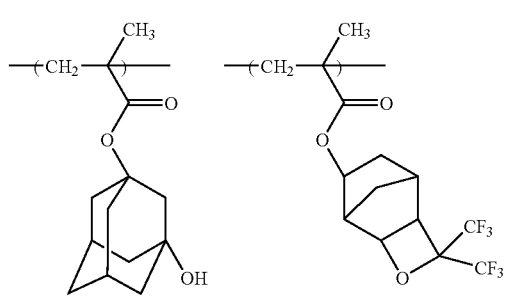

Resin Synthesis Example 11

Synthesis of Resin B8

14.50 parts of monomer A, 1.47 parts of monomer B, 17.90 parts of monomer D and 2.79 parts of monomer F were dissolved in 1.5 times amount of 1,4-dioxane as much as the amount of all monomers to be used (monomer ratio; monomer A: monomer B: monomer D: monomer F=47:5:40:8). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 73° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 10,900 was obtained in a yield of 75%. This copolymer had the following structural units. This is called as resin B8.

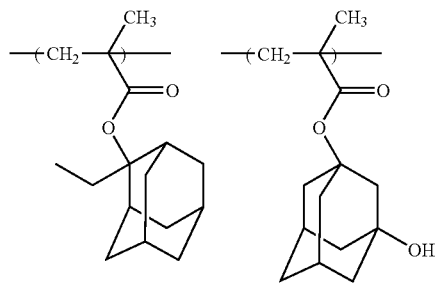

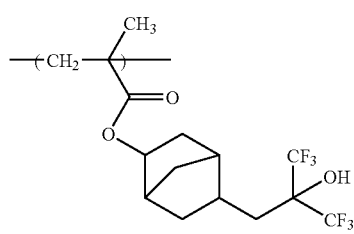

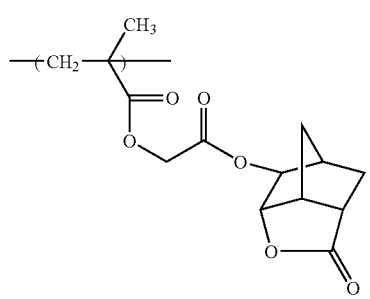

Resin Synthesis Example 12

Synthesis of Resin B9

21.00 parts of monomer A, 2.66 parts of monomer B, 7.62 parts of monomer D and 6.71 parts of monomer F were dissolved in 1.5 times amount of 1,4-dioxane as much as the amount of all monomers to be used (monomer ratio; monomer A: monomer B: monomer D: monomer F=60:8:15:17). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 73° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 7,900 was obtained in a yield of 73%. This copolymer had the following structural units. This is called as resin B9.

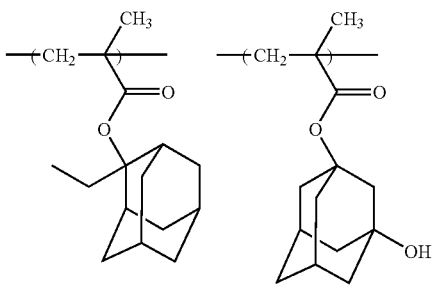

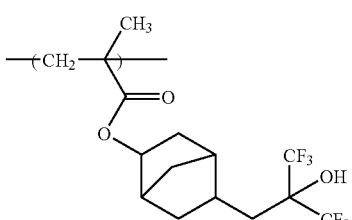

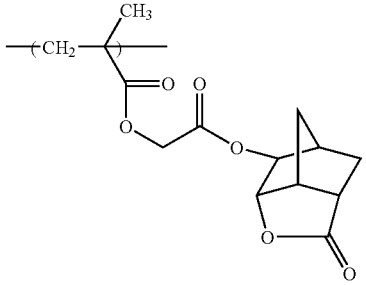

Resin Synthesis Example 13

Synthesis of Resin B10

20.60 parts of monomer A, 1.96 parts of monomer B, 9.96 parts of monomer D and 5.42 parts of monomer F were dissolved in 1.5 times amount of 1,4-dioxane as much as the amount of all monomers to be used (monomer ratio; monomer A: monomer B: monomer D: monomer F=60:6:20:14). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 73° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 11,400 was obtained in a yield of 72%. This copolymer had the following structural units. This is called as resin B10.

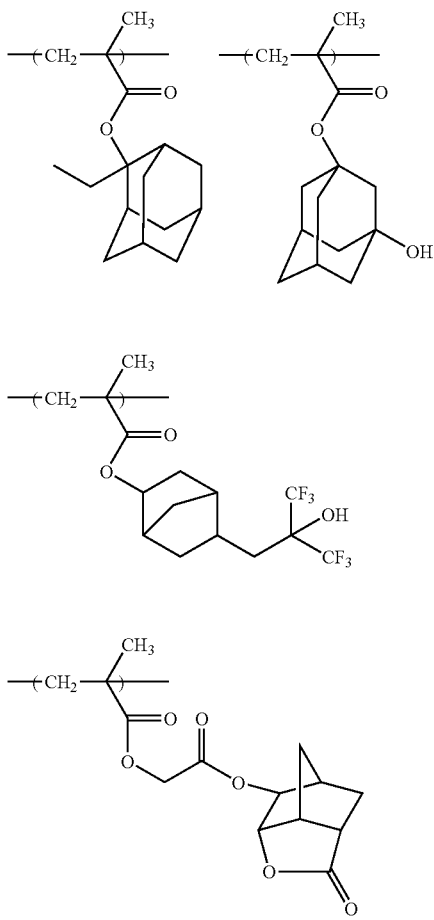

Resin Synthesis Example 14

Synthesis of Resin B11

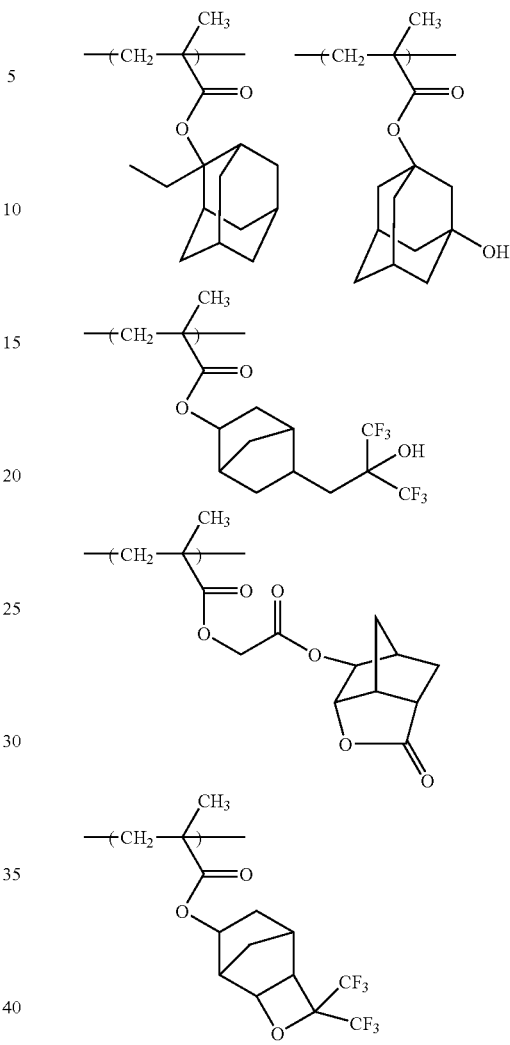

Resin Synthesis Example 15

Synthesis of Resin B12

14.60 parts of monomer A, 1.48 parts of monomer B, 13.52 parts of monomer D, 2.80 parts of monomer F and 4.31 parts of monomer G were dissolved in 1.5 times amount of 1,4-dioxane as much as the amount of all monomers to be used (monomer ratio; monomer A: monomer B: monomer D: monomer F: monomer G=47:5:30:8:10). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,800 was obtained in a yield of 78%. This copolymer had the following structural units. This is called as resin B11.

14.50 parts of monomer A, 1.47 parts of monomer B, 13.43 parts of monomer D, 2.79 parts of monomer F and 4.50 parts of monomer H were dissolved in 1.5 times amount of 1,4-dioxane as much as the amount of all monomers to be used (monomer ratio; monomer A: monomer B: monomer D: monomer F: monomer H=47:5:30:8:10). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,600 was obtained in a yield of 77%. This copolymer had the following structural units. This is called as resin B12.

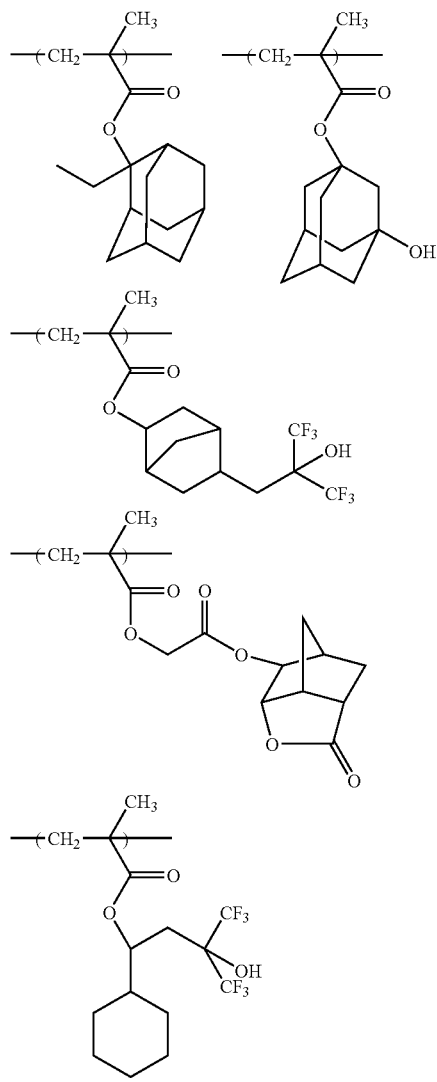

Resin Synthesis Example 16

Synthesis of Resin B13

17.70 parts of monomer A, 3.37 parts of monomer B, 8.79 parts of monomer, F, 3.92 parts of monomer I and 2.79 parts of monomer J were dissolved in 1.5 times amount of 1,4-dioxane as much as the amount of all monomers to be used (monomer ratio; monomer A: monomer B: monomer F: monomer I: monomer J=50:10:22:14:4). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 75° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 7,000 was obtained in a yield of 68%. This copolymer had the following structural units. This is called as resin B13.

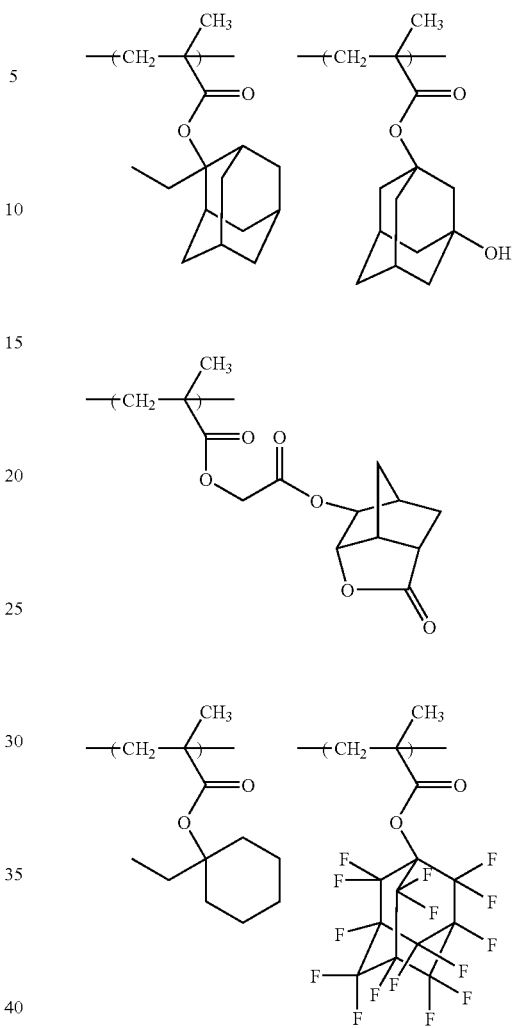

Resin Synthesis Example 17

Synthesis of Resin B14

8.65 parts of monomer A, 1.98 parts of monomer B, 10.04 parts of monomer D, 13.28 parts of monomer F and 4.10 parts of monomer I were dissolved in 1.5 times amount of 1,4-dioxane as much as the amount of all monomers to be used (monomer ratio; monomer A: monomer B: monomer D: monomer F: monomer I=25:6:20:34:15). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 73° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 11,100 was obtained in a yield of 82%. This copolymer had the following structural units. This is called as resin B14.

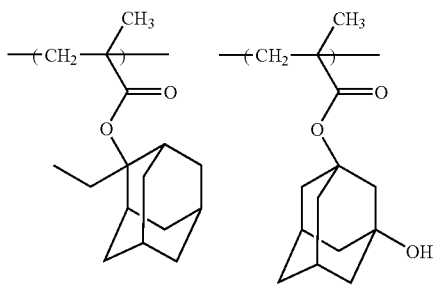

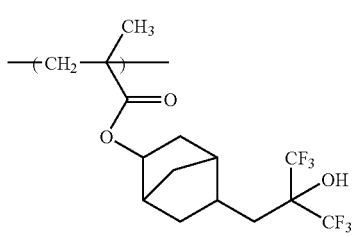

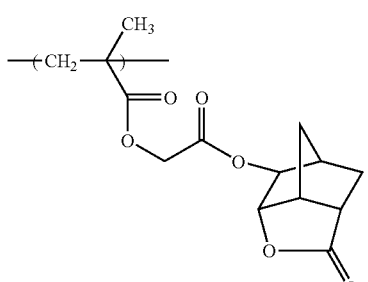

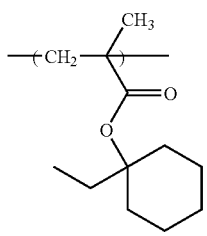

Resin Synthesis Example 18

Synthesis of Resin A4

25.35 parts of monomer A, 8.68 parts of monomer C and 11.34 parts of monomer E were dissolved in 2.6 times amount of 1,4-dioxane as much as the amount of all monomers to be used (monomer ratio; monomer A: monomer C: monomer E=50:25:25). To the solution, 2,2'-azobisisobutyronitrile was added as the initiator in a ratio of 2.5 mol % based on all monomer molar amount, and the resultant mixture was heated at 87° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 8,400 was obtained in a yield of 58%. This copolymer had the following structural units. This is called as resin A4.

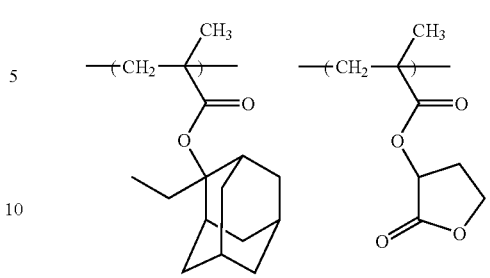

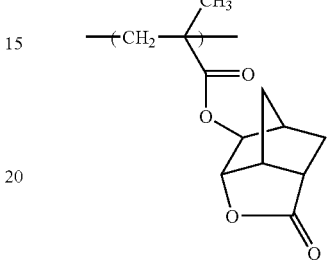

Resin Synthesis Example 19

Synthesis of Resin B15

25.35 parts of monomer A, 18.39 parts of monomer D and 11.34 parts of monomer E were dissolved in 2.6 times amount of 1,4-dioxane as much as the amount of all monomers to be used (monomer ratio; monomer A: monomer D: monomer E=50:25:25). To the solution, 2,2'-azobisisobutyronitrile was added as the initiator in a ratio of 3 mol % based on all monomer molar amount, and the resultant mixture was heated at 87° C. for about 5 hours. The reaction solution was poured into large amount of a mixed solvent of methanol and water to cause precipitation. The precipitation was isolated and washed twice with large amount of a mixed solvent of methanol and water for purification. As a result, copolymer having a weight-average molecular weight of about 9,000 was obtained in a yield of 62%. This copolymer had the following structural units. This is called as resin B15.

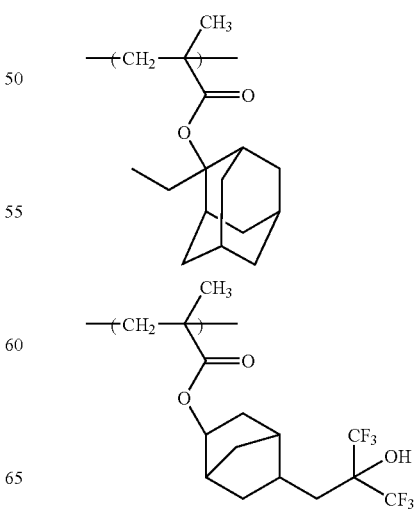

-continued

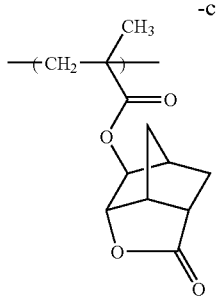

Resin Synthesis Example 20

Synthesis of Resin B16

18.05 parts of monomer A, 18.33 parts of monomer D and 4.85 parts of monomer E were dissolved in 2.6 times amount of 1,4-dioxane as much as the amount of all monomers to be used (monomer ratio; monomer A: monomer D: monomer E=50:35:15). To the solution, 2,2'-azobisisobutyronitrile was added as the initiator in a ratio of 3 mol % based on all monomer molar amount, and the resultant mixture was heated at 87° C. for about 5 hours. The reaction solution was poured into large amount of a mixed solvent of methanol and water to cause precipitation. The precipitation was isolated and washed twice with large amount of a mixed solvent of methanol and water for purification. As a result, copolymer having a weight-average molecular weight of about 10,800 was obtained in a yield of 72%. This copolymer had the following structural units. This is called as resin B16.

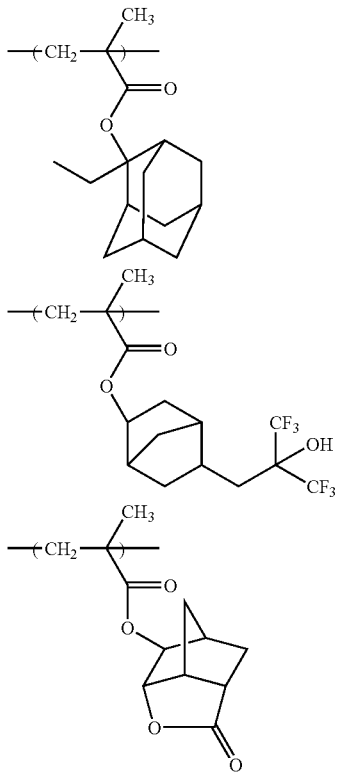

Resin Synthesis Example 21

Synthesis of Resin B17

18.00 parts of monomer A, 2.40 parts of monomer B, 18.28 parts of monomer D and 2.58 parts of monomer E were dissolved in 2.6 times amount of 1,4-dioxane as much as the amount of all monomers to be used (monomer ratio; monomer A: monomer B: monomer D: monomer E=50:7:35:8). To the solution, 2,2'-azobisisobutyronitrile was added as the initiator in a ratio of 3 mol % based on all monomer molar amount, and the resultant mixture was heated at 87° C. for about 5 hours. The reaction solution was poured into large amount of a mixed solvent of methanol and water to cause precipitation. The precipitation was isolated and washed twice with large amount of a mixed solvent of methanol and water for purification. As a result, copolymer having a weight-average molecular weight of about 10,400 was obtained in a yield of 72%. This copolymer had the following structural units. This is called as resin B17.

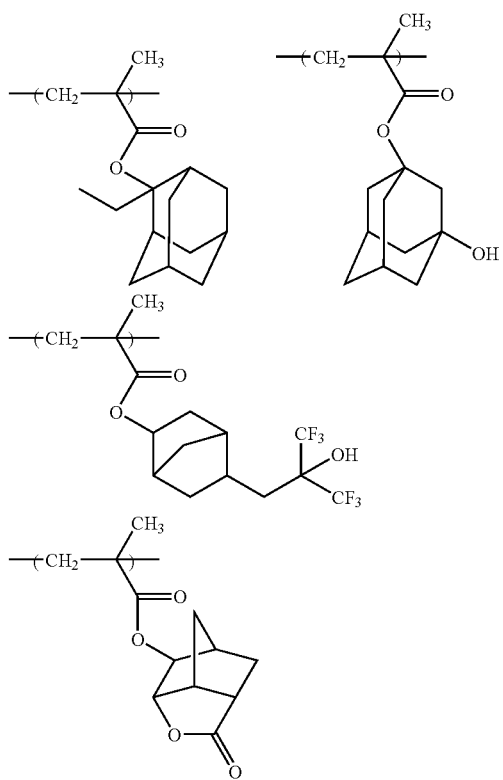

Resin Synthesis Example 22

Synthesis of Resin B18

12.5 parts of monomer A, 6.25 parts of monomer C and 17.64 parts of monomer D were dissolved in 1.5 times amount of 1,4-dioxane as much as the amount of all monomers to be used (monomer ratio; monomer A: monomer C: monomer D=37:27:36). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 73° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 10,800 was obtained in a yield of 78%. This copolymer had the following structural units. This is called as resin B18.

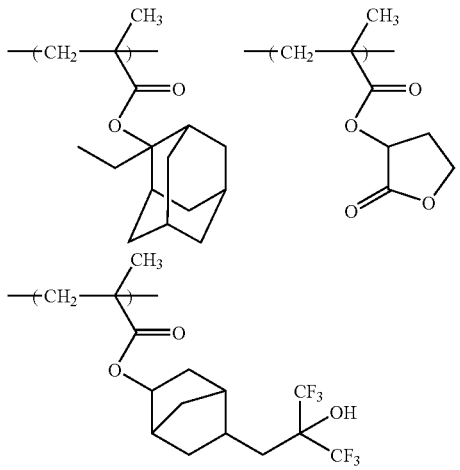

Resin Synthesis Example 23

Synthesis of Resin B19

4.65 parts of monomer A, 5.73 parts of monomer C and 26.08 parts of monomer D were dissolved in 1.5 times amount of 1,4-dioxane as much as the amount of all monomers to be used (monomer ratio; monomer A: monomer C: monomer D=15:27:58). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 73° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 15,800 was obtained in a yield of 41%. This copolymer had the following structural units. This is called as resin B19.

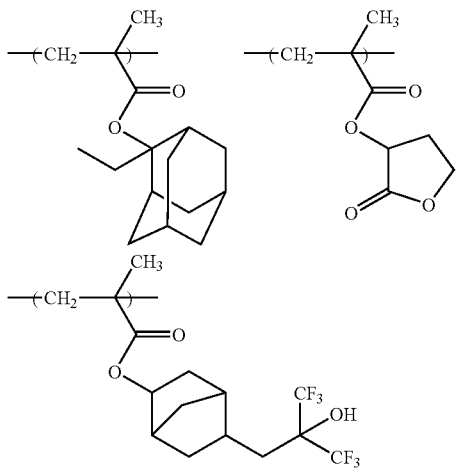

Resin Synthesis Example 24

Synthesis of Resin B20

13.55 parts of monomer A, 3.55 parts of monomer B, 9.83 parts of monomer D and 11.09 parts of monomer F were dissolved in 1.5 times amount of 1,4-dioxane as much as the amount of all monomers to be used (monomer ratio; monomer A: monomer B: monomer D: monomer F=40:11:20:29). To the solution, 2,2'-azobisisobutyronitrile and 2,2'-azobis(2,4-dimethylvaleronitrile) were added as initiators in a ratio of 1 mol % and 3 mol % respectively based on all monomer molar amount, and the resultant mixture was heated at 73° C. for about 5 hours. The reaction solution was poured into large amount of a mixed solvent of methanol and water to cause precipitation. The precipitation was isolated and washed three times with large amount of a mixed solvent of methanol and water for purification. As a result, copolymer having a weight-average molecular weight of about 11,400 was obtained in a yield of 80%. This copolymer had the following structural units. This is called as resin B20.

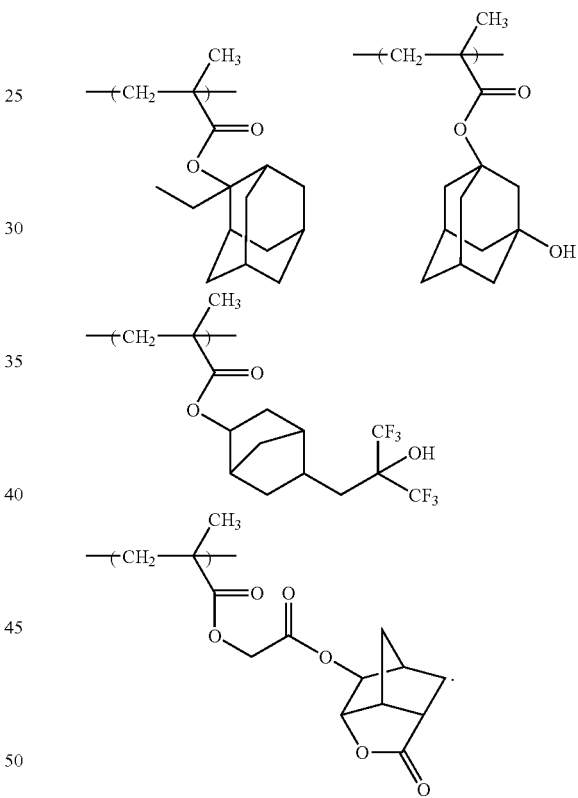

Examples 1 to 38 and Comparative Examples 1 to 15

The following components were mixed to give a solution, and the solution was further filtrated through a fluorine resin filter having a pore diameter of 0.2 μm, to prepare resist liquid.

Resins (kind and amount are described in Table 1)
Acid generator (kind and amount are described in Table 1)
Quencher (kind and amount are described in Table 1)
Solvent (kind are described in Table 1)

The resist liquids prepared in Examples 1 to 38 are respectively called as resists R1 to R38 and the resist liquids prepared in Comparative Examples 1 to 15 are respectively called as resists C1 to C15.

TABLE 1

| Ex. No. | Resin A (kind/amount (part)) | Resin B (kind/amount (part)) | Acid generator (kind/amount (part)) | Quencher (kind/amount (part)) | Solvent |
|---|---|---|---|---|---|
| Ex. 1 | A1/9.5 | B2/0.5 | P1/0.4 | Q1/0.05 | S1 |
| Ex. 2 | A1/9.0 | B2/1.0 | P1/0.4 | Q1/0.05 | S1 |
| Ex. 3 | A1/7.5 | B2/2.5 | P1/0.4 | Q1/0.05 | S1 |
| Ex. 4 | A1/9.0 | B3/1.0 | P1/0.4 | Q1/0.05 | S1 |
| Ex. 5 | A1/7.5 | B3/2.5 | P1/0.4 | Q1/0.05 | S1 |
| Ex. 6 | A1/9.0 | B4/1.0 | P1/0.4 | Q1/0.05 | S1 |
| Ex. 7 | A1/7.5 | B4/2.5 | P1/0.4 | Q1/0.05 | S1 |
| Ex. 8 | A1/9.0 | B5/1.0 | P1/0.4 | Q1/0.05 | S1 |
| Ex. 9 | A1/7.5 | B5/2.5 | P1/0.4 | Q1/0.05 | S1 |
| Ex. 10 | A1/9.0 | B6/1.0 | P1/0.4 | Q1/0.05 | S1 |
| Ex. 11 | A1/7.5 | B6/2.5 | P1/0.4 | Q1/0.05 | S1 |
| Ex. 12 | A1/9.0 | B7/1.0 | P1/0.4 | Q1/0.05 | S1 |
| Ex. 13 | A1/7.5 | B7/2.5 | P1/0.4 | Q1/0.05 | S1 |
| Ex. 14 | A1/9.5 | B1/0.5 | P1/0.25 | Q2/0.03 | S2 |
| Ex. 15 | A1/9.0 | B1/1.0 | P1/0.25 | Q2/0.03 | S2 |
| Ex. 16 | A1/7.5 | B1/2.5 | P1/0.25 | Q2/0.03 | S2 |
| Ex. 17 | A4/9.5 | B15/0.5 | P1/0.25 | Q2/0.03 | S2 |
| Ex. 18 | A4/9.0 | B15/1.0 | P1/0.25 | Q2/0.03 | S2 |
| Ex. 19 | A4/7.5 | B15/2.5 | P1/0.25 | Q2/0.03 | S2 |
| Ex. 20 | A4/9.5 | B16/0.5 | P1/0.25 | Q2/0.03 | S2 |
| Ex. 21 | A4/9.0 | B16/1.0 | P1/0.25 | Q2/0.03 | S2 |
| Ex. 22 | A4/7.5 | B16/2.5 | P1/0.25 | Q2/0.03 | S2 |
| Ex. 23 | A2/9.5 | B17/0.5 | P1/0.25 | Q2/0.03 | S2 |
| Ex. 24 | A2/9.0 | B17/1.0 | P1/0.25 | Q2/0.03 | S2 |
| Ex. 25 | A2/7.5 | B17/2.5 | P1/0.25 | Q2/0.03 | S2 |
| Ex. 26 | A3/9.0 | B8/1.0 | P2/0.75 | Q2/0.08 | S3 |
| Ex. 27 | A3/9.0 | B9/1.0 | P2/0.75 | Q2/0.08 | S3 |
| Ex. 28 | A3/7.0 | B9/3.0 | P2/0.75 | Q2/0.08 | S3 |
| Ex. 29 | A3/9.0 | B10/1.0 | P2/0.75 | Q2/0.08 | S3 |
| Ex. 30 | A3/9.5 | B13/0.5 | P2/0.75 | Q2/0.08 | S3 |
| Ex. 31 | A3/9.0 | B14/1.0 | P2/0.75 | Q2/0.08 | S3 |
| Ex. 32 | A3/9.5 | B18/0.5 | P2/0.75 | Q2/0.08 | S3 |
| Ex. 33 | A3/9.5 | B19/0.5 | P2/0.75 | Q2/0.08 | S3 |
| Ex. 34 | A3/9.0 | B20/1.0 | P2/0.75 | Q2/0.08 | S3 |
| Ex. 35 | A2/9.0 | B11/1.0 | P2/0.5 | Q2/0.06 | S2 |
| Ex. 36 | A2/7.5 | B12/2.5 | P2/0.5 | Q2/0.06 | S2 |
| Ex. 37 | A2/9.0 | B12/1.0 | P2/0.5 | Q2/0.06 | S2 |
| Ex. 38 | A2/9.5 | B12/0.5 | P2/0.5 | Q2/0.06 | S2 |
| Comp. Ex. 1 | A1/10 | None | P1/0.4 | Q1/0.05 | S1 |
| Comp. Ex. 2 | A1/10 | None | P1/0.25 | Q2/0.03 | S2 |
| Comp. Ex. 3 | A4/10 | None | P1/0.25 | Q2/0.03 | S2 |
| Comp. Ex. 4 | A2/10 | None | P1/0.25 | Q2/0.03 | S2 |
| Comp. Ex. 5 | A3/10 | None | P2/0.75 | Q2/0.08 | S3 |
| Comp. Ex. 6 | A2/10 | None | P2/0.5 | Q2/0.06 | S2 |
| Comp. Ex. 7 | None | B1/10 | P1/0.25 | Q2/0.03 | S2 |
| Comp. Ex. 8 | None | B15/10 | P1/0.25 | Q2/0.03 | S2 |
| Comp. Ex. 9 | None | B9/10 | P2/0.75 | Q2/0.08 | S3 |
| Comp. Ex. 10 | None | B8/10 | P2/0.75 | Q2/0.08 | S3 |
| Comp. Ex. 11 | None | B12/10 | P2/0.5 | Q2/0.06 | S2 |
| Comp. Ex. 12 | None | B2/10 | P1/0.4 | Q1/0.05 | S1 |
| Comp. Ex. 13 | None | B3/10 | P1/0.4 | Q1/0.05 | S1 |
| Comp. Ex. 14 | None | B4/10 | P1/0.4 | Q1/0.05 | S1 |
| Comp. Ex. 15 | None | B7/10 | P1/0.4 | Q1/0.05 | S1 |

Silicon wafers were each coated with "ARC-95", which is an organic anti-reflective coating composition available from Nissan Chemical Industries, Ltd., and then baked under the conditions: 205° C. and 60 seconds, to form a 780 Å-thick organic anti-reflective coating. Each of the resist liquids prepared in Examples 1 to 38 and Comparative Examples 1 to 15 was spin-coated over the anti-reflective coating to give a film thickness after drying of that shown in Table 2. After application of each of the resist liquids, the silicon wafers thus coated with the respective resist liquids were each prebaked on a direct hotplate at a temperature shown in the column of "PB" in Table 2 for 60 seconds. Using an ArF excimer stepper ("FPA5000-AS3" manufactured by CANON INC.) under evaluation condition shown in Table 2, each wafer on which the respective resist film had been thus formed was exposed to a line and space pattern, while changing stepwise the exposure quantity.

After the exposure, each wafer was subjected to post-exposure baking on a hotplate at a temperature shown in the column of "PEB" in Table 2 for 60 seconds and then to paddle development with an aqueous solution of 2.38% by weight tetramethylammonium hydroxide.

TABLE 2

| Ex. No. | Resist liquid | PB (° C.) | PEB (° C.) | Evaluation condition |
|---|---|---|---|---|
| Ex. 1 | R1 | 100 | 115 | H3 |
| Ex. 2 | R2 | 100 | 115 | H3 |
| Ex. 3 | R3 | 100 | 115 | H3 |
| Ex. 4 | R4 | 100 | 115 | H3 |
| Ex. 5 | R5 | 100 | 115 | H3 |
| Ex. 6 | R6 | 100 | 115 | H3 |
| Ex. 7 | R7 | 100 | 115 | H3 |
| Ex. 8 | R8 | 100 | 115 | H3 |
| Ex. 9 | R9 | 100 | 115 | H3 |
| Ex. 10 | R10 | 100 | 115 | H3 |
| Ex. 11 | R11 | 100 | 115 | H3 |
| Ex. 12 | R12 | 100 | 115 | H3 |
| Ex. 13 | R13 | 100 | 115 | H3 |
| Ex. 14 | R14 | 130 | 130 | H1 |
| Ex. 15 | R15 | 130 | 130 | H1 |

TABLE 2-continued

| Ex. No. | Resist liquid | PB (° C.) | PEB (° C.) | Evaluation condition |
|---|---|---|---|---|
| Ex. 16 | R16 | 130 | 130 | H1 |
| Ex. 17 | R17 | 115 | 115 | H1 |
| Ex. 18 | R18 | 115 | 115 | H1 |
| Ex. 19 | R19 | 115 | 115 | H1 |
| Ex. 20 | R20 | 115 | 115 | H1 |
| Ex. 21 | R21 | 115 | 115 | H1 |
| Ex. 22 | R22 | 115 | 115 | H1 |
| Ex. 23 | R23 | 115 | 115 | H1 |
| Ex. 24 | R24 | 115 | 115 | H1 |
| Ex. 25 | R25 | 115 | 115 | H1 |
| Ex. 26 | R26 | 95 | 95 | H2 |
| Ex. 27 | R27 | 95 | 95 | H2 |
| Ex. 28 | R28 | 95 | 95 | H2 |
| Ex. 29 | R29 | 95 | 95 | H2 |
| Ex. 30 | R30 | 95 | 95 | H3 |
| Ex. 31 | R31 | 95 | 95 | H3 |
| Ex. 32 | R32 | 95 | 95 | H3 |
| Ex. 33 | R33 | 95 | 95 | H3 |
| Ex. 34 | R34 | 95 | 95 | H2 |
| Ex. 35 | R35 | 100 | 105 | H1 |
| Ex. 36 | R36 | 100 | 105 | H1 |
| Ex. 37 | R37 | 100 | 105 | H1 |
| Ex. 38 | R38 | 100 | 105 | H1 |
| Comp. Ex. 1 | C1 | 100 | 115 | H3 |
| Comp. Ex. 2 | C2 | 130 | 130 | H1 |
| Comp. Ex. 3 | C3 | 115 | 115 | H1 |
| Comp. Ex. 4 | C4 | 115 | 115 | H1 |
| Comp. Ex. 5 | C5 | 95 | 95 | H2 |
| Comp. Ex. 6 | C6 | 100 | 105 | H1 |
| Comp. Ex. 7 | C7 | 130 | 130 | H1 |
| Comp. Ex. 8 | C8 | 115 | 115 | H1 |
| Comp. Ex. 9 | C9 | 95 | 95 | H2 |
| Comp. Ex. 10 | C10 | 95 | 95 | H2 |
| Comp. Ex. 11 | C11 | 100 | 105 | H1 |
| Comp. Ex. 12 | C12 | 100 | 115 | H3 |
| Comp. Ex. 13 | C13 | 100 | 115 | H3 |
| Comp. Ex. 14 | C14 | 100 | 115 | H3 |
| Comp. Ex. 15 | C15 | 100 | 115 | H3 |

Each of a dark field pattern developed on the organic anti-reflective coating substrate after the development was observed with a scanning electron microscope, and the results of which are shown in Table 3. The term "dark field pattern", as used herein, means a pattern obtained by exposure and development through a reticle comprising a chromium base layer (light-shielding layer) and linear glass surface (light-transmitting portion) formed in the chromium base layer and aligned with each other. Thus, the dark field pattern is such that, after exposure and development, resist layer surrounding the line and space pattern remains on substrate.

Effective Sensitivity (ES): It is expressed as the amount of exposure that the line pattern (light-shielding layer) and the space pattern (light-transmitting portion) become 1:1 after exposure through 100 nm line and space pattern mask and development.

Resolution: It is expressed as the minimum size of space pattern which gave the space pattern split by the line pattern at the exposure amount of the effective sensitivity.

Pattern Profile: Wall surfaces of resist patterns after conducting a lithography process were observed by a scanning electron microscope, and when the pattern is a rectangle or nearly a rectangle, its evaluation is marked by "○", when the pattern is a tapered shape, its evaluation is marked by "Δ", and when the pattern is a tapered shape and the thickness-loss of the top was observed, its evaluation is marked by "X".

TABLE 3

| Ex. No. | ES (mJ/cm$^2$) | Resolution (nm) | Pattern Profile |
|---|---|---|---|
| Ex. 2 | 16 | 85 | ○ |
| Ex. 4 | 16 | 85 | ○ |
| Ex. 6 | 16 | 85 | ○ |
| Ex. 8 | 16 | 85 | ○ |
| Ex. 10 | 16 | 85 | ○ |
| Ex. 12 | 18 | 85 | ○ |
| Ex. 14 | 24 | 90 | ○ |
| Ex. 15 | 24 | 90 | ○ |
| Ex. 16 | 24 | 90 | ○ |
| Ex. 17 | 21 | 90 | ○ |
| Ex. 18 | 21 | 90 | ○ |
| Ex. 19 | 21 | 90 | ○ |
| Ex. 20 | 18 | 90 | ○ |
| Ex. 21 | 19 | 90 | ○ |
| Ex. 22 | 18 | 90 | ○ |
| Ex. 23 | 26 | 90 | ○ |
| Ex. 24 | 26 | 90 | ○ |
| Ex. 25 | 24 | 90 | ○ |
| Ex. 26 | 36 | 85 | ○ |
| Ex. 27 | 36 | 85 | ○ |
| Ex. 28 | 34 | 85 | ○ |
| Ex. 29 | 40 | 85 | ○ |
| Ex. 30 | 36 | 85 | ○ |
| Ex. 31 | 35 | 85 | ○ |
| Ex. 32 | 36 | 85 | ○ |
| Ex. 33 | 37 | 85 | ○ |
| Ex. 34 | 41 | 85 | ○ |
| Ex. 35 | 37 | 90 | ○ |
| Ex. 36 | 37 | 90 | ○ |
| Ex. 37 | 37 | 90 | ○ |
| Ex. 38 | 37 | 90 | ○ |
| Comp. Ex. 1 | 16 | 85 | ○ |
| Comp. Ex. 2 | 24 | 90 | ○ |
| Comp. Ex. 3 | 21 | 90 | ○ |
| Comp. Ex. 4 | 27 | 90 | ○ |
| Comp. Ex. 5 | 37 | 85 | ○ |
| Comp. Ex. 6 | 38 | 90 | ○ |
| Comp. Ex. 7 | Not developed | | |
| Comp. Ex. 8 | 22 | 90 | X |
| Comp. Ex. 9 | 30 | 85 | Δ |
| Comp. Ex. 10 | 29 | 85 | X |
| Comp. Ex. 11 | 37 | 95 | X |
| Comp. Ex. 12 | Not developed | | |
| Comp. Ex. 13 | Not developed | | |
| Comp. Ex. 14 | Not developed | | |
| Comp. Ex. 15 | Not developed | | |

Each of the resist liquids R1 to R38 and C1 to C15 prepared as above was spin-coated over the silicon wafer to give a film thickness 0.15 μm after drying. After application of each of the resist liquids, the silicon wafers thus coated with the respective resist liquids were each prebaked on a direct hot-plate at a temperature shown in the column of "PB" in Table 2 for 60 seconds. Using an ArF excimer stepper ("FPA5000-AS3" manufactured by CANON INC., NA=0.75, ⅔ Annular) and a blankmask having no pattern, each half of wafer on which the respective resist film had been thus formed was exposed with the exposure quantity of 35 mJ/cm$^2$.

After the exposure, each contact angle and receding contact angle of the exposure part and non-exposure part of the wafer after exposure was measured using "Drop Master-700" manufactured by Kyowa Interface Science Co., LTD. The contact angle was measured after 0.1 second after dropping using 1 μl water by droplet method and the receding contact angle was measured using 50 μl water by sliding method with a stepwise decant mode. The results of which are shown in Tables 4 and 5.

TABLE 4

| | | Non-exposure part | |
|---|---|---|---|
| Ex. No. | Resist liquid | Receding contact angle (°) | Contact angle (°) |
| Ex. 1 | R1 | 65 | 79 |
| Ex. 2 | R2 | 75 | 85 |
| Ex. 3 | R3 | 82 | 89 |
| Ex. 4 | R4 | 59 | 74 |
| Ex. 5 | R5 | 64 | 80 |
| Ex. 6 | R6 | 55 | 73 |
| Ex. 7 | R7 | 58 | 75 |
| Ex. 8 | R8 | 55 | 74 |
| Ex. 9 | R9 | 60 | 77 |
| Ex. 10 | R10 | 59 | 75 |
| Ex. 11 | R11 | 62 | 79 |
| Ex. 12 | R12 | 56 | 73 |
| Ex. 13 | R13 | 59 | 77 |
| Ex. 14 | R14 | 58 | 77 |
| Ex. 15 | R15 | 61 | 79 |
| Ex. 16 | R16 | 64 | 79 |
| Ex. 17 | R17 | 63 | 79 |
| Ex. 18 | R18 | 65 | 81 |
| Ex. 19 | R19 | 66 | 82 |
| Ex. 20 | R20 | 67 | 81 |
| Ex. 21 | R21 | 68 | 81 |
| Ex. 22 | R22 | 69 | 82 |
| Ex. 23 | R23 | 65 | 81 |
| Ex. 24 | R24 | 67 | 82 |
| Ex. 25 | R25 | 68 | 81 |
| Ex. 26 | R26 | 68 | 83 |
| Ex. 27 | R27 | 63 | 80 |
| Ex. 28 | R28 | 67 | 81 |
| Ex. 29 | R29 | 66 | 81 |
| Ex. 30 | R30 | 60 | 79 |
| Ex. 31 | R31 | 62 | 80 |
| Ex. 32 | R32 | 62 | 81 |
| Ex. 33 | R33 | 61 | 81 |
| Ex. 34 | R34 | 61 | 79 |
| Ex. 35 | R35 | 71 | 83 |
| Ex. 36 | R36 | 72 | 85 |
| Ex. 37 | R37 | 74 | 85 |
| Ex. 38 | R38 | 74 | 86 |
| Comp. Ex. 1 | C1 | 51 | 69 |
| Comp. Ex. 2 | C2 | 52 | 70 |
| Comp. Ex. 3 | C3 | 57 | 73 |
| Comp. Ex. 4 | C4 | 57 | 73 |
| Comp. Ex. 5 | C5 | 55 | 73 |
| Comp. Ex. 6 | C6 | 55 | 74 |
| Comp. Ex. 7 | C7 | 66 | 80 |
| Comp. Ex. 8 | C8 | 67 | 81 |
| Comp. Ex. 9 | C9 | 68 | 84 |
| Comp. Ex. 10 | C10 | 69 | 83 |
| Comp. Ex. 11 | C11 | 75 | 86 |
| Comp. Ex. 12 | C12 | 81 | 89 |
| Comp. Ex. 13 | C13 | 72 | 83 |
| Comp. Ex. 14 | C14 | 68 | 79 |
| Comp. Ex. 15 | C15 | 62 | 79 |

TABLE 5

| | | Exposure part | |
|---|---|---|---|
| Ex. No. | Resist liquid | Receding contact angle (°) | Contact angle (°) |
| Ex. 14 | R14 | 55 | 78 |
| Ex. 15 | R15 | 58 | 79 |
| Ex. 16 | R16 | 61 | 80 |
| Ex. 17 | R17 | 59 | 79 |
| Ex. 18 | R18 | 62 | 82 |
| Ex. 19 | R19 | 62 | 81 |
| Comp. Ex. 2 | C2 | 47 | 69 |
| Comp. Ex. 3 | C3 | 52 | 73 |
| Comp. Ex. 7 | C7 | 62 | 80 |
| Comp. Ex. 8 | C8 | 62 | 80 |

Apparent from the results shown in Tables 3, 4 and 5, while keeping equivalent or greater effective sensitivity and resolution, patterns obtained by Examples corresponding to the present invention show good pattern profile, and resin films obtained by Examples corresponding to the present invention have higher receding contact angle than those of Comparative Examples.

Example 39 and Comparative Examples 16 to 18

The following components were mixed to give a solution, and the solution was further filtrated through a fluorine resin filter having a pore diameter of 0.2 μm, to prepare resin liquid.
Resins (kind and amount are described in Table 6)
Solvent (kind are described in Table 6)

TABLE 6

| Ex. No. | Resin A (kind/amount(part)) | Resin B (kind/amount(part)) | Solvent |
|---|---|---|---|
| Ex. 39 | A2/9.0 | B8/1.0 | S2 |
| Comp. Ex. 16 | A2/9.0 | None | S2 |
| Comp. Ex. 17 | None | B8/1.0 | S2 |
| Comp. Ex. 18 | None | B12/1.0 | S2 |

Each of the resin liquids prepared as above was spin-coated over the magnesium fluoride ($MgF_2$) substrate to give a film thickness 100 nm after drying. After application of each of the resin liquids, the substrates thus coated with the respective resin liquids were each prebaked on a direct hotplate at 120° C. for 60 seconds. Using a vacuum ultraviolet spectrometer ("VUVSP-900" manufactured by Litho Tech Japan CO., Ltd.), each transmission was measured. The transmission of the substrate coated with the resin liquid was calculated by dividing the transmission of the substrate coated with the resin liquid by the transmission of the magnesium fluoride substrate which was not coated with the resin liquid and expressed in percentage.

Each absorbance was calculated by the following equation:

$A$ : Absorbance ($1/\mu m$)

$T$ : Transmission(%)

$d$ : Film thickness($\mu m$)

$$A = -\frac{\text{Log}_{10}\left(\frac{T}{100}\right)}{d}$$

The results of which are shown in Table 7.

TABLE 7

| | Absorbance (1/μm) | |
|---|---|---|
| Ex. No. | Wave length 193 nm | Wave length 157 nm |
| Ex. 39 | 0.49 | 7.0 |
| Comp. Ex. 16 | 0.45 | 7.0 |
| Comp. Ex. 17 | 0.38 | 4.8 |
| Comp. Ex. 18 | 0.41 | 4.7 |

Example 40

Each Log P value of the monomers A to J was calculated by using a Log P value estimating program incorporated into Chem Draw Ultra version 9.0.1 provided by CambridgeSoft Corporation. The calculated values of the monomers A to J are shown in Table 8.

TABLE 8

| Monomer | Calculated Log P value |
|---|---|
| Monomer A | 3.70 |
| Monomer B | 1.51 |
| Monomer C | 0.53 |
| Monomer D | 3.72 |
| Monomer E | 1.16 |
| Monomer F | 0.69 |
| Monomer G | 2.87 |
| Monomer H | 4.35 |
| Monomer I | 3.24 |
| Monomer J | 3.89 |

Each content ratio of the corresponding structural unit in the resin was calculated based on the result obtained by NMR analysis for the resin, and Log P value of the resin is calculated by the following equation:

Log $P$ value of the resin=Σ(each calculated Log $P$ value of the monomer used to give the corresponding structural unit in the resin×each content ratio of the corresponding structural unit in the resin).

The content ratio of the structural units in the resin B3, B5 and B7 are shown in Table 9 and the Log P value of each resin are shown in Table 10.

TABLE 9

| | Content ratio of the structural units (% by mole) | | | | |
|---|---|---|---|---|---|
| Resin | Derived from Monomer A | Derived from Monomer B | Derived from Monomer D | Derived from Monomer G | Log P value of the resin |
| Resin B3 | 41.5 | 23.4 | 0.0 | 35.1 | 2.90 |
| Resin B5 | 40.8 | 35.7 | 23.5 | 0.0 | 2.92 |
| Resin B7 | 0.0 | 50.0 | 0.0 | 50.0 | 2.19 |

TABLE 10

| Resin | Log P value of the resin |
|---|---|
| Resin B1 | 2.97 |
| Resin B2 | 3.21 |
| Resin B3 | 2.90 |
| Resin B4 | 2.71 |
| Resin B5 | 2.92 |
| Resin B6 | 3.03 |
| Resin B7 | 2.19 |
| Resin B8 | 3.31 |
| Resin B9 | 2.86 |
| Resin B10 | 3.03 |
| Resin B11 | 3.21 |
| Resin B12 | 3.36 |
| Resin B13 | 2.58 |
| Resin B15 | 2.87 |
| Resin B16 | 3.20 |
| Resin B17 | 3.23 |
| Resin B18 | 2.75 |
| Resin B19 | 2.83 |
| Resin B20 | 2.48 |
| Resin A1 | 1.95 |
| Resin A2 | 1.88 |
| Resin A3 | 1.80 |
| Resin A4 | 1.94 |

The present resist composition provides excellent resist pattern in resolution and pattern profiles and is suitable for optical lithography such as ArF excimer laser lithography. The resist film having higher receding contact angle can be formed on the substrate by using the present resist composition to suppress the formation of defect in liquid immersion lithography process and the present composition is especially suitable for liquid immersion lithography process.

What is claimed is:

1. A chemically amplified positive resist composition comprising:
 a resin (A) which contains no fluorine atom and a structural unit (a1) having an acid-labile group,
 a resin (B) which contains a structural unit (b2) and at least one structural unit selected from a structural unit (b1) having an acid-labile group, a structural unit (b3) having a hydroxyl group and a structural unit (b4) having a lactone structure, wherein the structural unit (b2) represents a structural unit represented by the formula (IV):

(IV)

wherein $R^{25}$ represents a hydrogen atom or a methyl group, and AR represents a C1-C30 fluorine-containing alkyl group which may contain one to five hydroxyl groups and at least one heteroatom selected from an oxygen, nitrogen and sulfur atom, and
 an acid generator, wherein the acid generator is a salt represented by the formula (V):

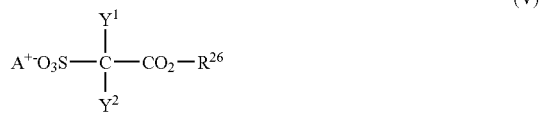

(V)

wherein $R^{26}$ represents a C1-C6 linear or branched chain hydrocarbon group or a C3-C30 monocyclic or bicyclic hydrocarbon group, and at least one hydrogen atom in the monocyclic or bicyclic hydrocarbon group may be replaced with a C1-C6 alkoxy, C1-C4 perfluoroalkyl, C1-C6 hydroxyalkyl, hydroxyl, cyano, carbonyl or ester group, or at least one —$CH_2$— in the monocyclic or bicyclic hydrocarbon group may be replaced with —CO— or —O—; $A^+$ represents an organic counter ion; $Y^1$ and $Y^2$ are the same or different and each independently represents a fluorine atom or a C1-C6 perfluoroalkyl group.

2. The chemically amplified positive resist composition according to claim 1, wherein the salt represented by the formula (V) is a salt represented by the formula (VI):

(VI)

wherein Q represents —CO— group or —C(OH)— group; ring X represents a C3-C30 monocyclic or polycyclic hydrocarbon group in which a hydrogen atom is replaced with a hydroxyl group at Q position when Q is —C(OH)— group or in which two hydrogen atoms are replaced with =O group at Q position when Q is —CO— group, and at least one hydrogen atom in the monocyclic or polycyclic hydrocarbon group may be replaced with a C1-C6 alkyl, a C1-C6 alkoxy, a C1-C4 perfluoroalkyl, a C1-C6 hydroxyalkyl, a hydroxyl or a cyano group; $Y^3$ and $Y^4$ each independently represent a fluorine atom or a C1-C6 perfluoroalkyl group, and $A'^+$ represents an organic counter ion.

3. The chemically amplified positive resist composition according to claim 2, wherein the ring X is a C4-C8 cycloalkyl group, adamantyl group or norbornyl group, provided that, in each of the group, a hydrogen atom is replaced with —OH group at Q position when Q is —C(OH)— group and two hydrogen atoms are substituted with =O at Q position when Q is —CO— group, and provided that at least one hydrogen atom in each of the group may be replaced with a C1-C6 alkyl, C1-C6 alkoxy group, C1-C4 perfluoroalkyl, C1-C6 hydroxyalkyl, hydroxyl or cyano group.

4. The chemically amplified positive resist composition according to claim 2, wherein the acid generator represented by the formula (VI) is a salt represented by the formula (Xa), (Xb) or (Xc):

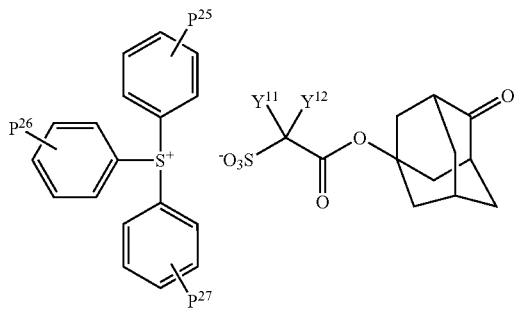

(Xa)

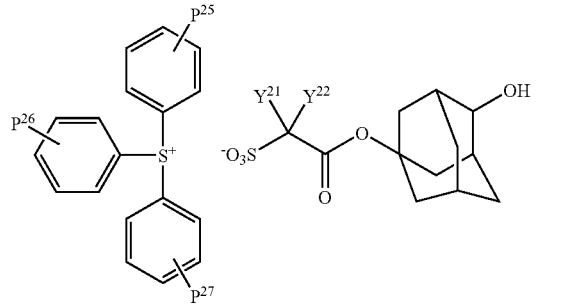

(Xb)

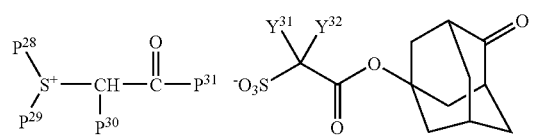

(Xc)

wherein $P^{25}$, $P^{26}$ and $P^{27}$ each independently represents a hydrogen atom or a C1-C4 alkyl group, $P^{28}$ and $P^{29}$ each independently represents a C1-C12 alkyl or C3-C12 cycloalkyl group, or $P^{28}$ and $P^{29}$ bond together to form a C3-C12 divalent hydrocarbon group which forms a ring with the adjacent $S^+$, and at least one —CH$_2$— in the C3-C12 divalent hydrocarbon group may be replaced with —CO—, —O— or —S—, $P^{30}$ represents a hydrogen atom, $P^{31}$ represents a C1-C12 alkyl group, a C3-C12 cycloalkyl group or an aromatic group optionally substituted, or $P^{30}$ and $P^{31}$ bond to form a C3-C12 divalent hydrocarbon group which forms a 2-oxocycloalkyl group together with the adjacent —CHCO—, and at least one —CH$_2$— in the C3-C12 divalent hydrocarbon group may be replaced with —CO—, —O— or —S—, and $Y^{11}$, $Y^{12}$, $Y^{21}$, $Y^{22}$, $Y^{31}$ and $Y^{32}$ each independently represents a fluorine atom or a C1-C6 perfluoroalkyl group.

* * * * *